US012454755B2

(12) United States Patent
White et al.

(10) Patent No.: US 12,454,755 B2
(45) **Date of Patent: *Oct. 28, 2025**

(54) SHOWERHEAD ASSEMBLY AND COMPONENTS THEREOF

(71) Applicant: ASM IP Holding B.V., Almere (NL)

(72) Inventors: Carl White, Gilbert, AZ (US); Eric Shero, Phoenix, AZ (US); Jereld Winkler, Gilbert, AZ (US); David Marquardt, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 8 days.

This patent is subject to a terminal disclaimer.

(21) Appl. No.: 17/076,017

(22) Filed: Oct. 21, 2020

(65) Prior Publication Data

US 2021/0032754 A1 Feb. 4, 2021

Related U.S. Application Data

(63) Continuation of application No. 14/444,744, filed on Jul. 28, 2014, now Pat. No. 10,858,737.

(51) Int. Cl.
*C23C 16/455* (2006.01)
*C23C 16/44* (2006.01)

(52) U.S. Cl.
CPC .... *C23C 16/45565* (2013.01); *C23C 16/4401* (2013.01)

(58) Field of Classification Search
CPC ...................... C23C 16/45565; C23C 16/4401
See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |
| 2,059,480 | A | 11/1936 | Obermaier |
| 2,161,626 | A | 6/1939 | Loughner et al. |
| 2,240,163 | A | 4/1941 | Pick |
| 2,266,416 | A | 12/1941 | Duclos |
| 2,280,778 | A | 4/1942 | Andersen |
| D142,841 | S | 11/1945 | D'Algodt |
| 2,410,420 | A | 11/1946 | Bennett |
| 2,441,253 | A | 5/1948 | Sarver |
| 2,480,557 | A | 8/1949 | Cummins |
| 2,563,931 | A | 8/1951 | Harrison |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Office Action dated Mar. 30, 2021 in Application No. 201610131743.1.

(Continued)

*Primary Examiner* — Jeffrie R Lund
(74) *Attorney, Agent, or Firm* — Snell & Wilmer L.L.P.

(57) ABSTRACT

Showerhead assemblies, gas distribution plates, and systems including the same are disclosed. Exemplary showerhead assemblies include a gas distribution plate. Exemplary gas distribution plates include apertures designed to direct a flow of gas and to reduce stagnation of gas on surfaces of the plates.

13 Claims, 7 Drawing Sheets

(56) References Cited

U.S. PATENT DOCUMENTS

| | | | |
|---|---|---|---|
| 2,660,061 | A | 11/1953 | Lewis |
| 2,745,640 | A | 5/1956 | Cushman |
| 2,847,320 | A | 8/1958 | Bulloff |
| 2,990,045 | A | 6/1961 | Root |
| 3,038,951 | A | 6/1962 | Mead |
| 3,089,507 | A | 5/1963 | Drake et al. |
| 3,094,396 | A | 6/1963 | Flugge et al. |
| 3,197,682 | A | 7/1965 | Klass et al. |
| 3,232,437 | A | 2/1966 | Hultgren |
| 3,263,502 | A | 8/1966 | Springfield |
| 3,332,286 | A | 7/1967 | Strong |
| 3,410,349 | A | 11/1968 | Troutman |
| 3,420,622 | A | 1/1969 | Donges et al. |
| 3,588,192 | A | 6/1971 | Drutchas et al. |
| 3,634,740 | A | 1/1972 | Stevko |
| 3,647,387 | A | 3/1972 | Benson |
| 3,647,716 | A | 3/1972 | Koches |
| 3,713,899 | A | 1/1973 | Sebestyen |
| 3,718,429 | A | 2/1973 | Williamson |
| 3,796,182 | A | 3/1974 | Rosler |
| 3,814,128 | A | 6/1974 | Grantham |
| 3,833,492 | A | 9/1974 | Bollyky |
| 3,854,443 | A | 12/1974 | Baerg |
| 3,862,397 | A | 1/1975 | Anderson et al. |
| 3,867,205 | A | 2/1975 | Schley |
| 3,885,504 | A | 5/1975 | Baermann |
| 3,887,790 | A | 6/1975 | Ferguson |
| 3,904,371 | A | 9/1975 | Neti |
| 3,913,058 | A | 10/1975 | Nishio et al. |
| 3,913,617 | A | 10/1975 | van Laar |
| 3,916,270 | A | 10/1975 | Wachtler et al. |
| 3,947,685 | A | 3/1976 | Meinel |
| 3,960,559 | A | 6/1976 | Suzuki |
| 3,962,004 | A | 6/1976 | Sonneborn |
| 3,983,401 | A | 9/1976 | Livesay |
| 3,997,638 | A | 12/1976 | Manning et al. |
| 4,048,110 | A | 9/1977 | Vanderspurt |
| 4,054,071 | A | 10/1977 | Patejak |
| 4,058,430 | A | 11/1977 | Suntola et al. |
| 4,079,944 | A | 3/1978 | Durley et al. |
| 4,093,491 | A | 6/1978 | Whelpton et al. |
| 4,099,041 | A | 7/1978 | Berkman et al. |
| D249,341 | S | 9/1978 | Mertz |
| 4,126,027 | A | 11/1978 | Smith et al. |
| 4,134,425 | A | 1/1979 | Gussefeld et al. |
| 4,145,699 | A | 3/1979 | Hu et al. |
| 4,149,237 | A | 4/1979 | Freitas |
| 4,152,760 | A | 5/1979 | Freitas et al. |
| 4,157,751 | A | 6/1979 | Grundken et al. |
| 4,164,959 | A | 8/1979 | Wurzburger |
| 4,176,630 | A | 12/1979 | Elmer |
| 4,179,530 | A | 12/1979 | Koppl et al. |
| 4,181,330 | A | 1/1980 | Kojima |
| 4,184,188 | A | 1/1980 | Briglia |
| 4,194,536 | A | 3/1980 | Stine et al. |
| 4,217,463 | A | 8/1980 | Swearingen |
| 4,229,064 | A | 10/1980 | Vetter et al. |
| 4,234,449 | A | 11/1980 | Wolson et al. |
| 4,241,000 | A | 12/1980 | McCauley et al. |
| 4,314,763 | A | 2/1982 | Steigmeier et al. |
| 4,322,592 | A | 3/1982 | Martin |
| 4,324,611 | A | 4/1982 | Vogel et al. |
| 4,333,735 | A | 6/1982 | Hardy |
| 4,355,912 | A | 10/1982 | Haak |
| 4,384,918 | A | 5/1983 | Abe |
| 4,389,973 | A | 6/1983 | Suntola et al. |
| D269,850 | S | 7/1983 | Preisler et al. |
| 4,393,013 | A | 7/1983 | McMenamin |
| 4,401,507 | A | 8/1983 | Engle |
| 4,412,133 | A | 10/1983 | Eckes et al. |
| 4,413,022 | A | 11/1983 | Suntola et al. |
| 4,414,492 | A | 11/1983 | Hanlet |
| 4,436,674 | A | 3/1984 | McMenamin |
| 4,444,990 | A | 4/1984 | Villar |
| D274,122 | S | 6/1984 | Stahel et al. |
| 4,454,370 | A | 6/1984 | Voznick |
| 4,455,193 | A | 6/1984 | Jeuch et al. |
| 4,465,716 | A | 8/1984 | Baber et al. |
| 4,466,766 | A | 8/1984 | Geren et al. |
| 4,479,831 | A | 10/1984 | Sandow |
| 4,480,284 | A | 10/1984 | Tojo et al. |
| 4,481,300 | A | 11/1984 | Hartnett et al. |
| 4,484,061 | A | 11/1984 | Zelinka et al. |
| 4,488,506 | A | 12/1984 | Heinecke et al. |
| 4,495,024 | A | 1/1985 | Bok |
| 4,496,828 | A | 1/1985 | Kusmierz et al. |
| 4,499,354 | A | 2/1985 | Hill et al. |
| 4,502,094 | A | 2/1985 | Lewin et al. |
| 4,504,439 | A | 3/1985 | Elter et al. |
| 4,512,113 | A | 4/1985 | Budinger |
| 4,512,841 | A | 4/1985 | Cunningham et al. |
| 4,520,116 | A | 5/1985 | Gentilman et al. |
| 4,520,421 | A | 5/1985 | Sakitani et al. |
| 4,527,005 | A | 7/1985 | McKelvey et al. |
| 4,534,816 | A | 8/1985 | Chen et al. |
| 4,535,628 | A | 8/1985 | Hope |
| 4,537,001 | A | 8/1985 | Uppstrom |
| 4,548,688 | A | 10/1985 | Mathews |
| 4,551,192 | A | 11/1985 | Di Milia et al. |
| 4,554,611 | A | 11/1985 | Lewin |
| 4,560,590 | A | 12/1985 | Bok |
| 4,570,328 | A | 2/1986 | Price et al. |
| 4,575,408 | A | 3/1986 | Bok |
| 4,575,636 | A | 3/1986 | Caprari |
| 4,578,560 | A | 3/1986 | Tanaka et al. |
| 4,579,080 | A | 4/1986 | Martin et al. |
| 4,579,378 | A | 4/1986 | Snyders |
| 4,579,623 | A | 4/1986 | Suzuki et al. |
| 4,581,520 | A | 4/1986 | Vu et al. |
| 4,590,326 | A | 5/1986 | Woldy |
| 4,611,966 | A | 9/1986 | Johnson |
| 4,620,998 | A | 11/1986 | Lalvani |
| 4,622,918 | A | 11/1986 | Bok |
| 4,624,728 | A | 11/1986 | Bithell et al. |
| D288,556 | S | 3/1987 | Wallgren |
| 4,653,541 | A | 3/1987 | Oehlschlaeger et al. |
| 4,654,226 | A | 3/1987 | Jackson et al. |
| 4,655,592 | A | 4/1987 | Allemand |
| 4,662,987 | A | 5/1987 | Bok |
| 4,664,769 | A | 5/1987 | Cuomo et al. |
| 4,670,126 | A | 6/1987 | Messer et al. |
| 4,681,134 | A | 7/1987 | Paris |
| 4,693,211 | A | 9/1987 | Ogami et al. |
| 4,700,089 | A | 10/1987 | Fujii et al. |
| 4,707,815 | A | 11/1987 | Yamasaki |
| 4,717,461 | A | 1/1988 | Strahl et al. |
| 4,718,637 | A | 1/1988 | Contin |
| 4,720,362 | A | 1/1988 | Gentilman et al. |
| 4,720,407 | A | 1/1988 | Sculke |
| 4,721,533 | A | 1/1988 | Phillippi et al. |
| 4,721,534 | A | 1/1988 | Phillippi et al. |
| 4,722,298 | A | 2/1988 | Rubin et al. |
| 4,724,272 | A | 2/1988 | Raniere et al. |
| 4,725,204 | A | 2/1988 | Powell |
| 4,735,259 | A | 4/1988 | Vincent |
| 4,738,618 | A | 4/1988 | Massey et al. |
| 4,738,748 | A | 4/1988 | Kisa |
| 4,747,367 | A | 5/1988 | Posa |
| 4,749,416 | A | 6/1988 | Greenspan |
| 4,750,520 | A | 6/1988 | Heim et al. |
| 4,753,192 | A | 6/1988 | Goldsmith et al. |
| 4,753,856 | A | 6/1988 | Haluska et al. |
| 4,756,794 | A | 7/1988 | Yoder |
| 4,764,076 | A | 8/1988 | Layman et al. |
| 4,770,590 | A | 9/1988 | Hugues et al. |
| 4,771,015 | A | 9/1988 | Kanai |
| 4,775,281 | A | 10/1988 | Prentakis |
| 4,776,744 | A | 10/1988 | Stonestreet et al. |
| 4,780,169 | A | 10/1988 | Stark et al. |
| 4,781,511 | A | 11/1988 | Harada et al. |
| 4,789,294 | A | 12/1988 | Sato et al. |
| 4,790,258 | A | 12/1988 | Drage et al. |
| 4,802,441 | A | 2/1989 | Waugh |
| 4,804,086 | A | 2/1989 | Grohrock |

(56) References Cited

U.S. PATENT DOCUMENTS 4,808,387 A 2/1989 Datta et al.
4,812,201 A 3/1989 Sakai et al.
4,812,217 A 3/1989 George et al.
4,821,674 A 4/1989 deBoer et al.
4,827,430 A 5/1989 Aid et al.
4,828,224 A 5/1989 Crabb et al.
4,830,515 A 5/1989 Cortes
4,837,113 A 6/1989 Luttmer et al.
4,837,185 A 6/1989 Yau et al.
4,854,263 A 8/1989 Chang et al.
4,854,266 A 8/1989 Simson et al.
4,857,137 A 8/1989 Tachi et al.
4,857,382 A 8/1989 Liu et al.
4,858,557 A 8/1989 Pozzetti et al.
4,863,374 A 9/1989 Vukovich
4,867,629 A 9/1989 Iwasawa et al.
4,871,523 A 10/1989 Datta et al.
4,874,273 A 10/1989 Tokisue et al.
4,880,982 A 11/1989 Hoksaas
4,882,199 A 11/1989 Sadoway et al.
4,886,162 A 12/1989 Ambrogio
4,916,091 A 4/1990 Freeman et al.
4,917,556 A 4/1990 Stark et al.
4,920,918 A 5/1990 Adams et al.
4,925,388 A 5/1990 Iseki et al.
4,931,135 A 6/1990 Horiuchi et al.
4,934,831 A 6/1990 Volbrecht
4,938,815 A 7/1990 McNeilly
D309,702 S 8/1990 Hall
4,949,671 A 8/1990 Davis et al.
4,949,848 A 8/1990 Kos
4,950,624 A 8/1990 Inuzima et al.
4,956,538 A 9/1990 Moslehi
4,958,061 A 9/1990 Wakabayashi et al.
D311,126 S 10/1990 Crowley
4,962,063 A 10/1990 Maydan et al.
4,963,506 A 10/1990 Liaw et al.
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,102 A 1/1991 Nguyen et al.
4,987,856 A 1/1991 Hey
4,989,992 A 2/1991 Piai
4,991,614 A 2/1991 Hammel
5,002,632 A 3/1991 Loewenstein et al.
5,013,691 A 5/1991 Lory et al.
5,022,961 A 6/1991 Izumi et al.
5,027,746 A 7/1991 Frijlink
5,028,366 A 7/1991 Harakal et al.
D320,148 S 9/1991 Andrews
5,049,029 A 9/1991 Mitsui et al.
5,053,247 A 10/1991 Moore
5,057,436 A 10/1991 Ball
5,060,322 A 10/1991 Delepine
5,061,083 A 10/1991 Grimm et al.
5,062,386 A 11/1991 Christensen
5,064,337 A 11/1991 Asakawa et al.
5,065,698 A 11/1991 Koike
5,067,437 A 11/1991 Watanabe et al.
5,069,591 A 12/1991 Kinoshita
5,071,258 A 12/1991 Usher et al.
5,074,017 A 12/1991 Toya et al.
5,082,517 A 1/1992 Moslehi
5,084,126 A 1/1992 McKee
5,088,444 A 2/1992 Ohmine et al.
5,097,890 A 3/1992 Nakao
5,098,638 A 3/1992 Sawada
5,098,865 A 3/1992 Machado
5,104,514 A 4/1992 Quartarone
5,107,170 A 4/1992 Ishikawa et al.
5,108,192 A 4/1992 Mailliet et al.
5,110,407 A 5/1992 Ono et al.
5,114,683 A 5/1992 Hirase
5,116,018 A 5/1992 Friemoth et al.
5,117,121 A 5/1992 Watanabe et al.
D327,534 S 6/1992 Manville
5,119,760 A 6/1992 McMillan et al.
5,124,272 A 6/1992 Saito et al.
5,125,358 A 6/1992 Ueda et al.
5,125,710 A 6/1992 Gianelo
5,130,003 A 7/1992 Conrad
5,134,965 A 8/1992 Tokuda et al.
5,137,286 A 8/1992 Whitford
5,151,296 A 9/1992 Tokunaga
5,154,301 A 10/1992 Kos
5,158,128 A 10/1992 Inoue et al.
D330,900 S 11/1992 Wakegijig
5,167,716 A 12/1992 Boitnott et al.
5,167,761 A 12/1992 Westendorp et al.
5,174,881 A 12/1992 Iwasaki et al.
5,176,451 A 1/1993 Sasada
5,178,639 A 1/1993 Nishi
5,178,682 A 1/1993 Tsukamoto et al.
5,180,273 A 1/1993 Sakaya et al.
5,180,435 A 1/1993 Markunas et al.
5,181,779 A 1/1993 Shia et al.
5,182,232 A 1/1993 Chhabra et al.
5,183,511 A 2/1993 Yamazaki et al.
5,186,120 A 2/1993 Ohnishi et al.
D333,606 S 3/1993 Kanemitsu et al.
5,192,717 A 3/1993 Kawakami
5,193,912 A 3/1993 Saunders
5,193,969 A 3/1993 Rush et al.
5,194,401 A 3/1993 Adams et al.
5,199,603 A 4/1993 Prescott
5,208,961 A 5/1993 Lajoie
5,213,650 A 5/1993 Wang et al.
5,219,226 A 6/1993 James
5,221,556 A 6/1993 Hawkins et al.
5,225,366 A 7/1993 Yoder
5,226,383 A 7/1993 Bhat
5,226,713 A 7/1993 Matsumura
5,226,967 A 7/1993 Chen et al.
5,228,114 A 7/1993 Suzuki
5,231,062 A 7/1993 Mathers et al.
5,232,508 A 8/1993 Arena et al.
5,234,526 A 8/1993 Chen et al.
5,242,501 A 9/1993 McDiarmid
5,242,539 A 9/1993 Kumihashi et al.
5,243,195 A 9/1993 Nishi
5,243,202 A 9/1993 Mori et al.
5,246,218 A 9/1993 Yap et al.
5,246,500 A 9/1993 Samata et al.
5,249,960 A 10/1993 Monoe
5,250,092 A 10/1993 Nakano
5,252,133 A 10/1993 Miyazaki et al.
5,252,134 A 10/1993 Stauffer
5,259,881 A 11/1993 Edwards et al.
5,261,167 A 11/1993 Sakata
5,266,526 A 11/1993 Aoyama
5,268,989 A 12/1993 Moslehi et al.
5,271,967 A 12/1993 Kramer et al.
5,273,609 A 12/1993 Moslehi
5,277,932 A 1/1994 Spencer
5,278,494 A 1/1994 Obigane
5,279,886 A 1/1994 Kawai et al.
5,279,986 A 1/1994 Maloney et al.
5,280,894 A 1/1994 Witcraft et al.
5,281,274 A 1/1994 Yoder
5,284,519 A 2/1994 Gadgil
5,288,684 A 2/1994 Yamazaki et al.
5,294,572 A 3/1994 Granneman et al.
5,294,778 A 3/1994 Carman et al.
5,295,777 A 3/1994 Hodos
5,298,089 A 3/1994 Bowe et al.
5,305,417 A 4/1994 Najm et al.
5,306,666 A 4/1994 Izumi
5,306,946 A 4/1994 Yamamoto
5,308,650 A 5/1994 Krummel et al.
5,308,788 A 5/1994 Fitch et al.
5,310,410 A 5/1994 Begin et al.
5,310,456 A 5/1994 Kadomura

(56) References Cited

U.S. PATENT DOCUMENTS

| | | | |
|---|---|---|---|
| 5,312,245 | A | 5/1994 | Brannen et al. |
| 5,313,061 | A | 5/1994 | Drew et al. |
| 5,314,538 | A | 5/1994 | Maeda et al. |
| 5,314,570 | A | 5/1994 | Ikegaya et al. |
| 5,315,092 | A | 5/1994 | Takahashi et al. |
| 5,320,218 | A | 6/1994 | Yamashita et al. |
| 5,326,427 | A | 7/1994 | Jerbic |
| 5,328,360 | A | 7/1994 | Yokokawa |
| 5,328,810 | A | 7/1994 | Lowrey et al. |
| 5,335,309 | A | 8/1994 | Fujii et al. |
| 5,336,327 | A | 8/1994 | Lee |
| 5,338,362 | A | 8/1994 | Imahashi |
| 5,340,261 | A | 8/1994 | Oosawa et al. |
| 5,346,961 | A | 9/1994 | Shaw et al. |
| 5,348,774 | A | 9/1994 | Golecki et al. |
| 5,350,480 | A | 9/1994 | Gray |
| 5,354,433 | A | 10/1994 | Granneman et al. |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,362,328 | A | 11/1994 | Gardiner et al. |
| 5,364,667 | A | 11/1994 | Rhieu |
| D353,452 | S | 12/1994 | Groenhoff |
| 5,374,315 | A | 12/1994 | Deboer et al. |
| D354,898 | S | 1/1995 | Nagy |
| 5,378,501 | A | 1/1995 | Foster et al. |
| 5,380,367 | A | 1/1995 | Bertone |
| 5,382,311 | A | 1/1995 | Ishikawa et al. |
| 5,387,265 | A | 2/1995 | Kakizaki et al. |
| 5,388,945 | A | 2/1995 | Garric et al. |
| 5,393,577 | A | 2/1995 | Uesugi et al. |
| 5,397,395 | A | 3/1995 | Sano et al. |
| 5,403,630 | A | 4/1995 | Matsui et al. |
| 5,404,082 | A | 4/1995 | Hernandez et al. |
| 5,407,449 | A | 4/1995 | Zinger |
| 5,407,867 | A | 4/1995 | Iwasaki et al. |
| 5,413,813 | A | 5/1995 | Cruse et al. |
| 5,414,221 | A | 5/1995 | Gardner |
| 5,415,753 | A | 5/1995 | Hurwitt et al. |
| 5,418,382 | A | 5/1995 | Blackwood et al. |
| 5,421,893 | A | 6/1995 | Perlov |
| 5,422,139 | A | 6/1995 | Fischer |
| 5,423,942 | A | 6/1995 | Robbins et al. |
| 5,426,137 | A | 6/1995 | Allen |
| 5,427,824 | A | 6/1995 | Inushima et al. |
| 5,430,011 | A | 7/1995 | Tanaka et al. |
| 5,431,734 | A | 7/1995 | Chapple-Sokol et al. |
| 5,443,646 | A | 8/1995 | Yamada et al. |
| 5,443,648 | A | 8/1995 | Ohkase |
| 5,443,686 | A | 8/1995 | Jones et al. |
| 5,444,217 | A | 8/1995 | Moore |
| 5,447,294 | A | 9/1995 | Sakata et al. |
| 5,453,124 | A | 9/1995 | Moslehi et al. |
| D363,464 | S | 10/1995 | Fukasawa |
| 5,456,207 | A | 10/1995 | Gedridge et al. |
| 5,456,757 | A | 10/1995 | Aruga et al. |
| 5,461,214 | A | 10/1995 | Peck et al. |
| 5,462,899 | A | 10/1995 | Ikeda |
| 5,463,176 | A | 10/1995 | Eckert |
| 5,464,313 | A | 11/1995 | Ohsawa |
| 5,474,410 | A | 12/1995 | Ozawa et al. |
| 5,474,612 | A | 12/1995 | Sato et al. |
| 5,478,429 | A | 12/1995 | Komino et al. |
| 5,480,488 | A | 1/1996 | Bittner et al. |
| 5,480,818 | A | 1/1996 | Matsumoto et al. |
| 5,482,559 | A | 1/1996 | Imai et al. |
| 5,484,484 | A | 1/1996 | Yamaga et al. |
| 5,494,439 | A | 2/1996 | Goldstein et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai et al. |
| 5,504,042 | A | 4/1996 | Cho et al. |
| 5,510,277 | A | 4/1996 | Cunningham et al. |
| 5,512,102 | A | 4/1996 | Yamazaki |
| 5,514,439 | A | 5/1996 | Sibley |
| 5,518,549 | A | 5/1996 | Hellwig |
| 5,518,780 | A | 5/1996 | Tamor et al. |
| 5,519,234 | A | 5/1996 | Paz de Araujo |
| 5,520,743 | A | 5/1996 | Takahashi et al. |
| 5,523,616 | A | 6/1996 | Yasuhide |
| 5,527,111 | A | 6/1996 | Lysen et al. |
| 5,527,417 | A | 6/1996 | Iida et al. |
| 5,531,218 | A | 7/1996 | Krebs |
| 5,531,835 | A | 7/1996 | Fodor et al. |
| 5,537,311 | A | 7/1996 | Stevens |
| 5,540,059 | A | 7/1996 | Yokokawa |
| 5,540,821 | A | 7/1996 | Tepman |
| 5,540,898 | A | 7/1996 | Davidson |
| 5,554,557 | A | 9/1996 | Koh |
| 5,556,275 | A | 9/1996 | Sakata et al. |
| 5,558,717 | A | 9/1996 | Zhao et al. |
| 5,559,046 | A | 9/1996 | Oishi et al. |
| 5,562,383 | A | 10/1996 | Iwai et al. |
| 5,562,947 | A | 10/1996 | White et al. |
| 5,562,952 | A | 10/1996 | Nakahigashi et al. |
| 5,565,038 | A | 10/1996 | Ashley |
| 5,569,402 | A | 10/1996 | Meisser et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,584,936 | A | 12/1996 | Pickering et al. |
| 5,584,963 | A | 12/1996 | Takahashi |
| 5,586,585 | A | 12/1996 | Bonora et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,602,060 | A | 2/1997 | Kobayashi et al. |
| 5,604,410 | A | 2/1997 | Vollkommer et al. |
| 5,611,448 | A | 3/1997 | Chen |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| 5,637,153 | A | 6/1997 | Niino et al. |
| D380,527 | S | 7/1997 | Velez |
| 5,645,646 | A | 7/1997 | Beinglass et al. |
| 5,650,013 | A | 7/1997 | Yamazaki |
| 5,650,351 | A | 7/1997 | Wu |
| 5,653,807 | A | 8/1997 | Crumbaker |
| 5,656,093 | A | 8/1997 | Burkhart et al. |
| 5,661,263 | A | 8/1997 | Salvaggio |
| 5,662,470 | A | 9/1997 | Huussen et al. |
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |
| 5,695,567 | A | 12/1997 | Kordina |
| 5,697,706 | A | 12/1997 | Ciaravino et al. |
| 5,698,036 | A | 12/1997 | Ishii et al. |
| 5,700,729 | A | 12/1997 | Lee et al. |
| 5,708,825 | A | 1/1998 | Sotomayor |
| 5,709,745 | A | 1/1998 | Larkin et al. |
| 5,711,811 | A | 1/1998 | Suntola et al. |
| 5,716,133 | A | 2/1998 | Hosokawa et al. |
| 5,718,574 | A | 2/1998 | Shimazu |
| 5,720,927 | A | 2/1998 | Cripe et al. |
| D392,855 | S | 3/1998 | Pillow |
| 5,724,748 | A | 3/1998 | Brooks |
| 5,728,223 | A | 3/1998 | Murakarni et al. |
| 5,728,425 | A | 3/1998 | Ebe et al. |
| 5,730,801 | A | 3/1998 | Tepman et al. |
| 5,730,802 | A | 3/1998 | Ishizumi et al. |

(56) References Cited

U.S. PATENT DOCUMENTS

| | | | |
|---|---|---|---|
| 5,732,597 | A | 3/1998 | Devenyi |
| 5,732,744 | A | 3/1998 | Barr et al. |
| 5,732,957 | A | 3/1998 | Yu |
| 5,736,314 | A | 4/1998 | Hayes et al. |
| 5,753,835 | A | 5/1998 | Gustin |
| 5,754,390 | A | 5/1998 | Sandhu et al. |
| 5,759,281 | A | 6/1998 | Gurary et al. |
| 5,761,328 | A | 6/1998 | Solberg et al. |
| 5,766,365 | A | 6/1998 | Umutoy et al. |
| 5,768,125 | A | 6/1998 | Zinger et al. |
| 5,769,952 | A | 6/1998 | Komino |
| 5,775,889 | A | 7/1998 | Kobayashi et al. |
| 5,777,838 | A | 7/1998 | Tamagawa et al. |
| 5,779,203 | A | 7/1998 | Edlinger |
| 5,781,693 | A | 7/1998 | Ballance et al. |
| 5,782,979 | A | 7/1998 | Kaneno |
| 5,790,750 | A | 8/1998 | Anderson |
| 5,791,782 | A | 8/1998 | Wooten et al. |
| 5,792,272 | A | 8/1998 | Van Os et al. |
| 5,796,074 | A | 8/1998 | Edelstein et al. |
| 5,801,104 | A | 9/1998 | Schuegraf et al. |
| 5,801,945 | A | 9/1998 | Comer |
| 5,804,505 | A | 9/1998 | Yamada et al. |
| 5,806,980 | A | 9/1998 | Berrian |
| 5,813,851 | A | 9/1998 | Nakao |
| 5,818,716 | A | 10/1998 | Chin et al. |
| 5,819,092 | A | 10/1998 | Ferguson et al. |
| 5,819,434 | A | 10/1998 | Herchen et al. |
| 5,820,366 | A | 10/1998 | Lee |
| 5,820,685 | A | 10/1998 | Kurihra et al. |
| 5,820,686 | A | 10/1998 | Moore |
| 5,826,129 | A | 10/1998 | Hasebe et al. |
| 5,827,420 | A | 10/1998 | Shirazi et al. |
| 5,827,435 | A | 10/1998 | Samukawa |
| 5,827,757 | A | 10/1998 | Robinson, Jr. et al. |
| 5,836,483 | A | 11/1998 | Disel |
| 5,837,058 | A | 11/1998 | Chen et al. |
| 5,837,320 | A | 11/1998 | Hampden-Smith et al. |
| 5,844,683 | A | 12/1998 | Pavloski et al. |
| 5,846,332 | A | 12/1998 | Zhao et al. |
| 5,851,293 | A | 12/1998 | Lane et al. |
| 5,851,294 | A | 12/1998 | Young et al. |
| 5,851,299 | A | 12/1998 | Cheng et al. |
| 5,852,445 | A | 12/1998 | Yoshikawa et al. |
| 5,852,879 | A | 12/1998 | Schumaier |
| 5,853,484 | A | 12/1998 | Jeong |
| D403,949 | S | 1/1999 | Nakamura |
| D404,370 | S | 1/1999 | Kimura |
| D404,372 | S | 1/1999 | Ishii |
| 5,855,680 | A | 1/1999 | Soininen et al. |
| 5,855,681 | A | 1/1999 | Maydan et al. |
| 5,855,687 | A | 1/1999 | DuBois et al. |
| 5,855,726 | A | 1/1999 | Soraoka et al. |
| 5,857,777 | A | 1/1999 | Schuh |
| 5,861,233 | A | 1/1999 | Sekine et al. |
| 5,862,302 | A | 1/1999 | Okase |
| 5,863,123 | A | 1/1999 | Lee et al. |
| 5,865,205 | A | 2/1999 | Wilmer |
| 5,866,795 | A | 2/1999 | Wang et al. |
| 5,871,586 | A | 2/1999 | Crawley et al. |
| 5,872,065 | A | 2/1999 | Sivaramakrishnan |
| 5,873,942 | A | 2/1999 | Park |
| 5,877,095 | A | 3/1999 | Tamura et al. |
| 5,879,128 | A | 3/1999 | Tietz et al. |
| 5,879,459 | A | 3/1999 | Gadgil et al. |
| 5,880,980 | A | 3/1999 | Rothacher et al. |
| 5,882,165 | A | 3/1999 | Maydan et al. |
| 5,884,640 | A | 3/1999 | Fishkin et al. |
| 5,888,304 | A | 3/1999 | Umotoy et al. |
| 5,891,251 | A | 4/1999 | MacLeish et al. |
| 5,893,741 | A | 4/1999 | Huang |
| 5,897,348 | A | 4/1999 | Wu |
| 5,897,378 | A | 4/1999 | Eriguchi |
| 5,897,379 | A | 4/1999 | Ulrich et al. |
| 5,897,710 | A | 4/1999 | Sato et al. |
| D409,894 | S | 5/1999 | McClurg |
| 5,904,170 | A | 5/1999 | Harvey et al. |
| D411,516 | S | 6/1999 | Imafuku et al. |
| 5,908,672 | A | 6/1999 | Ryu |
| 5,915,200 | A | 6/1999 | Tokumasu et al. |
| 5,915,562 | A | 6/1999 | Nyseth et al. |
| 5,916,365 | A | 6/1999 | Sherman |
| D412,270 | S | 7/1999 | Fredrickson |
| 5,920,798 | A | 7/1999 | Higuchi et al. |
| 5,928,426 | A | 7/1999 | Aitchison |
| D412,512 | S | 8/1999 | Boisvert |
| 5,937,142 | A | 8/1999 | Moslehi et al. |
| 5,937,323 | A | 8/1999 | Orczyk et al. |
| 5,939,886 | A | 8/1999 | Turner et al. |
| 5,947,718 | A | 9/1999 | Weaver |
| 5,950,327 | A | 9/1999 | Peterson et al. |
| 5,950,925 | A | 9/1999 | Fukunaga et al. |
| 5,954,375 | A | 9/1999 | Trickle et al. |
| 5,961,775 | A | 10/1999 | Fujimura |
| 5,968,275 | A | 10/1999 | Lee et al. |
| 5,970,621 | A | 10/1999 | Bazydola |
| 5,972,196 | A | 10/1999 | Murphy et al. |
| 5,975,492 | A | 11/1999 | Brenes |
| 5,976,973 | A | 11/1999 | Ohira et al. |
| 5,979,506 | A | 11/1999 | Aarseth |
| 5,982,931 | A | 11/1999 | Ishimaru |
| 5,984,391 | A | 11/1999 | Vanderpot et al. |
| 5,987,480 | A | 11/1999 | Donohue et al. |
| 5,989,342 | A | 11/1999 | Ikeda et al. |
| 5,992,453 | A | 11/1999 | Zimmer |
| 5,997,588 | A | 12/1999 | Goodwin |
| 5,997,768 | A | 12/1999 | Scully |
| 5,998,870 | A | 12/1999 | Lee et al. |
| 6,000,732 | A | 12/1999 | Scheler et al. |
| 6,001,183 | A | 12/1999 | Gurary et al. |
| 6,001,267 | A | 12/1999 | Van Os et al. |
| 6,004,204 | A | 12/1999 | Luxton et al. |
| D419,652 | S | 1/2000 | Hall et al. |
| 6,013,553 | A | 1/2000 | Wallace |
| 6,013,920 | A | 1/2000 | Gordon et al. |
| 6,014,677 | A | 1/2000 | Hayashi et al. |
| 6,015,459 | A | 1/2000 | Jamison et al. |
| 6,015,465 | A | 1/2000 | Kholodenko et al. |
| 6,017,779 | A | 1/2000 | Miyasaka |
| 6,017,818 | A | 1/2000 | Lu |
| 6,022,180 | A | 2/2000 | Motoyama et al. |
| 6,022,802 | A | 2/2000 | Jang |
| 6,024,799 | A | 2/2000 | Chen et al. |
| 6,025,117 | A | 2/2000 | Nakano et al. |
| 6,027,163 | A | 2/2000 | Longenecker et al. |
| 6,029,602 | A | 2/2000 | Bhatnagar |
| 6,030,900 | A | 2/2000 | Grassl et al. |
| 6,033,215 | A | 3/2000 | Ohsawa |
| 6,035,101 | A | 3/2000 | Sajoto et al. |
| 6,035,804 | A | 3/2000 | Arami et al. |
| 6,039,809 | A | 3/2000 | Toyama et al. |
| 6,042,652 | A | 3/2000 | Hyun |
| 6,044,860 | A | 4/2000 | Neu |
| 6,045,260 | A | 4/2000 | Schwartz et al. |
| 6,048,154 | A | 4/2000 | Wytman |
| 6,050,506 | A | 4/2000 | Guo et al. |
| 6,053,982 | A | 4/2000 | Halpin et al. |
| 6,053,983 | A | 4/2000 | Saeki et al. |
| 6,054,013 | A | 4/2000 | Collins et al. |
| 6,054,678 | A | 4/2000 | Miyazaki |
| 6,060,691 | A | 5/2000 | Minami et al. |
| 6,060,721 | A | 5/2000 | Huang |
| 6,063,196 | A | 5/2000 | Li et al. |
| 6,066,204 | A | 5/2000 | Haven |
| 6,068,441 | A | 5/2000 | Raaijmakers et al. |
| 6,071,572 | A | 6/2000 | Mosely et al. |
| 6,072,163 | A | 6/2000 | Armstrong et al. |
| 6,073,973 | A | 6/2000 | Boscaljon et al. |
| 6,074,154 | A | 6/2000 | Ueda et al. |
| 6,074,443 | A | 6/2000 | Venkatesh |
| 6,074,514 | A | 6/2000 | Bjorkman et al. |
| 6,077,027 | A | 6/2000 | Kawamura et al. |
| 6,079,356 | A | 6/2000 | Umotoy et al. |
| 6,079,927 | A | 6/2000 | Muka |

(56) References Cited

U.S. PATENT DOCUMENTS 6,083,321 A 7/2000 Lei et al.
6,086,677 A 7/2000 Umotoy et al.
6,090,212 A 7/2000 Mahawili
6,090,442 A 7/2000 Klaus et al.
6,090,659 A 7/2000 Laibowitz et al.
6,091,062 A 7/2000 Pfahnl et al.
6,093,252 A 7/2000 Wengert et al.
6,093,253 A 7/2000 Lofgren
6,093,611 A 7/2000 Gardner et al.
6,095,083 A 8/2000 Rice et al.
6,096,133 A 8/2000 Yuuki et al.
6,096,267 A 8/2000 Kishkovich
6,099,302 A 8/2000 Hong et al.
6,099,649 A 8/2000 Schmitt et al.
6,099,651 A 8/2000 Sajoto et al.
6,102,565 A 8/2000 Kita et al.
6,104,002 A 8/2000 Hirose et al.
6,104,011 A 8/2000 Juliano
6,104,401 A 8/2000 Parsons
6,106,625 A 8/2000 Koai et al.
6,106,678 A 8/2000 Shufflebotham
6,110,531 A 8/2000 Paz de Araujo et al.
6,113,703 A 9/2000 Anderson et al.
6,119,710 A 9/2000 Brown
6,121,061 A 9/2000 Van Bilsen et al.
6,121,158 A 9/2000 Benchikha et al.
6,122,036 A 9/2000 Yamasaki et al.
6,124,600 A 9/2000 Moroishi et al.
6,125,789 A 10/2000 Gupta et al.
6,126,744 A 10/2000 Hawkins et al.
6,126,848 A 10/2000 Li et al.
6,127,249 A 10/2000 Hu
6,129,044 A 10/2000 Zhao et al.
6,129,546 A 10/2000 Sada
6,132,207 A 10/2000 Stoutjesdijk
6,134,807 A 10/2000 Komino
6,135,460 A 10/2000 Wise et al.
6,137,240 A 10/2000 Bogdan
6,139,239 A 10/2000 Snijders
6,139,983 A 10/2000 Ohashi et al.
6,140,252 A 10/2000 Cho et al.
6,143,079 A 11/2000 Halpin
6,143,082 A 11/2000 McInerney et al.
6,143,129 A 11/2000 Savas et al.
6,146,463 A 11/2000 Yudovsky et al.
6,148,761 A 11/2000 Majewski et al.
6,151,446 A 11/2000 Hunter et al.
6,152,070 A 11/2000 Fairbairn et al.
6,152,669 A 11/2000 Morita et al.
6,156,151 A 12/2000 Komino et al.
6,158,941 A 12/2000 Muka et al.
6,159,301 A 12/2000 Sato et al.
6,160,244 A 12/2000 Ohashi
6,161,500 A 12/2000 Kopacz et al.
6,162,323 A 12/2000 Koshimizu
6,164,894 A 12/2000 Cheng
6,174,809 B1 1/2001 Kang et al.
6,176,929 B1 1/2001 Fukunaga et al.
6,177,688 B1 1/2001 Linthicum et al.
6,178,918 B1 1/2001 Van Os et al.
6,179,955 B1 1/2001 Shin et al.
6,180,979 B1 1/2001 Hofman et al.
6,182,603 B1 2/2001 Shang et al.
6,183,564 B1 2/2001 Reynolds et al.
6,183,565 B1 2/2001 Granneman et al.
6,187,672 B1 2/2001 Zhao et al.
6,187,691 B1 2/2001 Fukuda
6,189,482 B1 2/2001 Zhao et al.
6,190,037 B1 2/2001 Das et al.
6,190,113 B1 2/2001 Bui et al.
6,190,634 B1 2/2001 Lieber et al.
6,191,399 B1 2/2001 Van Bilsen
6,194,037 B1 2/2001 Terasaki et al.
6,200,897 B1 3/2001 Wang et al.
6,201,999 B1 3/2001 Jevtic
6,203,613 B1 3/2001 Gates et al.
6,203,618 B1 3/2001 Hashizume et al.
6,207,932 B1 3/2001 Yoo
6,207,936 B1 3/2001 de Waard
6,209,221 B1 4/2001 Beulens
6,210,485 B1 4/2001 Zhao et al.
6,212,789 B1 4/2001 Kato
6,213,708 B1 4/2001 Allen
6,214,122 B1 4/2001 Thompson
6,214,717 B1 4/2001 Yan et al.
6,217,658 B1 4/2001 Orczyk et al.
6,217,662 B1 4/2001 Kong et al.
6,218,288 B1 4/2001 Li et al.
6,224,679 B1 5/2001 Sasaki et al.
6,225,020 B1 5/2001 Jung et al.
6,225,602 B1 5/2001 Buiijze et al.
6,225,745 B1 5/2001 Srivastava
6,230,650 B1 5/2001 Yamazaki
6,231,290 B1 5/2001 Kikuchi et al.
6,235,121 B1 5/2001 Honma et al.
6,235,858 B1 5/2001 Swarup et al.
6,238,734 B1 5/2001 Senzaki et al.
6,239,402 B1 5/2001 Araki et al.
6,239,715 B1 5/2001 Belton
6,240,875 B1 6/2001 Wijck et al.
6,241,822 B1 6/2001 Ide
6,242,359 B1 6/2001 Misra
6,243,654 B1 6/2001 Johnson et al.
6,245,647 B1 6/2001 Akiyama et al.
6,245,665 B1 6/2001 Yokoyama
6,247,245 B1 6/2001 Ishii
6,250,250 B1 6/2001 Maishev et al.
6,255,221 B1 7/2001 Hudson et al.
6,257,758 B1 7/2001 Culbertson
6,261,648 B1 7/2001 Akiba et al.
6,264,467 B1 7/2001 Lue et al.
6,265,113 B1 7/2001 Rosasco et al.
6,265,311 B1 7/2001 Hautala et al.
6,270,572 B1 8/2001 Kim et al.
6,271,148 B1 8/2001 Kao
6,271,320 B1 8/2001 Keller et al.
6,274,496 B1 8/2001 Leusink et al.
6,274,878 B1 8/2001 Li et al.
6,281,098 B1 8/2001 Wang
6,281,141 B1 8/2001 Das et al.
6,283,692 B1 9/2001 Perlov et al.
6,284,050 B1 9/2001 Shi et al.
6,284,149 B1 9/2001 Li et al.
6,287,965 B1 9/2001 Kang et al.
6,287,988 B1 9/2001 Nagamine et al.
6,293,700 B1 9/2001 Lund et al.
D449,873 S 10/2001 Bronson
6,296,710 B1 10/2001 Allen et al.
6,296,711 B1 10/2001 Loan et al.
6,296,909 B1 10/2001 Spitsberg
6,297,539 B1 10/2001 Ma et al.
6,299,133 B2 10/2001 Waragai et al.
6,302,964 B1 10/2001 Umotoy et al.
6,303,523 B2 10/2001 Cheung
6,305,898 B1 10/2001 Yamagishi et al.
6,311,016 B1 10/2001 Yanagawa et al.
6,312,525 B1 11/2001 Bright et al.
6,315,512 B1 11/2001 Tabrizi et al.
6,316,162 B1 11/2001 Jung et al.
6,316,371 B1 11/2001 Oosterlaken et al.
6,320,320 B1 11/2001 Bailey et al.
6,321,680 B2 11/2001 Cook et al.
6,321,780 B1 11/2001 Iwabuchi
D451,893 S 12/2001 Robson
D452,220 S 12/2001 Robson
6,325,858 B1 12/2001 Wengert
6,326,322 B1 12/2001 Kim et al.
6,326,597 B1 12/2001 Lubomirsky et al.
6,328,561 B1 12/2001 Hasper et al.
6,328,864 B1 12/2001 Ishizawa et al.
6,329,297 B1 12/2001 Balish
6,333,275 B1 12/2001 Mayer et al.
6,335,049 B1 1/2002 Basceri
6,335,240 B1 1/2002 Kim et al.

(56) References Cited

U.S. PATENT DOCUMENTS

| | | | |
|---|---|---|---|
| 6,335,293 | B1 | 1/2002 | Luo et al. |
| 6,342,427 | B1 | 1/2002 | Choi et al. |
| 6,343,239 | B1 | 1/2002 | Toda et al. |
| 6,344,084 | B1 | 2/2002 | Koinuma et al. |
| 6,344,232 | B1 | 2/2002 | Jones et al. |
| 6,346,419 | B1 | 2/2002 | Ryerson et al. |
| 6,347,636 | B1 | 2/2002 | Xia |
| 6,350,391 | B1 | 2/2002 | Livshits et al. |
| 6,352,049 | B1 | 3/2002 | Yin et al. |
| 6,352,945 | B1 | 3/2002 | Matsuki |
| 6,357,984 | B1 | 3/2002 | Zinger et al. |
| 6,363,294 | B1 | 3/2002 | Coronel et al. |
| D455,024 | S | 4/2002 | Mimick et al. |
| 6,367,410 | B1 | 4/2002 | Leahey et al. |
| 6,368,773 | B1 | 4/2002 | Jung et al. |
| 6,368,987 | B1 | 4/2002 | Kopacz et al. |
| 6,370,796 | B1 | 4/2002 | Zucker |
| 6,372,583 | B1 | 4/2002 | Tyagi |
| 6,374,831 | B1 | 4/2002 | Chandran |
| 6,375,312 | B1 | 4/2002 | Ikeda et al. |
| 6,375,749 | B1 | 4/2002 | Boydston et al. |
| 6,375,750 | B1 | 4/2002 | Van Os et al. |
| 6,379,466 | B1 | 4/2002 | Sahin et al. |
| D457,609 | S | 5/2002 | Piano |
| 6,383,300 | B1 | 5/2002 | Saito et al. |
| 6,383,566 | B1 | 5/2002 | Zagdoun |
| 6,383,955 | B1 | 5/2002 | Matsuki |
| 6,387,207 | B1 | 5/2002 | Janakiraman |
| 6,387,823 | B1 | 5/2002 | Sonderman et al. |
| 6,387,827 | B1 | 5/2002 | Mertens et al. |
| 6,390,753 | B1 | 5/2002 | de Ridder et al. |
| 6,390,754 | B2 | 5/2002 | Yamaga et al. |
| 6,391,803 | B1 | 5/2002 | Kim et al. |
| 6,395,650 | B1 | 5/2002 | Callegari et al. |
| 6,398,184 | B1 | 6/2002 | Sowada et al. |
| 6,399,022 | B1 | 6/2002 | Schuler et al. |
| 6,402,806 | B1 | 6/2002 | Schmitt et al. |
| 6,410,433 | B1 | 6/2002 | Hautala et al. |
| 6,410,459 | B2 | 6/2002 | Blalock et al. |
| 6,410,463 | B1 | 6/2002 | Matsuki |
| 6,413,321 | B1 | 7/2002 | Kim et al. |
| 6,413,583 | B1 | 7/2002 | Moghadam et al. |
| 6,420,279 | B1 | 7/2002 | Ono et al. |
| 6,423,949 | B1 | 7/2002 | Chen et al. |
| D461,233 | S | 8/2002 | Whalen |
| D461,882 | S | 8/2002 | Piano |
| 6,428,859 | B1 | 8/2002 | Chiang et al. |
| 6,429,465 | B1 | 8/2002 | Yagi et al. |
| 6,432,206 | B1 | 8/2002 | Tolt |
| 6,432,255 | B1 | 8/2002 | Sun et al. |
| 6,432,479 | B2 | 8/2002 | Chang et al. |
| 6,432,849 | B1 | 8/2002 | Endo et al. |
| 6,433,298 | B1 | 8/2002 | Ishii |
| 6,435,798 | B1 | 8/2002 | Satoh |
| 6,435,865 | B1 | 8/2002 | Tseng et al. |
| 6,436,819 | B1 | 8/2002 | Zhang |
| 6,437,444 | B2 | 8/2002 | Andideh |
| 6,438,502 | B1 | 8/2002 | Awtrey |
| 6,439,822 | B1 | 8/2002 | Kimura et al. |
| 6,440,261 | B1 | 8/2002 | Tepman et al. |
| 6,441,350 | B1 | 8/2002 | Stoddard et al. |
| 6,445,574 | B1 | 9/2002 | Saw et al. |
| 6,446,573 | B2 | 9/2002 | Hirayama et al. |
| 6,447,232 | B1 | 9/2002 | Davis et al. |
| 6,447,651 | B1 | 9/2002 | Ishikawa et al. |
| 6,447,937 | B1 | 9/2002 | Murakawa et al. |
| 6,448,192 | B1 | 9/2002 | Kaushik |
| 6,450,117 | B1 | 9/2002 | Murugesh et al. |
| 6,450,757 | B1 | 9/2002 | Saeki |
| 6,451,713 | B1 | 9/2002 | Tay et al. |
| 6,452,017 | B1 | 9/2002 | Uhlenbrock et al. |
| 6,454,860 | B2 | 9/2002 | Metzner et al. |
| 6,454,909 | B1 | 9/2002 | Matsuse et al. |
| 6,455,098 | B2 | 9/2002 | Tran et al. |
| 6,455,225 | B1 | 9/2002 | Kong et al. |
| 6,455,445 | B2 | 9/2002 | Matsuki |
| 6,460,482 | B1 | 10/2002 | Kuibira et al. |
| 6,461,435 | B1 | 10/2002 | Littau et al. |
| 6,461,436 | B1 | 10/2002 | Campbell et al. |
| 6,461,439 | B1 | 10/2002 | Granneman et al. |
| 6,462,310 | B1 | 10/2002 | Ratliff et al. |
| 6,464,825 | B1 | 10/2002 | Shinozaki |
| 6,468,924 | B2 | 10/2002 | Lee |
| 6,471,779 | B1 | 10/2002 | Nishio et al. |
| 6,472,266 | B1 | 10/2002 | Yu et al. |
| 6,474,987 | B1 | 11/2002 | Huang et al. |
| 6,475,276 | B1 | 11/2002 | Elers et al. |
| 6,475,902 | B1 | 11/2002 | Hausmann et al. |
| 6,475,930 | B1 | 11/2002 | Junker et al. |
| 6,478,872 | B1 | 11/2002 | Chae et al. |
| 6,481,945 | B1 | 11/2002 | Hasper et al. |
| 6,482,331 | B2 | 11/2002 | Lu et al. |
| 6,482,663 | B1 | 11/2002 | Buckland |
| 6,483,989 | B1 | 11/2002 | Okada et al. |
| 6,488,774 | B1 | 12/2002 | Horie et al. |
| 6,490,493 | B1 | 12/2002 | Dharnipragada |
| 6,492,625 | B1 | 12/2002 | Boguslavskiy et al. |
| 6,494,065 | B2 | 12/2002 | Babbitt |
| 6,494,998 | B1 | 12/2002 | Brcka |
| 6,496,819 | B1 | 12/2002 | Bello et al. |
| 6,497,734 | B1 | 12/2002 | Barber et al. |
| 6,497,767 | B1 | 12/2002 | Okase et al. |
| 6,498,091 | B1 | 12/2002 | Chen et al. |
| 6,499,533 | B2 | 12/2002 | Yamada |
| 6,500,487 | B1 | 12/2002 | Holst et al. |
| 6,502,530 | B1 | 1/2003 | Turlot et al. |
| 6,503,079 | B2 | 1/2003 | Kogano et al. |
| 6,503,330 | B1 | 1/2003 | Sneh et al. |
| 6,503,365 | B1 | 1/2003 | Kim et al. |
| 6,503,562 | B1 | 1/2003 | Saito et al. |
| 6,503,826 | B1 | 1/2003 | Oda |
| 6,506,009 | B1 | 1/2003 | Nulman et al. |
| 6,506,253 | B2 | 1/2003 | Sakuma |
| 6,507,410 | B1 | 1/2003 | Robertson et al. |
| 6,511,539 | B1 | 1/2003 | Raaijmakers |
| 6,514,313 | B1 | 2/2003 | Spiegelman |
| 6,514,666 | B1 | 2/2003 | Choi et al. |
| 6,521,295 | B1 | 2/2003 | Remington |
| 6,521,547 | B1 | 2/2003 | Chang et al. |
| 6,527,884 | B1 | 3/2003 | Takakuwa et al. |
| 6,528,171 | B1 | 3/2003 | Endler et al. |
| 6,528,430 | B2 | 3/2003 | Kwan |
| 6,528,752 | B1 | 3/2003 | Ishii et al. |
| 6,528,767 | B2 | 3/2003 | Bagley et al. |
| 6,530,994 | B1 | 3/2003 | Mahawili |
| 6,531,193 | B2 | 3/2003 | Fonash et al. |
| 6,531,412 | B2 | 3/2003 | Conti et al. |
| 6,534,133 | B1 | 3/2003 | Kaloyeros et al. |
| 6,534,395 | B2 | 3/2003 | Werkhoven et al. |
| 6,536,950 | B1 | 3/2003 | Green |
| 6,539,891 | B1 | 4/2003 | Kang et al. |
| 6,540,469 | B2 | 4/2003 | Matsunaga et al. |
| 6,540,838 | B2 | 4/2003 | Sneh et al. |
| 6,544,906 | B2 | 4/2003 | Rotondaro et al. |
| 6,552,209 | B1 | 4/2003 | Lei et al. |
| 6,558,517 | B2 | 5/2003 | Basceri |
| 6,558,755 | B2 | 5/2003 | Berry et al. |
| 6,559,026 | B1 | 5/2003 | Rossman et al. |
| 6,562,094 | B2 | 5/2003 | Denker et al. |
| 6,565,763 | B1 | 5/2003 | Asakawa et al. |
| 6,566,278 | B1 | 5/2003 | Harvey et al. |
| 6,569,239 | B2 | 5/2003 | Arai et al. |
| 6,569,971 | B2 | 5/2003 | Roh et al. |
| 6,573,030 | B1 | 6/2003 | Fairbairn et al. |
| 6,574,644 | B2 | 6/2003 | Hsu et al. |
| 6,576,062 | B2 | 6/2003 | Matsuse |
| 6,576,064 | B2 | 6/2003 | Griffiths et al. |
| 6,576,300 | B1 | 6/2003 | Berry et al. |
| 6,576,564 | B2 | 6/2003 | Agarwal |
| 6,578,589 | B1 | 6/2003 | Mayusumi |
| 6,579,833 | B1 | 6/2003 | McNallan et al. |
| 6,580,050 | B1 | 6/2003 | Miller et al. |
| 6,582,174 | B1 | 6/2003 | Hayashi |
| 6,583,048 | B2 | 6/2003 | Vincent et al. |

(56) References Cited

U.S. PATENT DOCUMENTS 6,583,572 B2 6/2003 Veltrop et al.
6,587,108 B1 7/2003 Guerlain et al.
6,589,352 B1 7/2003 Yudovsky et al.
6,589,707 B2 7/2003 Lee et al.
6,589,868 B2 7/2003 Rossman
6,590,251 B2 7/2003 Kang et al.
6,594,550 B1 7/2003 Okrah
6,596,398 B1 7/2003 Russo et al.
6,596,653 B2 7/2003 Tan
6,598,559 B1 7/2003 Vellore et al.
6,602,806 B1 8/2003 Xia et al.
6,607,602 B1 8/2003 Granneman et al.
6,607,868 B2 8/2003 Choi
6,607,948 B1 8/2003 Sugiyama et al.
6,608,745 B2 8/2003 Tsuruta et al.
6,610,375 B2 8/2003 Akiba et al.
6,613,685 B1 9/2003 Granneman et al.
6,616,986 B2 9/2003 Sherman
6,617,253 B1 9/2003 Chu et al.
6,620,251 B2 9/2003 Kitano
6,623,799 B1 9/2003 Lee et al.
6,624,064 B1 9/2003 Sahin
6,627,268 B1 9/2003 Fair et al.
6,627,503 B2 9/2003 Ma et al.
6,630,030 B1 10/2003 Suntola et al.
6,632,478 B2 10/2003 Gaillard et al.
6,633,364 B2 10/2003 Hayashi
6,635,115 B1 10/2003 Fairbairn et al.
6,635,117 B1 10/2003 Kinnard et al.
6,635,578 B1 10/2003 Xu et al.
6,638,839 B2 10/2003 Deng et al.
6,640,145 B2 10/2003 Hoffberg et al.
6,645,304 B2 11/2003 Yamaguchi
6,648,974 B1 11/2003 Ogliari et al.
6,649,921 B1 11/2003 Cekic et al.
6,652,924 B2 11/2003 Sherman
6,656,281 B1 12/2003 Ueda
6,656,282 B2 12/2003 Kim et al.
6,658,933 B2 12/2003 Allegre et al.
6,659,111 B1 12/2003 Mouri et al.
6,660,662 B2 12/2003 Ishikawa et al.
6,662,817 B2 12/2003 Yamagishi
6,663,332 B1 12/2003 Sluijk et al.
6,673,196 B1 1/2004 Oyabu
6,676,290 B1 1/2004 Lu
6,676,759 B1 1/2004 Takagi
6,679,194 B2 1/2004 Ham et al.
6,682,971 B2 1/2004 Tsuneda et al.
6,682,973 B1 1/2004 Paton et al.
6,683,274 B1 1/2004 Kwon et al.
D486,891 S 2/2004 Cronce
6,684,659 B1 2/2004 Tanaka et al.
6,684,719 B2 2/2004 Gehner et al.
6,686,281 B2 2/2004 Yamazaki et al.
6,688,784 B1 2/2004 Templeton
6,689,220 B1 2/2004 Nguyen
6,692,575 B1 2/2004 Omstead et al.
6,692,576 B2 2/2004 Halpin et al.
6,692,903 B2 2/2004 Chen et al.
6,696,367 B1 2/2004 Aggarwal
6,699,003 B2 3/2004 Saeki
6,699,399 B1 3/2004 Qian et al.
6,700,089 B1 3/2004 Hirooka
6,709,989 B2 3/2004 Ramdani et al.
6,710,364 B2 3/2004 Guldi et al.
6,710,857 B2 3/2004 Kondo
6,712,949 B2 3/2004 Gopal
6,713,824 B1 3/2004 Mikata
6,715,949 B1 4/2004 Fisher et al.
6,716,477 B1 4/2004 Komiyama et al.
6,716,571 B2 4/2004 Gabriel
6,719,499 B1 4/2004 Kuznetsov et al.
6,720,260 B1 4/2004 Fair et al.
6,720,262 B2 4/2004 Koh et al.
6,720,531 B1 4/2004 Jacobson et al.
6,722,837 B2 4/2004 Inui
6,723,642 B1 4/2004 Lim et al.
6,730,614 B1 5/2004 Lim et al.
6,732,006 B2 5/2004 Haanstra et al.
6,734,090 B2 5/2004 Agarwala et al.
6,734,631 B2 5/2004 Juestel et al.
6,737,716 B1 5/2004 Matsuo et al.
6,740,853 B1 5/2004 Johnson et al.
6,743,475 B2 6/2004 Skarp et al.
6,743,738 B2 6/2004 Todd et al.
6,745,095 B1 6/2004 Ben-Dov
6,746,240 B2 6/2004 de Ridder et al.
6,746,308 B1 6/2004 Bode et al.
6,749,671 B2 6/2004 Holst et al.
6,753,507 B2 6/2004 Fure et al.
6,755,221 B2 6/2004 Jeong et al.
6,756,085 B2 6/2004 Waldfried
6,756,293 B2 6/2004 Li et al.
6,756,318 B2 6/2004 Nguyen et al.
6,759,098 B2 7/2004 Han
6,760,981 B2 7/2004 Leap
6,766,545 B2 7/2004 Hodges
6,767,447 B2 7/2004 Uno et al.
D494,552 S 8/2004 Tezuka et al.
6,776,849 B2 8/2004 Aggarwal et al.
6,780,704 B1 8/2004 Raaijmakers et al.
6,783,875 B2 8/2004 Yamada et al.
6,784,033 B1 8/2004 Yamazaki
6,784,108 B1 8/2004 Donohoe et al.
D496,008 S 9/2004 Takahashi et al.
6,786,997 B1 9/2004 Yamazaki
D497,536 S 10/2004 Fujiwara
D497,977 S 11/2004 Engelbrektsson
6,811,960 B2 11/2004 Lee et al.
6,812,157 B1 11/2004 Gadgil
6,815,350 B2 11/2004 Kim et al.
6,815,352 B1 11/2004 Tamura et al.
6,818,566 B2 11/2004 Leeson et al.
6,818,864 B2 11/2004 Ptak
6,820,570 B2 11/2004 Kilpela et al.
6,821,889 B2 11/2004 Elers et al.
6,821,910 B2 11/2004 Adomaitis et al.
6,824,665 B2 11/2004 Shelnut et al.
6,825,106 B1 11/2004 Gao et al.
6,825,134 B2 11/2004 Law et al.
D499,620 S 12/2004 Horner-Richardson et al.
6,827,789 B2 12/2004 Lee et al.
6,828,235 B2 12/2004 Takano
6,831,004 B2 12/2004 Byun
6,833,024 B2 12/2004 Holst et al.
6,835,039 B2 12/2004 Van Den Berg
6,838,122 B2 1/2005 Basceri et al.
6,841,201 B2 1/2005 Shanov et al.
6,843,202 B2 1/2005 Kusuda
6,843,858 B2 1/2005 Rossman
6,846,146 B2 1/2005 Inui
6,846,515 B2 1/2005 Vrtis
6,846,742 B2 1/2005 Rossman
6,847,014 B1 1/2005 Benjamin et al.
6,849,241 B2 2/2005 Dauelsberg et al.
6,849,857 B2 2/2005 Ichiki et al.
6,854,580 B2 2/2005 Braford
6,858,524 B2 2/2005 Haukka et al.
6,858,547 B2 2/2005 Metzner
6,861,642 B2 3/2005 Ichiki et al.
6,863,019 B2 3/2005 Shamouilian
6,863,281 B2 3/2005 Endou et al.
6,864,041 B2 3/2005 Brown
6,867,086 B1 3/2005 Chen et al.
6,867,153 B2 3/2005 Tokunaga
6,867,859 B1 3/2005 Powell
6,872,258 B2 3/2005 Park et al.
6,872,259 B2 3/2005 Strang
D504,142 S 4/2005 Horner-Richardson et al.
6,874,247 B1 4/2005 Hsu
6,874,480 B1 4/2005 Ismailov
6,875,477 B2 4/2005 Trickett et al.
6,875,677 B1 4/2005 Conley, Jr. et al.
6,876,017 B2 4/2005 Goodner

(56) References Cited

U.S. PATENT DOCUMENTS

| | | | |
|---|---|---|---|
| 6,876,191 | B2 | 4/2005 | de Ridder |
| 6,878,206 | B2 | 4/2005 | Tzu et al. |
| 6,878,402 | B2 | 4/2005 | Chiang et al. |
| 6,883,733 | B1 | 4/2005 | Lind |
| 6,884,066 | B2 | 4/2005 | Nguyen et al. |
| 6,884,295 | B2 | 4/2005 | Ishii |
| 6,884,319 | B2 | 4/2005 | Kim |
| 6,884,475 | B2 | 4/2005 | Basceri |
| D505,590 | S | 5/2005 | Greiner |
| 6,889,211 | B1 | 5/2005 | Yoshiura et al. |
| 6,889,864 | B2 | 5/2005 | Lindfors et al. |
| 6,890,596 | B2 | 5/2005 | Sarigiannis et al. |
| 6,895,158 | B2 | 5/2005 | Aylward et al. |
| 6,899,507 | B2 | 5/2005 | Yamagishi et al. |
| 6,902,395 | B2 | 6/2005 | Oosterlaken et al. |
| 6,902,647 | B2 | 6/2005 | Hasper |
| 6,909,839 | B2 | 6/2005 | Wang et al. |
| 6,911,092 | B2 | 6/2005 | Sneh |
| 6,913,152 | B2 | 7/2005 | Zuk |
| 6,913,796 | B2 | 7/2005 | Albano et al. |
| 6,916,398 | B2 | 7/2005 | Chen et al. |
| 6,916,559 | B2 | 7/2005 | Murakawa et al. |
| 6,917,755 | B2 | 7/2005 | Nguyen et al. |
| 6,924,078 | B2 | 8/2005 | Lee et al. |
| 6,928,890 | B2 | 8/2005 | Gehner et al. |
| 6,929,699 | B2 | 8/2005 | Whitesell |
| 6,929,700 | B2 | 8/2005 | Tan et al. |
| 6,930,041 | B2 | 8/2005 | Agarwal |
| 6,930,059 | B2 | 8/2005 | Conley, Jr. et al. |
| 6,935,269 | B2 | 8/2005 | Lee et al. |
| 6,939,579 | B2 | 9/2005 | Bondestam et al. |
| 6,939,817 | B2 | 9/2005 | Sandhu et al. |
| 6,942,753 | B2 | 9/2005 | Choi et al. |
| 6,949,204 | B1 | 9/2005 | Lenz et al. |
| 6,951,587 | B1 | 10/2005 | Narushima |
| 6,952,656 | B1 | 10/2005 | Cordova et al. |
| 6,953,609 | B2 | 10/2005 | Carollo |
| 6,955,741 | B2 | 10/2005 | Yamagishi |
| 6,955,836 | B2 | 10/2005 | Kumagai et al. |
| 6,955,928 | B1 | 10/2005 | Brennan |
| 6,963,052 | B2 | 11/2005 | Kuibira et al. |
| 6,972,055 | B2 | 12/2005 | Sferlazzo |
| 6,972,478 | B1 | 12/2005 | Waite et al. |
| 6,974,781 | B2 | 12/2005 | Timmermans et al. |
| 6,975,921 | B2 | 12/2005 | Verhaar |
| 6,976,822 | B2 | 12/2005 | Woodruff |
| RE38,937 | E | 1/2006 | Nakamura |
| 6,981,832 | B2 | 1/2006 | Zinger et al. |
| 6,982,046 | B2 | 1/2006 | Srivastava et al. |
| 6,982,103 | B2 | 1/2006 | Basceri et al. |
| 6,984,591 | B1 | 1/2006 | Buchanan et al. |
| 6,984,595 | B1 | 1/2006 | Yamazaki |
| 6,985,788 | B2 | 1/2006 | Haanstra et al. |
| 6,986,914 | B2 | 1/2006 | Elers et al. |
| 6,987,155 | B2 | 1/2006 | Roh et al. |
| 6,990,430 | B2 | 1/2006 | Hosek |
| 7,005,227 | B2 | 2/2006 | Yueh et al. |
| 7,005,391 | B2 | 2/2006 | Min |
| 7,008,879 | B2 | 3/2006 | Lee et al. |
| 7,010,580 | B1 | 3/2006 | Fu et al. |
| 7,017,514 | B1 | 3/2006 | Shepherd et al. |
| 7,018,941 | B2 | 3/2006 | Cui et al. |
| 7,021,330 | B2 | 4/2006 | Maula et al. |
| 7,021,881 | B2 | 4/2006 | Yamagishi |
| 7,036,453 | B2 | 5/2006 | Ishikawa et al. |
| 7,041,609 | B2 | 5/2006 | Vaartstra |
| 7,045,430 | B2 | 5/2006 | Ahn et al. |
| 7,049,226 | B2 | 5/2006 | Chung et al. |
| 7,049,247 | B2 | 5/2006 | Gates et al. |
| 7,052,584 | B2 | 5/2006 | Basceri |
| 7,053,009 | B2 | 5/2006 | Conley, Jr. et al. |
| 7,055,263 | B2 | 6/2006 | Wu et al. |
| 7,055,875 | B2 | 6/2006 | Bonora |
| 7,062,161 | B2 | 6/2006 | Kusuda et al. |
| D524,600 | S | 7/2006 | Austin et al. |
| D525,127 | S | 7/2006 | Cogley et al. |
| 7,070,178 | B2 | 7/2006 | Van Der Toorn et al. |
| 7,071,051 | B1 | 7/2006 | Jeon et al. |
| 7,073,834 | B2 | 7/2006 | Matsumoto et al. |
| 7,074,690 | B1 | 7/2006 | Gauri et al. |
| 7,077,614 | B1 | 7/2006 | Hasper et al. |
| 7,080,545 | B2 | 7/2006 | Dimeo et al. |
| 7,084,060 | B1 | 8/2006 | Furukawa |
| 7,084,079 | B2 | 8/2006 | Conti et al. |
| 7,085,623 | B2 | 8/2006 | Siegers |
| 7,086,347 | B2 | 8/2006 | Howald et al. |
| 7,088,003 | B2 | 8/2006 | Gates et al. |
| 7,090,394 | B2 | 8/2006 | Hashikura et al. |
| 7,092,287 | B2 | 8/2006 | Beulens et al. |
| 7,098,149 | B2 | 8/2006 | Lukas |
| 7,098,150 | B2 | 8/2006 | Misra et al. |
| 7,100,459 | B2 | 9/2006 | Gehner et al. |
| 7,101,763 | B1 | 9/2006 | Anderson et al. |
| 7,108,753 | B2 | 9/2006 | Wood |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,122,844 | B2 | 10/2006 | Nakamura et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,140,558 | B2 | 11/2006 | McCracken et al. |
| 7,141,499 | B2 | 11/2006 | Raaijmakers |
| 7,143,897 | B1 | 12/2006 | Guzman et al. |
| 7,144,806 | B1 | 12/2006 | Fair et al. |
| 7,144,809 | B2 | 12/2006 | Elers et al. |
| 7,147,766 | B2 | 12/2006 | Uzoh et al. |
| 7,153,542 | B2 | 12/2006 | Nguyen et al. |
| D535,673 | S | 1/2007 | Conway et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,173,216 | B2 | 2/2007 | Ptak |
| 7,183,229 | B2 | 2/2007 | Yamanaka |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,479 | B2 | 3/2007 | Beatty et al. |
| 7,195,693 | B2 | 3/2007 | Cowans |
| D541,125 | S | 4/2007 | Gaudron |
| 7,198,447 | B2 | 4/2007 | Morimitsu et al. |
| 7,199,513 | B2 | 4/2007 | Huber et al. |
| 7,201,943 | B2 | 4/2007 | Park et al. |
| 7,202,148 | B2 | 4/2007 | Chen et al. |
| 7,202,512 | B2 | 4/2007 | Chen et al. |
| 7,204,886 | B2 | 4/2007 | Chen et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,198 | B2 | 4/2007 | Basceri et al. |
| 7,208,389 | B1 | 4/2007 | Tipton et al. |
| 7,208,413 | B2 | 4/2007 | Byun et al. |
| 7,210,925 | B2 | 5/2007 | Adachi |
| 7,211,524 | B2 | 5/2007 | Ryu et al. |
| 7,211,525 | B1 | 5/2007 | Shanker |
| 7,214,630 | B1 | 5/2007 | Varadarajan et al. |
| 7,217,617 | B2 | 5/2007 | Basceri |
| 7,223,014 | B2 | 5/2007 | Lojen |
| 7,229,502 | B2 | 6/2007 | Wang et al. |
| 7,234,476 | B2 | 6/2007 | Arai |
| 7,235,137 | B2 | 6/2007 | Kitayama et al. |
| 7,235,482 | B2 | 6/2007 | Wu |
| 7,235,501 | B2 | 6/2007 | Ahn et al. |
| 7,238,596 | B2 | 7/2007 | Kouvetakis et al. |
| 7,238,616 | B2 | 7/2007 | Agarwal |
| 7,238,653 | B2 | 7/2007 | Lee et al. |

(56) References Cited

U.S. PATENT DOCUMENTS

D549,815 S 8/2007 Murphy
7,256,375 B2 8/2007 Oosterlaken
7,265,061 B1 9/2007 Cho et al.
7,274,867 B2 9/2007 Peukert
D553,104 S 10/2007 Oohashi et al.
7,279,256 B2 10/2007 Son
7,290,813 B2 11/2007 Bonora
7,294,581 B2 11/2007 Haverkort et al.
7,296,460 B2 11/2007 Dimeo et al.
7,297,641 B2 11/2007 Todd et al.
7,298,009 B2 11/2007 Yan et al.
7,301,623 B1 11/2007 Madsen et al.
D556,704 S 12/2007 Nakamura et al.
D557,226 S 12/2007 Uchino et al.
D558,021 S 12/2007 Lawrence
7,307,028 B2 12/2007 Goto et al.
7,307,178 B2 12/2007 Kiyomori et al.
7,311,977 B2 12/2007 Yokota et al.
7,312,148 B2 12/2007 Ramaswamy et al.
7,312,162 B2 12/2007 Ramaswamy et al.
7,312,494 B2 12/2007 Ahn et al.
D559,993 S 1/2008 Nagakubo et al.
D559,994 S 1/2008 Nagakubo et al.
7,320,544 B2 1/2008 Hsieh
7,323,401 B2 1/2008 Ramaswamy et al.
D562,357 S 2/2008 Hardy
7,326,656 B2 2/2008 Brask et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,351,057 B2 4/2008 Berenbak et al.
7,354,482 B2 4/2008 Konishi et al.
7,354,847 B2 4/2008 Chan et al.
7,354,873 B2 4/2008 Fukazawa et al.
7,356,762 B2 4/2008 van Driel
7,357,138 B2 4/2008 Ji et al.
7,361,447 B2 4/2008 Jung
7,375,035 B2 5/2008 Heden et al.
7,376,520 B2 5/2008 Wong
7,378,618 B1 5/2008 Sorabji et al.
7,379,785 B2 5/2008 Higashi et al.
D571,383 S 6/2008 Ota et al.
D571,831 S 6/2008 Ota et al.
7,381,644 B1 6/2008 Soubramonium et al.
7,387,685 B2 6/2008 Choi et al.
7,393,207 B2 7/2008 Imai
7,393,418 B2 7/2008 Yokogawa
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,399,570 B2 7/2008 Lee et al.
7,402,534 B2 7/2008 Mahajani
7,405,166 B2 7/2008 Liang et al.
7,405,454 B2 7/2008 Ahn et al.
D575,713 S 8/2008 Ratcliffe
7,408,225 B2 8/2008 Shinriki et al.
7,410,290 B2 8/2008 Tanaka
7,410,666 B2 8/2008 Elers
7,411,352 B2 8/2008 Madocks
7,414,281 B1 8/2008 Fastow
D576,001 S 9/2008 Brunderman
7,422,635 B2 9/2008 Zheng et al.
7,422,636 B2 9/2008 Ishizaka
7,422,653 B2 9/2008 Blahnik et al.
7,422,775 B2 9/2008 Ramaswamy et al.
7,425,224 B2 9/2008 Nguyen
7,427,571 B2 9/2008 Lindeboom et al.
7,429,532 B2 9/2008 Ramaswamy et al.
7,431,966 B2 10/2008 Derderian et al.
7,432,476 B2 10/2008 Morita et al.
7,437,060 B2 10/2008 Wang et al.
7,442,275 B2 10/2008 Cowans
7,456,429 B2 11/2008 Levy
D583,395 S 12/2008 Ueda
7,467,632 B2 12/2008 Lee et al.
7,473,655 B2 1/2009 Wang et al.
7,475,588 B2 1/2009 Dimeo et al.
7,476,291 B2 1/2009 Wang et al.
7,479,198 B2 1/2009 Guffrey
7,482,247 B1 1/2009 Papasouliotis
7,482,283 B2 1/2009 Yamasaki et al.
D585,968 S 2/2009 Elkins et al.
7,489,389 B2 2/2009 Shibazaki et al.
7,494,882 B2 2/2009 Vitale
7,497,614 B2 3/2009 Gaff
7,498,242 B2 3/2009 Kumar et al.
7,501,292 B2 3/2009 Matsushita et al.
7,501,355 B2 3/2009 Bhatia et al.
7,503,980 B2 3/2009 Kida et al.
7,504,344 B2 3/2009 Matsuki et al.
D590,933 S 4/2009 Vansell
7,514,058 B1 4/2009 Hitzman et al.
7,514,375 B1 4/2009 Shanker et al.
D593,585 S 6/2009 Ota et al.
D593,969 S 6/2009 Li
7,541,297 B2 6/2009 Mallick et al.
7,544,398 B1 6/2009 Chang et al.
7,547,363 B2 6/2009 Tomiyasu et al.
7,547,633 B2 6/2009 Ranish et al.
7,550,396 B2 6/2009 Frohberg et al.
D596,476 S 7/2009 Welch
7,561,982 B2 7/2009 Rund et al.
7,563,715 B2 7/2009 Haukka et al.
7,566,891 B2 7/2009 Rocha-Alvarez et al.
7,569,193 B2 8/2009 Ferron et al.
7,575,968 B2 8/2009 Sadaka et al.
7,579,285 B2 8/2009 Zimmerman et al.
7,579,785 B2 8/2009 Shinmen et al.
D600,223 S 9/2009 Aggarwal
7,582,555 B1 9/2009 Lang
7,582,575 B2 9/2009 Fukazawa et al.
7,589,003 B2 9/2009 Kouvetakis et al.
7,589,028 B1 9/2009 Cho et al.
7,589,029 B2 9/2009 Derderian et al.
7,591,601 B2 9/2009 Matsuoka et al.
7,591,907 B2 9/2009 Chen et al.
D602,575 S 10/2009 Breda
7,598,513 B2 10/2009 Kouvetakis et al.
7,601,223 B2 10/2009 Lindfors et al.
7,601,225 B2 10/2009 Tuominen et al.
7,601,652 B2 10/2009 Singh et al.
7,611,640 B1 11/2009 Howald et al.
7,611,751 B2 11/2009 Elers
7,611,980 B2 11/2009 Wells et al.
7,618,226 B2 11/2009 Takizawa
7,621,672 B2 11/2009 Ripley
7,622,369 B1 11/2009 Lee et al.
7,622,378 B2 11/2009 Liu et al.
7,623,940 B2 11/2009 Huskamp et al.
D606,952 S 12/2009 Lee
7,625,820 B1 12/2009 Papasouliotis
7,629,277 B2 12/2009 Ghatnagar
7,632,549 B2 12/2009 Goundar
7,638,951 B2 12/2009 DeVincentis et al.
7,640,142 B2 12/2009 Tachikawa et al.
7,645,341 B2 1/2010 Kennedy et al.
7,645,484 B2 1/2010 Ishizaka
7,648,895 B2 1/2010 Kurokawa et al.
7,648,927 B2 1/2010 Singh et al.
7,651,269 B2 1/2010 Comendant
7,651,583 B2 1/2010 Kent et al.
7,651,955 B2 1/2010 Ranish et al.
7,651,959 B2 1/2010 Fukazawa et al.
7,651,961 B2 1/2010 Clark
D609,652 S 2/2010 Nagasaka et al.
D609,655 S 2/2010 Sugimoto
7,661,299 B2 2/2010 Kusunoki
7,662,689 B2 2/2010 Boyanov et al.
7,670,432 B2 3/2010 Li
7,674,726 B2 3/2010 Hasper et al.
7,678,197 B2 3/2010 Maki
7,678,715 B2 3/2010 Mungekar et al.

(56) References Cited

U.S. PATENT DOCUMENTS 7,682,454 B2 3/2010 Sneh
7,682,657 B2 3/2010 Sherman
D613,829 S 4/2010 Griffin et al.
D614,153 S 4/2010 Fondurulia et al.
D614,258 S 4/2010 Kojima
D614,267 S 4/2010 Breda
D614,268 S 4/2010 Breda
D614,593 S 4/2010 Lee
7,690,881 B2 4/2010 Yamagishi
7,691,205 B2 4/2010 Ikedo
7,692,171 B2 4/2010 Kaszuba et al.
7,695,808 B2 4/2010 Tuma
D616,390 S 5/2010 Sato
D616,394 S 5/2010 Sato
7,712,435 B2 5/2010 Yoshizaki et al.
7,713,874 B2 5/2010 Milligan
7,716,993 B2 5/2010 Ozawa et al.
7,718,930 B2 5/2010 Kawasaki et al.
7,720,560 B2 5/2010 Menser et al.
7,723,648 B2 5/2010 Tsukamoto et al.
7,725,012 B2 5/2010 Aggarwal et al.
7,727,864 B2 6/2010 Elers
7,727,880 B1 6/2010 Chattopadhyay et al.
7,732,343 B2 6/2010 Niroomand et al.
7,736,437 B2 6/2010 Cadwell et al.
7,736,528 B2 6/2010 Okita et al.
7,736,600 B2 6/2010 Clark et al.
7,737,035 B1 6/2010 Lind et al.
7,740,437 B2 6/2010 de Ridder et al.
7,740,705 B2 6/2010 Li
7,745,346 B2 6/2010 Hausmann et al.
7,748,760 B2 7/2010 Kushida
7,749,563 B2 7/2010 Zheng et al.
7,753,584 B2 7/2010 Gambino et al.
7,754,621 B2 7/2010 Putjkonen
7,758,698 B2 7/2010 Bang et al.
7,763,869 B2 7/2010 Matsushita et al.
7,767,262 B2 8/2010 Clark
7,771,796 B2 8/2010 Kohno et al.
7,780,440 B2 8/2010 Shibagaki et al.
7,780,789 B2 8/2010 Wu et al.
7,781,352 B2 8/2010 Fukazawa et al.
7,785,672 B2 * 8/2010 Choi ................. H01J 37/32082
427/574
7,789,559 B2 9/2010 Waser et al.
7,789,965 B2 9/2010 Matsushita et al.
7,790,633 B1 9/2010 Tarafdar et al.
7,794,546 B2 9/2010 Li
7,795,160 B2 9/2010 Wang et al.
7,798,096 B2 9/2010 Mahajani et al.
7,799,300 B2 9/2010 Lindfors et al.
7,799,706 B2 9/2010 Yeom et al.
7,803,722 B2 9/2010 Liang
D625,977 S 10/2010 Watson et al.
7,806,587 B2 10/2010 Kobayashi
7,807,566 B2 10/2010 Tsuji et al.
7,807,578 B2 10/2010 Bencher et al.
7,816,278 B2 10/2010 Reed et al.
7,824,492 B2 11/2010 Tois et al.
7,825,040 B1 11/2010 Fukazawa et al.
7,829,460 B2 11/2010 Streck et al.
7,833,348 B2 11/2010 Wada et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,850,449 B2 12/2010 Yang et al.
7,851,019 B2 12/2010 Tuominen et al.
7,851,232 B2 12/2010 van Schravendijk et al.
7,858,519 B2 12/2010 Liu et al.
7,858,533 B2 12/2010 Liu et al.
7,858,898 B2 12/2010 Bailey et al.
7,865,070 B2 1/2011 Nakamura
7,871,198 B2 1/2011 Rempe et al.
7,874,726 B2 1/2011 Jacobs et al.
7,884,918 B2 2/2011 Hattori
7,888,233 B1 2/2011 Gauri
7,894,474 B1 2/2011 Bell
D633,452 S 3/2011 Namiki et al.
D634,329 S 3/2011 Wastrom
D634,719 S 3/2011 Yasuda et al.
7,897,215 B1 3/2011 Fair et al.
7,897,217 B2 3/2011 Faguet
7,902,009 B2 3/2011 Simonelli et al.
7,902,582 B2 3/2011 Forbes et al.
7,906,174 B1 3/2011 Wu et al.
7,910,288 B2 3/2011 Abatchev et al.
7,910,452 B2 3/2011 Roh et al.
7,910,494 B2 3/2011 Dip et al.
7,915,139 B1 3/2011 Lang
7,915,667 B2 3/2011 Knoefler et al.
7,919,142 B2 4/2011 Yeom et al.
7,919,416 B2 4/2011 Lee et al.
7,923,382 B2 4/2011 Huotari et al.
7,925,378 B2 4/2011 Gilchrist et al.
7,935,940 B1 5/2011 Smargiassi
7,939,447 B2 5/2011 Bauer et al.
7,942,969 B2 5/2011 Riker et al.
7,946,762 B2 5/2011 Yednak
7,951,262 B2 5/2011 Koshiishi et al.
7,955,516 B2 6/2011 Chandrachood et al.
7,955,646 B2 6/2011 Cruse et al.
7,955,650 B2 6/2011 Tsuji
7,957,708 B2 6/2011 Karschnia et al.
7,963,736 B2 6/2011 Takizawa et al.
7,967,913 B2 6/2011 Hua et al.
7,972,980 B2 7/2011 Lee et al.
7,977,256 B2 7/2011 Liu et al.
7,981,751 B2 7/2011 Zhu et al.
D643,055 S 8/2011 Takahashi
7,989,365 B2 8/2011 Park et al.
7,989,736 B2 8/2011 Park et al.
7,992,318 B2 8/2011 Kawaji
7,993,457 B1 8/2011 Krotov et al.
7,994,070 B1 8/2011 Dip et al.
7,994,721 B2 8/2011 Espiau et al.
7,997,795 B2 8/2011 Schwagerman et al.
7,998,875 B2 8/2011 DeYoung
8,003,174 B2 8/2011 Fukazawa
8,003,919 B2 8/2011 Goto et al.
8,004,198 B2 8/2011 Bakre et al.
8,020,315 B2 9/2011 Nishimura
8,030,129 B2 10/2011 Jeong
8,033,771 B1 10/2011 Gage et al.
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,046,193 B2 10/2011 Yetter et al.
8,047,711 B2 11/2011 Ploechinger
8,048,783 B2 11/2011 Chung et al.
8,051,799 B2 11/2011 Itagaki et al.
8,052,794 B2 11/2011 Sumakeris et al.
8,055,378 B2 11/2011 Numakura
8,060,252 B2 11/2011 Gage et al.
RE43,023 E 12/2011 Nakashima et al.
D649,986 S 12/2011 Fujikata et al.
D651,291 S 12/2011 Liebson et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,083,853 B2 12/2011 Choi et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.

(56) References Cited

U.S. PATENT DOCUMENTS

| | | | |
|---|---|---|---|
| 8,100,583 | B2 | 1/2012 | Aggarwal |
| D653,734 | S | 2/2012 | Sisk |
| D654,882 | S | 2/2012 | Honma et al. |
| D654,884 | S | 2/2012 | Honma |
| D655,055 | S | 2/2012 | Toll |
| 8,110,099 | B2 | 2/2012 | Hersey et al. |
| 8,114,734 | B2 | 2/2012 | Yang et al. |
| 8,119,466 | B2 | 2/2012 | Avouris |
| 8,119,527 | B1 | 2/2012 | Chadrashekar et al. |
| D655,260 | S | 3/2012 | Honma et al. |
| D655,261 | S | 3/2012 | Honma et al. |
| D655,599 | S | 3/2012 | Durham |
| 8,128,333 | B2 | 3/2012 | Aburatani |
| 8,129,290 | B2 | 3/2012 | Balseanu et al. |
| 8,137,462 | B2 | 3/2012 | Fondurulia et al. |
| 8,137,465 | B1 | 3/2012 | Shrinivasan et al. |
| 8,138,104 | B2 | 3/2012 | Balseanu et al. |
| 8,138,676 | B2 | 3/2012 | Mills |
| 8,142,862 | B2 | 3/2012 | Lee et al. |
| 8,143,174 | B2 | 3/2012 | Xia et al. |
| 8,147,242 | B2 | 4/2012 | Shibagaki et al. |
| 8,152,922 | B2 | 4/2012 | Schmidt et al. |
| 8,158,512 | B2 | 4/2012 | Ji et al. |
| 8,172,947 | B2 | 5/2012 | Shibata et al. |
| 8,173,554 | B2 | 5/2012 | Lee et al. |
| 8,174,400 | B2 | 5/2012 | Park et al. |
| 8,178,436 | B2 | 5/2012 | King et al. |
| 8,187,679 | B2 | 5/2012 | Dickey et al. |
| 8,187,951 | B1 | 5/2012 | Wang |
| 8,192,901 | B2 | 6/2012 | Kageyama |
| 8,196,234 | B2 | 6/2012 | Glunk |
| 8,197,915 | B2 | 6/2012 | Oka et al. |
| 8,198,168 | B2 | 6/2012 | Tanioku |
| 8,202,575 | B2 | 6/2012 | Monsma et al. |
| 8,206,506 | B2 | 6/2012 | Kadkhodayan et al. |
| 8,216,380 | B2 | 7/2012 | White et al. |
| 8,227,032 | B2 | 7/2012 | Dussarrat et al. |
| 8,231,799 | B2 | 7/2012 | Bera et al. |
| D665,055 | S | 8/2012 | Yanagisawa et al. |
| 8,241,991 | B2 | 8/2012 | Hsieh et al. |
| 8,241,992 | B2 | 8/2012 | Clevenger et al. |
| 8,242,028 | B1 | 8/2012 | van Schravendijk |
| 8,242,031 | B2 | 8/2012 | Mallick et al. |
| 8,246,900 | B2 | 8/2012 | Kasai et al. |
| 8,252,114 | B2 | 8/2012 | Vukovic |
| 8,252,659 | B2 | 8/2012 | Huyghabaert et al. |
| 8,252,691 | B2 | 8/2012 | Beynet et al. |
| 8,253,204 | B2 | 8/2012 | Lee et al. |
| 8,267,633 | B2 | 9/2012 | Obikane |
| 8,272,516 | B2 | 9/2012 | Salvador |
| 8,278,176 | B2 | 10/2012 | Bauer et al. |
| 8,278,224 | B1 | 10/2012 | Mui et al. |
| 8,282,769 | B2 | 10/2012 | Iizuka |
| 8,282,847 | B2 | 10/2012 | Romano |
| 8,282,992 | B2 | 10/2012 | Myo et al. |
| 8,287,648 | B2 | 10/2012 | Reed et al. |
| 8,291,857 | B2 | 10/2012 | Lam et al. |
| 8,293,016 | B2 | 10/2012 | Bahng et al. |
| 8,293,642 | B2 | 10/2012 | Kim |
| 8,298,336 | B2 | 10/2012 | Wang et al. |
| 8,298,951 | B1 | 10/2012 | Nakano |
| 8,307,472 | B1 | 11/2012 | Saxon et al. |
| 8,309,173 | B2 | 11/2012 | Tuominen et al. |
| 8,318,327 | B2 | 11/2012 | O'Donnell |
| 8,318,584 | B2 | 11/2012 | Li et al. |
| 8,323,413 | B2 | 12/2012 | Son |
| 8,324,699 | B2 | 12/2012 | Ichijo et al. |
| 8,328,939 | B2 | 12/2012 | Choi et al. |
| 8,329,599 | B2 | 12/2012 | Fukazawa et al. |
| 8,333,839 | B2 | 12/2012 | Oh |
| 8,334,219 | B2 | 12/2012 | Lee et al. |
| 8,338,809 | B2 | 12/2012 | Yang et al. |
| 8,349,083 | B2 | 1/2013 | Takasuka et al. |
| D676,943 | S | 2/2013 | Kluss |
| 8,367,528 | B2 | 2/2013 | Bauer et al. |
| 8,372,204 | B2 | 2/2013 | Nakamura |
| 8,378,464 | B2 | 2/2013 | Kato et al. |
| 8,382,370 | B2 | 2/2013 | Aggarwal et al. |
| 8,382,939 | B2 | 2/2013 | Kutney et al. |
| 8,393,091 | B2 | 3/2013 | Kawamoto |
| 8,394,466 | B2 | 3/2013 | Hong et al. |
| 8,398,773 | B2 | 3/2013 | Jdira et al. |
| 8,402,918 | B2 | 3/2013 | Kadkhodayan et al. |
| 8,404,044 | B2 | 3/2013 | Arai |
| 8,404,499 | B2 | 3/2013 | Moffatt |
| 8,415,258 | B2 | 4/2013 | Akae |
| 8,415,259 | B2 | 4/2013 | Lee et al. |
| 8,415,587 | B2 | 4/2013 | Millman et al. |
| 8,419,959 | B2 | 4/2013 | Bettencourt et al. |
| 8,425,682 | B2 | 4/2013 | Wang et al. |
| 8,430,620 | B1 | 4/2013 | Blank et al. |
| 8,435,894 | B2 | 5/2013 | Chandrashekar et al. |
| 8,440,259 | B2 | 5/2013 | Chiang et al. |
| 8,443,484 | B2 | 5/2013 | Ozaki et al. |
| 8,444,120 | B2 | 5/2013 | Gregg et al. |
| 8,445,075 | B2 | 5/2013 | Xu et al. |
| 8,450,191 | B2 | 5/2013 | Wang |
| 8,454,749 | B2 | 6/2013 | Li |
| 8,465,811 | B2 | 6/2013 | Ueda |
| 8,465,903 | B2 | 6/2013 | Weidman et al. |
| 8,466,411 | B2 | 6/2013 | Arai |
| 8,470,187 | B2 | 6/2013 | Ha |
| 8,470,718 | B2 | 6/2013 | Lee |
| 8,484,846 | B2 | 7/2013 | Dhindsa |
| 8,492,170 | B2 | 7/2013 | Xie et al. |
| 8,496,377 | B2 | 7/2013 | Harr et al. |
| 8,496,756 | B2 | 7/2013 | Cruse et al. |
| 8,497,213 | B2 | 7/2013 | Yasui et al. |
| 8,501,599 | B2 | 8/2013 | Ueno et al. |
| 8,506,162 | B2 | 8/2013 | Schick et al. |
| 8,506,713 | B2 | 8/2013 | Takagi |
| 8,507,720 | B2 | 8/2013 | Shay |
| 8,524,612 | B2 | 9/2013 | Li et al. |
| 8,529,701 | B2 | 9/2013 | Morita |
| 8,535,767 | B1 | 9/2013 | Kimura |
| 8,536,068 | B2 | 9/2013 | Weidman et al. |
| D691,974 | S | 10/2013 | Osada et al. |
| 8,551,892 | B2 | 10/2013 | Nakano |
| 8,557,712 | B1 | 10/2013 | Antonelli et al. |
| 8,562,272 | B2 | 10/2013 | Lenz |
| 8,563,443 | B2 | 10/2013 | Fukazawa |
| 8,569,184 | B2 | 10/2013 | Oka |
| D693,200 | S | 11/2013 | Saunders |
| D693,782 | S | 11/2013 | Mori et al. |
| 8,573,152 | B2 | 11/2013 | de la Llera et al. |
| 8,573,154 | B2 | 11/2013 | Yorozuya |
| 8,586,484 | B2 | 11/2013 | Matsuyama et al. |
| 8,591,659 | B1 | 11/2013 | Fang et al. |
| 8,592,005 | B2 | 11/2013 | Ueda |
| D694,790 | S | 12/2013 | Matsumoto et al. |
| D695,240 | S | 12/2013 | Iida et al. |
| 8,608,885 | B2 | 12/2013 | Goto et al. |
| 8,614,047 | B2 | 12/2013 | Ayothi et al. |
| 8,616,765 | B2 | 12/2013 | Darabnia et al. |
| 8,617,411 | B2 | 12/2013 | Singh |
| D697,038 | S | 1/2014 | Matsumoto et al. |
| 8,623,770 | B1 | 1/2014 | Gao et al. |
| 8,633,115 | B2 | 1/2014 | Chang et al. |
| 8,637,384 | B2 | 1/2014 | Ando et al. |
| D698,904 | S | 2/2014 | Milligan et al. |
| 8,642,488 | B2 | 2/2014 | Liu et al. |
| 8,647,439 | B2 | 2/2014 | Sanchez et al. |
| 8,647,722 | B2 | 2/2014 | Kobayashi et al. |
| 8,647,993 | B1 | 2/2014 | Lavoie et al. |
| 8,651,788 | B1 | 2/2014 | Budde |
| 8,664,127 | B2 | 3/2014 | Bhatia et al. |
| 8,664,627 | B1 | 3/2014 | Ishikawa et al. |
| 8,667,654 | B2 | 3/2014 | Gros-Jean |
| 8,668,957 | B2 | 3/2014 | Dussarrat et al. |
| 8,669,185 | B2 | 3/2014 | Onizawa |
| 8,679,958 | B2 | 3/2014 | Takamure et al. |
| D702,188 | S | 4/2014 | Jacobs |
| 8,683,943 | B2 | 4/2014 | Onodera et al. |
| 8,697,198 | B2 | 4/2014 | Lee |

(56) References Cited

U.S. PATENT DOCUMENTS 8,703,002 B2 4/2014 Matsudo et al.
8,709,162 B2 4/2014 Leung et al.
8,710,580 B2 4/2014 Sakuma et al.
8,711,338 B2 4/2014 Liu et al.
D705,745 S 5/2014 Kurs et al.
D705,762 S 5/2014 Yu
8,720,965 B2 5/2014 Hino et al.
8,721,791 B2 5/2014 Choi et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,728,956 B2 5/2014 Lavoie et al.
8,741,062 B2 6/2014 Lindfors et al.
8,741,065 B2 6/2014 Odagiri et al.
8,742,668 B2 6/2014 Nakano et al.
8,758,512 B2 6/2014 Lee
8,759,223 B2 6/2014 Sapre et al.
D709,536 S 7/2014 Yoshimura et al.
D709,537 S 7/2014 Kuwabara et al.
8,764,085 B2 7/2014 Urabe
8,771,791 B2 7/2014 Lee et al.
8,771,807 B2 7/2014 Xiao et al.
8,779,502 B2 7/2014 Sakuma et al.
8,784,676 B2 7/2014 Guha et al.
8,784,950 B2 7/2014 Fukazawa et al.
8,784,951 B2 7/2014 Fukazawa et al.
8,785,215 B2 7/2014 Kobayashi et al.
8,785,311 B2 7/2014 Miyoshi
8,790,743 B1 7/2014 Omari
8,790,749 B2 7/2014 Omori et al.
8,802,201 B2 8/2014 Raisanen et al.
8,809,170 B2 8/2014 Bauer
D712,358 S 9/2014 Allen et al.
D712,359 S 9/2014 Allen et al.
8,820,809 B2 9/2014 Ando et al.
8,821,640 B2 9/2014 Cleary et al.
8,821,985 B2 9/2014 Shao et al.
8,823,672 B2 9/2014 Kim
8,828,886 B2 9/2014 Samukawa et al.
8,841,182 B1 9/2014 Chen et al.
8,845,806 B2 9/2014 Aida et al.
8,846,502 B2 9/2014 Haukka et al.
D715,410 S 10/2014 Lohmann
8,859,368 B2 10/2014 Deniz
8,860,955 B2 10/2014 Rodnick et al.
8,864,202 B1 10/2014 Schrameyer
8,864,375 B2 10/2014 Abe et al.
D716,742 S 11/2014 Jang et al.
8,876,974 B2 11/2014 Wan
8,877,300 B2 11/2014 Lee
8,877,655 B2 11/2014 Shero et al.
8,882,923 B2 11/2014 Saido et al.
8,883,270 B2 11/2014 Shero et al.
8,895,108 B2 11/2014 Lee
8,895,395 B1 11/2014 Kerber et al.
8,900,935 B2 12/2014 Guo et al.
8,900,999 B1 12/2014 Wu et al.
8,901,016 B2 12/2014 Jeongseok et al.
8,911,553 B2 12/2014 Baluja et al.
8,911,826 B2 12/2014 Adachi et al.
8,912,101 B2 12/2014 Tsuji et al.
D720,838 S 1/2015 Yamagishi et al.
8,927,906 B2 1/2015 Tadokoro et al.
8,932,802 B2 1/2015 Wu et al.
8,933,375 B2 1/2015 Dunn et al.
8,937,800 B2 1/2015 Lubomirsky et al.
8,940,646 B1 1/2015 Chandrasekharan
D723,153 S 2/2015 Borkholder
8,945,305 B2 2/2015 Marsh
8,945,306 B2 2/2015 Tsuda
8,945,339 B2 2/2015 Kakimoto
8,946,830 B2 2/2015 Jung et al.
8,956,971 B2 2/2015 Huakka
8,956,983 B2 2/2015 Swaminathan
D723,330 S 3/2015 York
D724,553 S 3/2015 Choi
D724,701 S 3/2015 Yamagishi et al.
D725,168 S 3/2015 Yamagishi
8,967,608 B2 3/2015 Mitsumori et al.
8,968,989 B2 3/2015 Ouattara et al.
8,969,934 B1 3/2015 Cheng et al.
8,974,868 B2 3/2015 Ishikawa et al.
8,980,006 B2 3/2015 Huh et al.
8,986,456 B2 3/2015 Fondurulia et al.
8,991,214 B2 3/2015 Hoshino et al.
8,991,887 B2 3/2015 Shin et al.
8,993,054 B2 3/2015 Jung et al.
8,993,072 B2 3/2015 Xiao et al.
8,993,457 B1 3/2015 Ramkumar et al.
D726,365 S 4/2015 Weigensberg
D726,884 S 4/2015 Yamagishi et al.
8,999,102 B2 4/2015 Miyoshi et al.
9,004,744 B1 4/2015 Kemp
9,005,539 B2 4/2015 Halpin et al.
9,017,481 B1 4/2015 Pettinger et al.
9,017,933 B2 4/2015 Liu et al.
9,018,093 B2 4/2015 Tsuji et al.
9,018,111 B2 4/2015 Milligan et al.
9,018,567 B2 4/2015 de Ridder et al.
9,021,985 B2 5/2015 Alokozai et al.
9,023,737 B2 5/2015 Beynet et al.
9,023,738 B2 5/2015 Kato et al.
9,029,244 B2 5/2015 Won et al.
9,029,253 B2 5/2015 Milligan et al.
9,029,272 B1 5/2015 Nakano
D732,145 S 6/2015 Yamagishi
D732,644 S 6/2015 Yamagishi et al.
D733,257 S 6/2015 Schoenherr et al.
D733,261 S 6/2015 Yamagishi et al.
D733,262 S 6/2015 Kang
9,057,388 B2 6/2015 Comeau et al.
9,064,815 B2 6/2015 Zhang et al.
D733,843 S 7/2015 Yamagishi
D734,377 S 7/2015 Hirakida
9,076,635 B2 7/2015 Gross et al.
9,076,726 B2 7/2015 Kauerauf et al.
D735,836 S 8/2015 Yamagishi et al.
D736,348 S 8/2015 Tan
9,095,869 B2 8/2015 Kilpi et al.
9,096,931 B2 8/2015 Yednak et al.
9,099,423 B2 8/2015 Weeks et al.
9,099,505 B2 8/2015 Kusakabe et al.
9,111,972 B2 8/2015 Takeshita et al.
9,117,657 B2 8/2015 Nakano et al.
9,117,866 B2 8/2015 Marquardt et al.
D739,222 S 9/2015 Chadbourne
9,123,510 B2 9/2015 Nakano et al.
9,123,577 B2 9/2015 Fujimoto et al.
9,127,358 B2 9/2015 Inoue et al.
9,127,362 B2 9/2015 Scheible et al.
9,129,897 B2 9/2015 Pore et al.
9,136,108 B2 9/2015 Matsushita et al.
9,136,180 B2 9/2015 Machkaoutsan
9,142,393 B2 9/2015 Okabe et al.
9,142,437 B2 9/2015 Fosnight et al.
9,142,764 B1 9/2015 Wang
9,153,441 B2 10/2015 Takamure et al.
9,163,310 B2 10/2015 Lee
9,166,012 B2 10/2015 Sim et al.
9,169,975 B2 10/2015 Sarin et al.
9,171,714 B2 10/2015 Mori
9,171,715 B2 10/2015 Matero
9,171,716 B2 10/2015 Fukuda
D742,202 S 11/2015 Cyphers et al.
D743,357 S 11/2015 Vyne
D743,513 S 11/2015 Yamagishi
9,174,178 B2 11/2015 Berger et al.
9,175,394 B2 11/2015 Yudovsky et al.
9,177,784 B2 11/2015 Raisanen et al.
9,184,047 B2 11/2015 Liu et al.
9,184,054 B1 11/2015 Huang et al.
9,190,263 B2 11/2015 Ishikawa et al.
9,190,264 B2 11/2015 Yuasa et al.

(56) References Cited

U.S. PATENT DOCUMENTS

| | | | |
|---|---|---|---|
| 9,196,483 | B1 | 11/2015 | Lee et al. |
| D745,641 | S | 12/2015 | Blum |
| 9,202,727 | B2 | 12/2015 | Dunn et al. |
| 9,214,333 | B1 | 12/2015 | Sims et al. |
| 9,214,340 | B2 | 12/2015 | Kurita et al. |
| 9,219,006 | B2 | 12/2015 | Chatterjee |
| 9,223,203 | B2 | 12/2015 | Farm et al. |
| 9,228,259 | B2 | 1/2016 | Haukka et al. |
| 9,240,412 | B2 | 1/2016 | Xie et al. |
| 9,245,742 | B2 | 1/2016 | Haukka |
| 9,252,024 | B2 | 2/2016 | Lam et al. |
| 9,252,238 | B1 | 2/2016 | Trevino et al. |
| 9,257,274 | B2 | 2/2016 | Kang et al. |
| 9,263,298 | B2 | 2/2016 | Matsumoto et al. |
| 9,267,204 | B2 | 2/2016 | Honma |
| 9,267,850 | B2 | 2/2016 | Aggarwal |
| D751,176 | S | 3/2016 | Schoenherr et al. |
| 9,275,834 | B1 | 3/2016 | Park et al. |
| 9,281,223 | B2 | 3/2016 | Hara |
| 9,281,277 | B2 | 3/2016 | Baek et al. |
| 9,284,642 | B2 | 3/2016 | Nakano |
| 9,287,273 | B2 | 3/2016 | Ragnarsson et al. |
| 9,297,705 | B2 | 3/2016 | Aggarwal |
| 9,299,557 | B2 | 3/2016 | Tolle et al. |
| 9,299,595 | B2 | 3/2016 | Dunn et al. |
| D753,269 | S | 4/2016 | Yamagishi et al. |
| D753,629 | S | 4/2016 | Plattard |
| 9,305,836 | B1 | 4/2016 | Gates et al. |
| 9,309,598 | B2 | 4/2016 | Wang et al. |
| 9,309,978 | B2 | 4/2016 | Hatch et al. |
| 9,310,684 | B2 | 4/2016 | Meyers et al. |
| 9,312,155 | B2 | 4/2016 | Mori |
| 9,315,897 | B2 | 4/2016 | Byun |
| 9,324,811 | B2 | 4/2016 | Weeks |
| 9,324,846 | B1 | 4/2016 | Camillo |
| D756,929 | S | 5/2016 | Harck et al. |
| 9,331,200 | B1 | 5/2016 | Wang et al. |
| 9,337,031 | B2 | 5/2016 | Kim et al. |
| 9,337,054 | B2 | 5/2016 | Hunks et al. |
| 9,337,057 | B2 | 5/2016 | Park et al. |
| 9,341,296 | B2 | 5/2016 | Yednak |
| 9,343,297 | B1 | 5/2016 | Fukazawa et al. |
| 9,343,308 | B2 | 5/2016 | Isii |
| 9,343,343 | B2 | 5/2016 | Mori |
| 9,343,350 | B2 | 5/2016 | Arai |
| 9,349,620 | B2 | 5/2016 | Kamata et al. |
| 9,353,440 | B2 | 5/2016 | Ge et al. |
| 9,353,441 | B2 | 5/2016 | Chung |
| 9,355,876 | B2 | 5/2016 | Reuter et al. |
| 9,355,882 | B2 | 5/2016 | Wu et al. |
| D759,137 | S | 6/2016 | Hassan |
| D759,193 | S | 6/2016 | Gutierrez et al. |
| 9,362,107 | B2 | 6/2016 | Thadani et al. |
| 9,362,137 | B2 | 6/2016 | Kang et al. |
| 9,362,180 | B2 | 6/2016 | Lee et al. |
| 9,365,924 | B2 | 6/2016 | Nonaka |
| 9,368,352 | B2 | 6/2016 | Takamure et al. |
| 9,370,863 | B2 | 6/2016 | Tsuji et al. |
| 9,378,969 | B2 | 6/2016 | Hsu et al. |
| D761,325 | S | 7/2016 | Abed |
| 9,384,987 | B2 | 7/2016 | Jung et al. |
| 9,390,909 | B2 | 7/2016 | Pasquale et al. |
| 9,394,608 | B2 | 7/2016 | Shero et al. |
| 9,396,934 | B2 | 7/2016 | Tolle |
| 9,396,956 | B1 | 7/2016 | Fukazawa |
| 9,399,228 | B2 | 7/2016 | Breiling et al. |
| D764,196 | S | 8/2016 | Handler et al. |
| 9,404,587 | B2 | 8/2016 | Shugrue |
| 9,412,564 | B2 | 8/2016 | Milligan |
| 9,412,581 | B2 | 8/2016 | Thadani et al. |
| 9,412,582 | B2 | 8/2016 | Sasaki et al. |
| 9,418,885 | B2 | 8/2016 | Sung et al. |
| 9,425,078 | B2 | 8/2016 | Tang et al. |
| 9,428,833 | B1 | 8/2016 | Duvall et al. |
| 9,443,725 | B2 | 9/2016 | Liu et al. |
| 9,447,498 | B2 | 9/2016 | Shiba et al. |
| 9,449,793 | B2 | 9/2016 | Shaji et al. |
| 9,449,795 | B2 | 9/2016 | Sabri et al. |
| 9,449,843 | B1 | 9/2016 | Korolik et al. |
| 9,449,987 | B1 | 9/2016 | Miyata et al. |
| 9,455,138 | B1 | 9/2016 | Fukazawa |
| 9,455,177 | B1 | 9/2016 | Park et al. |
| 9,460,954 | B2 | 10/2016 | De Jong et al. |
| 9,464,352 | B2 | 10/2016 | Nakano et al. |
| 9,472,410 | B2 | 10/2016 | Sadjadi et al. |
| 9,472,432 | B1 | 10/2016 | Blank |
| 9,474,163 | B2 | 10/2016 | Tolle et al. |
| 9,478,414 | B2 | 10/2016 | Kobayashi et al. |
| 9,478,415 | B2 | 10/2016 | Kimura |
| D770,993 | S | 11/2016 | Yoshida et al. |
| 9,484,191 | B2 | 11/2016 | Winkler |
| 9,496,225 | B1 | 11/2016 | Adusumilli et al. |
| 9,514,927 | B2 | 12/2016 | Tolle et al. |
| 9,514,932 | B2 | 12/2016 | Mallick et al. |
| 9,520,289 | B2 | 12/2016 | Park et al. |
| 9,523,148 | B1 | 12/2016 | Pore et al. |
| D777,546 | S | 1/2017 | Ishii et al. |
| 9,543,180 | B2 | 1/2017 | Kamiya |
| 9,556,516 | B2 | 1/2017 | Takamure |
| 9,558,931 | B2 | 1/2017 | Tang |
| 9,564,312 | B2 | 2/2017 | Henri et al. |
| 9,564,314 | B2 | 2/2017 | Takamure et al. |
| 9,570,302 | B1 | 2/2017 | Chang et al. |
| 9,574,268 | B1 | 2/2017 | Dunn et al. |
| 9,576,952 | B2 | 2/2017 | Joshi et al. |
| 9,583,333 | B2 | 2/2017 | Chatterjee |
| 9,583,345 | B2 | 2/2017 | Chen et al. |
| D782,419 | S | 3/2017 | Willette |
| 9,589,770 | B2 | 3/2017 | Winkler |
| 9,605,342 | B2 | 3/2017 | Alokozai et al. |
| 9,605,343 | B2 | 3/2017 | Winkler |
| 9,605,736 | B1 | 3/2017 | Foshage et al. |
| 9,607,837 | B1 | 3/2017 | Namba |
| D783,351 | S | 4/2017 | Fujino et al. |
| D784,276 | S | 4/2017 | Tiner et al. |
| 9,613,801 | B2 | 4/2017 | Carcasi et al. |
| 9,618,846 | B2 | 4/2017 | Shamma et al. |
| 9,627,221 | B1 | 4/2017 | Zaitsu et al. |
| D785,766 | S | 5/2017 | Sato |
| D787,458 | S | 5/2017 | Kim et al. |
| 9,640,416 | B2 | 5/2017 | Arai |
| 9,640,448 | B2 | 5/2017 | Ikegawa et al. |
| 9,640,542 | B2 | 5/2017 | Lee et al. |
| 9,644,266 | B2 | 5/2017 | Nasu et al. |
| 9,647,114 | B2 | 5/2017 | Margetis |
| 9,653,267 | B2 | 5/2017 | Carducci et al. |
| 9,657,845 | B2 | 5/2017 | Shugrue |
| 9,659,799 | B2 | 5/2017 | Lawson |
| 9,663,857 | B2 | 5/2017 | Nakano et al. |
| 9,666,528 | B1 | 5/2017 | Bergendahl et al. |
| D789,888 | S | 6/2017 | Jang et al. |
| D790,041 | S | 6/2017 | Jang et al. |
| 9,680,268 | B1 | 6/2017 | Finona |
| 9,684,234 | B2 | 6/2017 | Darling et al. |
| 9,685,320 | B2 | 6/2017 | Kang et al. |
| 9,691,668 | B2 | 6/2017 | Chang et al. |
| 9,691,771 | B2 | 6/2017 | Lansalot-Matras |
| 9,698,031 | B2 | 7/2017 | Kobayashi et al. |
| 9,708,707 | B2 | 7/2017 | Ditizio et al. |
| 9,708,708 | B2 | 7/2017 | Isobe et al. |
| 9,711,345 | B2 | 7/2017 | Shiba et al. |
| D793,352 | S | 8/2017 | Hill |
| D793,526 | S | 8/2017 | Behdjat |
| D793,572 | S | 8/2017 | Kozuka et al. |
| D793,976 | S | 8/2017 | Fukushima et al. |
| D794,753 | S | 8/2017 | Miller |
| D795,208 | S | 8/2017 | Sasaki et al. |
| 9,735,024 | B2 | 8/2017 | Zaitsu |
| 9,741,546 | B2 | 8/2017 | Carducci et al. |
| 9,741,559 | B2 | 8/2017 | Shimura et al. |
| 9,745,658 | B2 | 8/2017 | Kang et al. |
| 9,748,104 | B2 | 8/2017 | Sasaki et al. |
| 9,748,145 | B1 | 8/2017 | Kannan et al. |
| D796,458 | S | 9/2017 | Jang et al. |

(56) References Cited

U.S. PATENT DOCUMENTS

| | | | |
|---|---|---|---|
| D796,670 | S | 9/2017 | Dolk et al. |
| D797,067 | S | 9/2017 | Zhang et al. |
| D798,248 | S | 9/2017 | Hanson et al. |
| 9,754,779 | B1 | 9/2017 | Ishikawa |
| 9,754,818 | B2 | 9/2017 | Shiu et al. |
| 9,759,489 | B2 | 9/2017 | Kaneko |
| 9,765,432 | B2 | 9/2017 | Ge et al. |
| 9,773,818 | B2 | 9/2017 | Kimura |
| D800,782 | S | 10/2017 | Bever et al. |
| 9,778,561 | B2 | 10/2017 | Marks et al. |
| 9,780,225 | B2 | 10/2017 | Venkatasubramanian et al. |
| 9,786,491 | B2 | 10/2017 | Suzuki et al. |
| 9,786,570 | B2 | 10/2017 | Kang et al. |
| 9,790,595 | B2 | 10/2017 | Jung et al. |
| 9,793,115 | B2 | 10/2017 | Tolle |
| 9,793,135 | B1 | 10/2017 | Zaitsu et al. |
| 9,793,148 | B2 | 10/2017 | Yamagishi et al. |
| 9,798,308 | B2 | 10/2017 | Mimura |
| 9,799,736 | B1 | 10/2017 | Ebrish et al. |
| 9,803,926 | B2 | 10/2017 | Kikuchi et al. |
| D801,942 | S | 11/2017 | Riker et al. |
| D802,472 | S | 11/2017 | Sasaki et al. |
| D802,546 | S | 11/2017 | Jang et al. |
| D803,802 | S | 11/2017 | Sasaki et al. |
| 9,808,246 | B2 | 11/2017 | Shelton et al. |
| 9,812,319 | B1 | 11/2017 | Fukazawa et al. |
| 9,812,320 | B1 | 11/2017 | Pore et al. |
| 9,812,372 | B2 | 11/2017 | Choi et al. |
| 9,820,289 | B1 | 11/2017 | Pawar et al. |
| 9,824,881 | B2 | 11/2017 | Niskanen et al. |
| 9,824,884 | B1 | 11/2017 | Sims et al. |
| 9,824,893 | B1 | 11/2017 | Smith et al. |
| 9,837,355 | B2 | 12/2017 | Briggs et al. |
| 9,842,835 | B1 | 12/2017 | Cheng et al. |
| 9,847,221 | B1 | 12/2017 | McLaughlin et al. |
| 9,847,247 | B2 | 12/2017 | Huang et al. |
| 9,850,573 | B1 | 12/2017 | Sun |
| D807,494 | S | 1/2018 | Kim et al. |
| D808,254 | S | 1/2018 | Deleu |
| 9,859,151 | B1 | 1/2018 | Zhu |
| 9,865,455 | B1 | 1/2018 | Sims et al. |
| 9,865,456 | B1 | 1/2018 | Pandey et al. |
| 9,865,815 | B2 | 1/2018 | Hausmann |
| 9,868,131 | B2 | 1/2018 | Kilpi et al. |
| 9,870,964 | B1 | 1/2018 | Yoshino et al. |
| 9,875,891 | B2 | 1/2018 | Henri et al. |
| 9,875,893 | B2 | 1/2018 | Takamure et al. |
| 9,881,788 | B2 | 1/2018 | Kim et al. |
| D810,705 | S | 2/2018 | Krishnan et al. |
| 9,887,082 | B1 | 2/2018 | Pore et al. |
| 9,890,456 | B2 | 2/2018 | Tolle et al. |
| 9,891,521 | B2 | 2/2018 | Kang et al. |
| 9,892,908 | B2 | 2/2018 | Pettinger et al. |
| 9,892,913 | B2 | 2/2018 | Margetis et al. |
| 9,895,715 | B2 | 2/2018 | Haukka et al. |
| 9,899,291 | B2 | 2/2018 | Kato |
| 9,899,405 | B2 | 2/2018 | Kim |
| 9,905,420 | B2 | 2/2018 | Margetis et al. |
| 9,905,492 | B2 | 2/2018 | Tang et al. |
| 9,909,214 | B2 | 3/2018 | Suemori |
| 9,909,492 | B2 | 3/2018 | Jeswine |
| 9,911,595 | B1 | 3/2018 | Smith et al. |
| 9,911,676 | B2 | 3/2018 | Tang |
| 9,916,980 | B1 | 3/2018 | Knaepen |
| 9,920,451 | B2 | 3/2018 | Sivaramakrishnan et al. |
| 9,922,824 | B2 | 3/2018 | Okada |
| 9,929,005 | B1 | 3/2018 | Shimamoto et al. |
| 9,929,011 | B2 | 3/2018 | Hawryluk et al. |
| 9,929,055 | B2 | 3/2018 | Dube et al. |
| 9,951,421 | B2 | 4/2018 | Lind |
| 9,960,033 | B1 | 5/2018 | Nozawa |
| 9,960,072 | B2 | 5/2018 | Coomer |
| 9,966,299 | B2 | 5/2018 | Tang et al. |
| 9,970,112 | B2 | 5/2018 | Koshi et al. |
| 9,984,869 | B1 | 5/2018 | Blanquart |
| D819,580 | S | 6/2018 | Krishnan et al. |
| 9,987,747 | B2 | 6/2018 | Hwang et al. |
| 9,991,138 | B2 | 6/2018 | Lin et al. |
| 9,996,004 | B2 | 6/2018 | Smith et al. |
| 9,997,357 | B2 | 6/2018 | Arghavani et al. |
| 9,997,373 | B2 | 6/2018 | Hudson |
| 10,014,212 | B2 | 7/2018 | Chen et al. |
| 10,017,856 | B1 | 7/2018 | Arnepalli et al. |
| 10,018,920 | B2 | 7/2018 | Chang et al. |
| 10,023,960 | B2 | 7/2018 | Alokozai |
| 10,032,628 | B2 | 7/2018 | Xie et al. |
| 10,032,792 | B2 | 7/2018 | Kim et al. |
| D825,505 | S | 8/2018 | Hanson et al. |
| D825,614 | S | 8/2018 | Bever et al. |
| 10,043,661 | B2 | 8/2018 | Kato et al. |
| 10,047,435 | B2 | 8/2018 | Haukka et al. |
| 10,053,774 | B2 | 8/2018 | Tolle et al. |
| 10,060,473 | B2 | 8/2018 | Davey et al. |
| D827,592 | S | 9/2018 | Ichino et al. |
| D829,306 | S | 9/2018 | Ikedo et al. |
| 10,083,836 | B2 | 9/2018 | Milligan |
| D830,981 | S | 10/2018 | Jeong et al. |
| 10,087,522 | B2 | 10/2018 | Raisanen et al. |
| 10,087,525 | B2 | 10/2018 | Schmotzer et al. |
| 10,090,316 | B2 | 10/2018 | Ootsuka |
| 10,103,040 | B1 | 10/2018 | Oosterlaken et al. |
| 10,106,892 | B1 | 10/2018 | Siddiqui et al. |
| RE47,145 | E | 11/2018 | Hashimoto |
| D834,686 | S | 11/2018 | Yamada et al. |
| 10,121,671 | B2 | 11/2018 | Fu et al. |
| 10,134,617 | B2 | 11/2018 | Gurary et al. |
| 10,134,757 | B2 | 11/2018 | Chun et al. |
| RE47,170 | E | 12/2018 | Beynet et al. |
| 10,147,600 | B2 | 12/2018 | Takamure et al. |
| 10,167,557 | B2 | 1/2019 | Hawkins et al. |
| 10,177,024 | B2 | 1/2019 | Gomm et al. |
| 10,177,025 | B2 | 1/2019 | Pore |
| 10,179,947 | B2 | 1/2019 | Fukazawa |
| 10,186,420 | B2 | 1/2019 | Fukazawa |
| 10,190,213 | B2 | 1/2019 | Zhu et al. |
| 10,190,214 | B2 | 1/2019 | Shon et al. |
| 10,190,701 | B2 | 1/2019 | Raj et al. |
| 10,192,734 | B2 | 1/2019 | Sanchez et al. |
| 10,193,429 | B2 | 1/2019 | Smith et al. |
| D840,364 | S | 2/2019 | Ichino et al. |
| 10,204,788 | B1 | 2/2019 | Ye et al. |
| 10,211,308 | B2 | 2/2019 | Zhu et al. |
| 10,229,833 | B2 | 3/2019 | Raisanen et al. |
| 10,229,851 | B2 | 3/2019 | Briggs et al. |
| 10,229,985 | B1 | 3/2019 | Li et al. |
| 10,236,177 | B1 | 3/2019 | Kohen et al. |
| D846,008 | S | 4/2019 | Geldenhuys et al. |
| 10,249,524 | B2 | 4/2019 | den Hartog Besselink et al. |
| 10,249,577 | B2 | 4/2019 | Lee et al. |
| 10,262,837 | B2 * | 4/2019 | Choi ..................... C23C 16/345 |
| 10,262,859 | B2 | 4/2019 | Margetis et al. |
| 10,269,558 | B2 | 4/2019 | Blanquart et al. |
| 10,276,355 | B2 | 4/2019 | White et al. |
| D849,055 | S | 5/2019 | Kneip |
| D849,662 | S | 5/2019 | Rike |
| 10,283,353 | B2 | 5/2019 | Kobayashi et al. |
| 10,287,684 | B2 | 5/2019 | Yanai et al. |
| 10,290,508 | B1 | 5/2019 | Kubota et al. |
| 10,297,440 | B2 | 5/2019 | Yamazaki et al. |
| RE47,440 | E * | 6/2019 | Yudovsky ......... C23C 16/45565 |
| 10,312,055 | B2 | 6/2019 | Suzuki |
| 10,312,058 | B2 * | 6/2019 | Choi ................. H01J 37/32091 |
| 10,312,129 | B2 | 6/2019 | Coomer |
| 10,319,588 | B2 | 6/2019 | Mattinen et al. |
| 10,322,384 | B2 | 6/2019 | Stumpf et al. |
| 10,332,747 | B1 | 6/2019 | Watanabe et al. |
| 10,332,963 | B1 | 6/2019 | Xie |
| D855,089 | S | 7/2019 | Hopkins |
| 10,340,125 | B2 | 7/2019 | Winkler |
| 10,340,135 | B2 | 7/2019 | Blanquart |
| 10,343,920 | B2 | 7/2019 | Haukka |
| 10,347,547 | B2 | 7/2019 | Varadarajan et al. |
| 10,354,873 | B2 | 7/2019 | Ko et al. |
| 10,361,201 | B2 | 7/2019 | Xie et al. |

(56) References Cited

U.S. PATENT DOCUMENTS 10,361,366 B2 7/2019 Hakamata et al.
10,367,080 B2 7/2019 Tang et al.
10,388,513 B1 8/2019 Blanquart
10,395,917 B2 8/2019 Niskanen et al.
10,395,919 B2 8/2019 Masaru et al.
10,395,963 B2 8/2019 Cooke
D859,136 S 9/2019 Tenander et al.
10,400,335 B2 9/2019 Ge et al.
10,410,943 B2 9/2019 Jiang et al.
10,424,476 B2 9/2019 Suzuki et al.
10,424,477 B2 9/2019 Niskanen et al.
D864,134 S 10/2019 Watarai et al.
10,428,419 B2 10/2019 Huotari et al.
10,435,790 B2 10/2019 Fukazawa et al.
D867,867 S 11/2019 Tenander et al.
10,468,244 B2 11/2019 Li et al.
10,468,251 B2 11/2019 Ishikawa et al.
10,483,154 B1 11/2019 Smith et al.
10,510,529 B2 12/2019 Suzuki et al.
10,510,871 B1 12/2019 More et al.
10,529,554 B2 1/2020 Ishikawa et al.
D876,504 S 2/2020 Lee et al.
10,590,531 B1 3/2020 Shirako et al.
10,590,535 B2 3/2020 Huggare
10,600,637 B2 3/2020 Suzuki et al.
D880,437 S 4/2020 Lee et al.
D881,338 S 4/2020 Chen
10,622,196 B2 4/2020 Nagayama et al.
10,622,236 B2 4/2020 Kuo et al.
10,648,788 B2 5/2020 Boyd et al.
10,662,525 B2 5/2020 Jang et al.
10,704,143 B1 7/2020 Hisamitsu et al.
10,714,335 B2 7/2020 Kim et al.
10,731,249 B2 8/2020 Hatanpää et al.
10,734,497 B2 8/2020 Zhu et al.
10,741,386 B2 8/2020 Chen et al.
10,763,139 B2 9/2020 Shindo
10,770,336 B2 9/2020 Hill et al.
D900,036 S 10/2020 Wuester et al.
D903,477 S 12/2020 Goratela et al.
10,858,737 B2 * 12/2020 White .............. C23C 16/45565
D913,980 S 3/2021 Lee et al.
D914,620 S 3/2021 Rokkam et al.
10,950,477 B2 3/2021 Lin et al.
11,018,003 B2 5/2021 Huang et al.
D922,229 S 6/2021 Jun et al.
11,024,486 B2 * 6/2021 Lubomirsky ..... H01L 21/32136
11,053,584 B2 7/2021 Hsieh et al.
2001/0000141 A1 4/2001 Zhou et al.
2001/0001953 A1 5/2001 Griffiths et al.
2001/0002581 A1 6/2001 Nishikawa et al.
2001/0003015 A1 6/2001 Chang et al.
2001/0003191 A1 6/2001 Kovacs et al.
2001/0003271 A1 6/2001 Otsuki
2001/0004880 A1 6/2001 Cho et al.
2001/0006070 A1 7/2001 Shang
2001/0007244 A1 7/2001 Matsuse
2001/0007246 A1 7/2001 Ueda et al.
2001/0007645 A1 7/2001 Honma
2001/0014267 A1 8/2001 Yamaga et al.
2001/0014514 A1 8/2001 Geusic
2001/0015343 A1 8/2001 Sprey et al.
2001/0016273 A1 8/2001 Narasimhan et al.
2001/0017103 A1 8/2001 Takeshita et al.
2001/0018267 A1 8/2001 Shinriki et al.
2001/0019347 A1 9/2001 Hauck
2001/0019777 A1 9/2001 Tanaka et al.
2001/0019900 A1 9/2001 Hasegawa
2001/0020715 A1 9/2001 Yamasaki
2001/0021591 A1 9/2001 Srinivasan et al.
2001/0022215 A1 9/2001 Donohoe
2001/0024387 A1 9/2001 Raaijmakers et al.
2001/0027026 A1 10/2001 Dhindsa et al.
2001/0027585 A1 10/2001 Lee
2001/0028924 A1 10/2001 Sherman
2001/0031535 A1 10/2001 Agnello et al.
2001/0031541 A1 10/2001 Madan et al.
2001/0034097 A1 10/2001 Lim et al.
2001/0038783 A1 11/2001 Nakashima et al.
2001/0039922 A1 11/2001 Nakahara
2001/0039966 A1 11/2001 Walpole et al.
2001/0040511 A1 11/2001 Bushner et al.
2001/0041250 A1 11/2001 Werkhoven et al.
2001/0042511 A1 11/2001 Liu et al.
2001/0042514 A1 11/2001 Mizuno et al.
2001/0042594 A1 11/2001 Shamouilian et al.
2001/0046765 A1 11/2001 Cappellani et al.
2001/0047761 A1 12/2001 Wijck et al.
2001/0048981 A1 12/2001 Suzuki
2001/0049080 A1 12/2001 Asano
2001/0049202 A1 12/2001 Maeda et al.
2001/0052556 A1 12/2001 Ting et al.
2001/0054381 A1 12/2001 Umotoy et al.
2001/0054388 A1 12/2001 Qian
2002/0000195 A1 1/2002 Bang et al.
2002/0000202 A1 1/2002 Yuda et al.
2002/0001971 A1 1/2002 Cho
2002/0001974 A1 1/2002 Chan
2002/0001976 A1 1/2002 Danek
2002/0005400 A1 1/2002 Gat et al.
2002/0005943 A1 1/2002 Voinalovich
2002/0008270 A1 1/2002 Marsh
2002/0009119 A1 1/2002 Matthew et al.
2002/0009560 A1 1/2002 Ozono
2002/0009861 A1 1/2002 Narwankar et al.
2002/0011210 A1 1/2002 Satoh et al.
2002/0011211 A1 1/2002 Halpin
2002/0011310 A1 1/2002 Kamarehi et al.
2002/0013792 A1 1/2002 Imielinski et al.
2002/0014204 A1 2/2002 Pyo
2002/0014483 A1 2/2002 Suzuki et al.
2002/0015853 A1 2/2002 Wataya et al.
2002/0016829 A1 2/2002 Defosse
2002/0020429 A1 2/2002 Selbrede et al.
2002/0022347 A1 2/2002 Park et al.
2002/0023677 A1 2/2002 Zheng
2002/0025688 A1 2/2002 Kato
2002/0027945 A1 3/2002 Hirano et al.
2002/0030047 A1 3/2002 Shao et al.
2002/0031644 A1 3/2002 Malofsky et al.
2002/0033183 A1 3/2002 Sun et al.
2002/0036065 A1 3/2002 Yamagishi et al.
2002/0041931 A1 4/2002 Suntola et al.
2002/0043337 A1 4/2002 Goodman et al.
2002/0045336 A1 4/2002 Locati et al.
2002/0047705 A1 4/2002 Tada et al.
2002/0048634 A1 4/2002 Basceri
2002/0050648 A1 5/2002 Kishida et al.
2002/0052119 A1 5/2002 Cleemput
2002/0061716 A1 5/2002 Korovin et al.
2002/0062633 A1 5/2002 Denker et al.
2002/0064592 A1 5/2002 Datta et al.
2002/0064598 A1 5/2002 Wang et al.
2002/0066532 A1 6/2002 Shih et al.
2002/0068458 A1 6/2002 Chiang et al.
2002/0069222 A1 6/2002 McNeely
2002/0073922 A1 6/2002 Frankel et al.
2002/0073923 A1 6/2002 Saito et al.
2002/0076490 A1 6/2002 Chiang et al.
2002/0076507 A1 6/2002 Chiang et al.
2002/0076944 A1 6/2002 Wang et al.
2002/0078893 A1 6/2002 Van Os et al.
2002/0079056 A1 6/2002 Kudo et al.
2002/0079714 A1 6/2002 Soucy et al.
2002/0081826 A1 6/2002 Rotondaro et al.
2002/0086501 A1 7/2002 O'Donnell et al.
2002/0088542 A1 7/2002 Nishikawa et al.
2002/0090735 A1 7/2002 Kishkovich et al.
2002/0094378 A1 7/2002 O'Donnell et al.
2002/0094388 A1 7/2002 Fonash et al.
2002/0096211 A1 7/2002 Zheng
2002/0098627 A1 7/2002 Pomarede et al.
2002/0099470 A1 7/2002 Zinger et al.
2002/0100418 A1 8/2002 Sandhu et al.

(56) References Cited

U.S. PATENT DOCUMENTS

| | | | |
|---|---|---|---|
| 2002/0104481 | A1 | 8/2002 | Chiang et al. |
| 2002/0104751 | A1 | 8/2002 | Drewery et al. |
| 2002/0106909 | A1 | 8/2002 | Kato et al. |
| 2002/0108570 | A1 | 8/2002 | Lindfors |
| 2002/0108670 | A1 | 8/2002 | Baker et al. |
| 2002/0108714 | A1 | 8/2002 | Doering et al. |
| 2002/0109115 | A1 | 8/2002 | Cederstav et al. |
| 2002/0110695 | A1 | 8/2002 | Yang et al. |
| 2002/0110991 | A1 | 8/2002 | Li |
| 2002/0112114 | A1 | 8/2002 | Blair et al. |
| 2002/0114886 | A1 | 8/2002 | Chou et al. |
| 2002/0115252 | A1 | 8/2002 | Haukka et al. |
| 2002/0117113 | A1 | 8/2002 | Tsuruno et al. |
| 2002/0117262 | A1 | 8/2002 | Pang et al. |
| 2002/0122885 | A1 | 9/2002 | Ahn |
| 2002/0123200 | A1 | 9/2002 | Yamamoto et al. |
| 2002/0123230 | A1 | 9/2002 | Hubacek |
| 2002/0123237 | A1 | 9/2002 | Nguyen et al. |
| 2002/0124883 | A1 | 9/2002 | Zheng |
| 2002/0124906 | A1 | 9/2002 | Suzuki et al. |
| 2002/0127350 | A1 | 9/2002 | Ishikawa et al. |
| 2002/0127956 | A1 | 9/2002 | Ashjaee et al. |
| 2002/0129768 | A1 | 9/2002 | Carpenter et al. |
| 2002/0132408 | A1 | 9/2002 | Ma et al. |
| 2002/0134511 | A1 | 9/2002 | Ushioda et al. |
| 2002/0136214 | A1 | 9/2002 | Do et al. |
| 2002/0136909 | A1 | 9/2002 | Yang |
| 2002/0139775 | A1 | 10/2002 | Chang |
| 2002/0146512 | A1 | 10/2002 | Rossman |
| 2002/0151327 | A1 | 10/2002 | Levitt |
| 2002/0152244 | A1 | 10/2002 | Dean et al. |
| 2002/0155219 | A1 | 10/2002 | Wang et al. |
| 2002/0155708 | A1 | 10/2002 | Lo |
| 2002/0157611 | A1 | 10/2002 | Bondestam et al. |
| 2002/0160112 | A1 | 10/2002 | Sakai et al. |
| 2002/0164420 | A1 | 11/2002 | Derderian et al. |
| 2002/0164423 | A1 | 11/2002 | Chiang et al. |
| 2002/0168870 | A1 | 11/2002 | Matsuki |
| 2002/0170676 | A1 | 11/2002 | Mitrovic et al. |
| 2002/0172768 | A1 | 11/2002 | Endo et al. |
| 2002/0174106 | A1 | 11/2002 | Martin |
| 2002/0179011 | A1 | 12/2002 | Jonnalagadda et al. |
| 2002/0181612 | A1 | 12/2002 | Warble et al. |
| 2002/0184111 | A1 | 12/2002 | Swanson |
| 2002/0187650 | A1 | 12/2002 | Blalock et al. |
| 2002/0187656 | A1 | 12/2002 | Tan et al. |
| 2002/0188376 | A1 | 12/2002 | Derderian et al. |
| 2002/0192370 | A1 | 12/2002 | Metzner et al. |
| 2002/0197402 | A1 | 12/2002 | Chiang et al. |
| 2002/0197849 | A1 | 12/2002 | Mandal |
| 2003/0000647 | A1 | 1/2003 | Yudovsky et al. |
| 2003/0002562 | A1 | 1/2003 | Yerlikaya et al. |
| 2003/0003607 | A1 | 1/2003 | Kagoshima |
| 2003/0003635 | A1 | 1/2003 | Paranjpe et al. |
| 2003/0003696 | A1 | 1/2003 | Gelatos et al. |
| 2003/0003719 | A1 | 1/2003 | Lim et al. |
| 2003/0008528 | A1 | 1/2003 | Xia et al. |
| 2003/0008602 | A1 | 1/2003 | Ashjaee et al. |
| 2003/0010355 | A1 | 1/2003 | Nowak et al. |
| 2003/0010451 | A1 | 1/2003 | Tzu |
| 2003/0010452 | A1 | 1/2003 | Park et al. |
| 2003/0012632 | A1 | 1/2003 | Saeki |
| 2003/0013314 | A1 | 1/2003 | Ying et al. |
| 2003/0015141 | A1 | 1/2003 | Takagi |
| 2003/0015294 | A1 | 1/2003 | Wang |
| 2003/0015596 | A1 | 1/2003 | Evans |
| 2003/0017265 | A1 | 1/2003 | Basceri et al. |
| 2003/0017266 | A1 | 1/2003 | Basceri et al. |
| 2003/0017268 | A1 | 1/2003 | Hu |
| 2003/0019428 | A1 | 1/2003 | Ku et al. |
| 2003/0019580 | A1 | 1/2003 | Strang |
| 2003/0022468 | A1 | 1/2003 | Shioya et al. |
| 2003/0022523 | A1 | 1/2003 | Irino et al. |
| 2003/0023338 | A1 | 1/2003 | Chin et al. |
| 2003/0024901 | A1 | 2/2003 | Ishikawa |
| 2003/0025146 | A1 | 2/2003 | Narwankar et al. |
| 2003/0026904 | A1 | 2/2003 | Yadav et al. |
| 2003/0027431 | A1 | 2/2003 | Sneh et al. |
| 2003/0029303 | A1 | 2/2003 | Hasegawa et al. |
| 2003/0029381 | A1 | 2/2003 | Nishibayashi |
| 2003/0029475 | A1 | 2/2003 | Hua et al. |
| 2003/0029563 | A1 | 2/2003 | Kaushal et al. |
| 2003/0032297 | A1 | 2/2003 | Lindstrom et al. |
| 2003/0035002 | A1 | 2/2003 | Moles |
| 2003/0035705 | A1 | 2/2003 | Johnson |
| 2003/0036272 | A1 | 2/2003 | Shamouilian et al. |
| 2003/0037800 | A1 | 2/2003 | Bailey et al. |
| 2003/0040120 | A1 | 2/2003 | Allen et al. |
| 2003/0040158 | A1 | 2/2003 | Saitoh |
| 2003/0040196 | A1 | 2/2003 | Lim et al. |
| 2003/0040841 | A1 | 2/2003 | Nasr et al. |
| 2003/0041971 | A1 | 3/2003 | Kido et al. |
| 2003/0042419 | A1 | 3/2003 | Katsumata et al. |
| 2003/0045961 | A1 | 3/2003 | Nakao |
| 2003/0049372 | A1 | 3/2003 | Cook et al. |
| 2003/0049375 | A1 | 3/2003 | Nguyen et al. |
| 2003/0049499 | A1 | 3/2003 | Murakawa et al. |
| 2003/0049571 | A1 | 3/2003 | Hallock et al. |
| 2003/0049580 | A1 | 3/2003 | Goodman |
| 2003/0049937 | A1 | 3/2003 | Suzuki |
| 2003/0054670 | A1 | 3/2003 | Wang et al. |
| 2003/0056726 | A1 | 3/2003 | Holst et al. |
| 2003/0057848 | A1 | 3/2003 | Yuasa et al. |
| 2003/0059535 | A1 | 3/2003 | Luo et al. |
| 2003/0059980 | A1 | 3/2003 | Chen et al. |
| 2003/0062359 | A1 | 4/2003 | Ho et al. |
| 2003/0065413 | A1 | 4/2003 | Liteplo et al. |
| 2003/0066482 | A1 | 4/2003 | Pokharna et al. |
| 2003/0066541 | A1 | 4/2003 | Sun et al. |
| 2003/0066826 | A1 | 4/2003 | Lee et al. |
| 2003/0070617 | A1 | 4/2003 | Kim et al. |
| 2003/0071015 | A1 | 4/2003 | Chinn et al. |
| 2003/0072882 | A1 | 4/2003 | Niinisto et al. |
| 2003/0075107 | A1 | 4/2003 | Miyano et al. |
| 2003/0075925 | A1 | 4/2003 | Lindfors et al. |
| 2003/0077857 | A1 | 4/2003 | Xia et al. |
| 2003/0077883 | A1 | 4/2003 | Ohtake |
| 2003/0082296 | A1 | 5/2003 | Elers et al. |
| 2003/0082307 | A1 | 5/2003 | Chung et al. |
| 2003/0085663 | A1 | 5/2003 | Horsky |
| 2003/0091938 | A1 | 5/2003 | Fairbairn et al. |
| 2003/0094133 | A1 | 5/2003 | Yoshidome et al. |
| 2003/0101938 | A1 | 6/2003 | Ronsse et al. |
| 2003/0109107 | A1 | 6/2003 | Hsieh et al. |
| 2003/0109951 | A1 | 6/2003 | Hsiung et al. |
| 2003/0111012 | A1 | 6/2003 | Takeshima |
| 2003/0111013 | A1 | 6/2003 | Oosterlaken et al. |
| 2003/0111963 | A1 | 6/2003 | Tolmachev et al. |
| 2003/0113995 | A1 | 6/2003 | Xia et al. |
| 2003/0116087 | A1 | 6/2003 | Nguyen |
| 2003/0121608 | A1 | 7/2003 | Chen |
| 2003/0124792 | A1 | 7/2003 | Jeon et al. |
| 2003/0124818 | A1 | 7/2003 | Luo et al. |
| 2003/0124820 | A1 | 7/2003 | Johnsgard et al. |
| 2003/0124842 | A1 | 7/2003 | Hytros et al. |
| 2003/0127049 | A1 | 7/2003 | Han et al. |
| 2003/0132319 | A1 | 7/2003 | Hytros et al. |
| 2003/0133854 | A1 | 7/2003 | Tabata et al. |
| 2003/0134038 | A1 | 7/2003 | Paranjpe |
| 2003/0140851 | A1 | 7/2003 | Janakiraman et al. |
| 2003/0141527 | A1 | 7/2003 | Joo et al. |
| 2003/0141820 | A1 | 7/2003 | White et al. |
| 2003/0143328 | A1 | 7/2003 | Chen |
| 2003/0143846 | A1 | 7/2003 | Sekiya et al. |
| 2003/0145789 | A1 | 8/2003 | Bauch et al. |
| 2003/0149506 | A1 | 8/2003 | Haanstra et al. |
| 2003/0150386 | A1 | 8/2003 | Shimada |
| 2003/0153177 | A1 | 8/2003 | Tepman et al. |
| 2003/0153186 | A1 | 8/2003 | Bar-Gadda |
| 2003/0157345 | A1 | 8/2003 | Beldi et al. |
| 2003/0157432 | A1 | 8/2003 | Rottsegge |
| 2003/0157436 | A1 | 8/2003 | Manger et al. |
| 2003/0159653 | A1 | 8/2003 | Dando et al. |
| 2003/0159656 | A1 | 8/2003 | Tan |

(56) References Cited

U.S. PATENT DOCUMENTS

| | | | |
|---|---|---|---|
| 2003/0162412 | A1 | 8/2003 | Chung |
| 2003/0168001 | A1 | 9/2003 | Sneh |
| 2003/0168008 | A1 | 9/2003 | Ohmi et al. |
| 2003/0168012 | A1 | 9/2003 | Tamura et al. |
| 2003/0168174 | A1 | 9/2003 | Foree |
| 2003/0168699 | A1 | 9/2003 | Honda |
| 2003/0168750 | A1 | 9/2003 | Basceri et al. |
| 2003/0168948 | A1 | 9/2003 | Yamagishi et al. |
| 2003/0170153 | A1 | 9/2003 | Bar-Gadda |
| 2003/0170583 | A1 | 9/2003 | Nakashima |
| 2003/0170945 | A1 | 9/2003 | Igeta et al. |
| 2003/0173030 | A1 | 9/2003 | Ishii et al. |
| 2003/0173490 | A1 | 9/2003 | Lappen |
| 2003/0176074 | A1 | 9/2003 | Paterson et al. |
| 2003/0178145 | A1 | 9/2003 | Anderson et al. |
| 2003/0180458 | A1 | 9/2003 | Sneh |
| 2003/0181065 | A1 | 9/2003 | O'Donnell |
| 2003/0183156 | A1 | 10/2003 | Dando |
| 2003/0183856 | A1 | 10/2003 | Wieczorek et al. |
| 2003/0188682 | A1 | 10/2003 | Tois et al. |
| 2003/0188685 | A1 | 10/2003 | Wang |
| 2003/0190804 | A1 | 10/2003 | Glenn et al. |
| 2003/0192875 | A1 | 10/2003 | Bieker et al. |
| 2003/0198587 | A1 | 10/2003 | Kaloyeros |
| 2003/0200926 | A1 | 10/2003 | Dando et al. |
| 2003/0201541 | A1 | 10/2003 | Kim |
| 2003/0205096 | A1 | 11/2003 | Gehner et al. |
| 2003/0205202 | A1 | 11/2003 | Funaki et al. |
| 2003/0205237 | A1 | 11/2003 | Sakuma |
| 2003/0205327 | A1 | 11/2003 | Howald et al. |
| 2003/0207032 | A1 | 11/2003 | Ahn et al. |
| 2003/0209323 | A1 | 11/2003 | Yokogaki |
| 2003/0209326 | A1 | 11/2003 | Lee et al. |
| 2003/0209746 | A1 | 11/2003 | Horii |
| 2003/0210901 | A1 | 11/2003 | Donald et al. |
| 2003/0211735 | A1 | 11/2003 | Rossman |
| 2003/0213435 | A1 | 11/2003 | Okuda et al. |
| 2003/0213560 | A1 | 11/2003 | Wang et al. |
| 2003/0213562 | A1 | 11/2003 | Gondhalekar et al. |
| 2003/0215963 | A1 | 11/2003 | AmRhein et al. |
| 2003/0217915 | A1 | 11/2003 | Ouellet |
| 2003/0219972 | A1 | 11/2003 | Green |
| 2003/0221780 | A1 | 12/2003 | Lei et al. |
| 2003/0226840 | A1 | 12/2003 | Dalton |
| 2003/0228772 | A1 | 12/2003 | Cowans |
| 2003/0230986 | A1 | 12/2003 | Horsky et al. |
| 2003/0231698 | A1 | 12/2003 | Yamaguchi |
| 2003/0232138 | A1 | 12/2003 | Tuominen et al. |
| 2003/0232491 | A1 | 12/2003 | Yamaguchi |
| 2003/0232497 | A1 | 12/2003 | Xi et al. |
| 2003/0232511 | A1 | 12/2003 | Metzner et al. |
| 2003/0234371 | A1 | 12/2003 | Ziegler |
| 2004/0002224 | A1 | 1/2004 | Chono et al. |
| 2004/0005147 | A1 | 1/2004 | Wang et al. |
| 2004/0005753 | A1 | 1/2004 | Kostamo et al. |
| 2004/0009307 | A1 | 1/2004 | Koh et al. |
| 2004/0009679 | A1 | 1/2004 | Yeo et al. |
| 2004/0010772 | A1 | 1/2004 | McKenna et al. |
| 2004/0011504 | A1 | 1/2004 | Ku et al. |
| 2004/0013577 | A1 | 1/2004 | Ganguli et al. |
| 2004/0013818 | A1 | 1/2004 | Moon et al. |
| 2004/0015300 | A1 | 1/2004 | Ganguli et al. |
| 2004/0016637 | A1 | 1/2004 | Yang |
| 2004/0018304 | A1 | 1/2004 | Chung et al. |
| 2004/0018307 | A1 | 1/2004 | Park et al. |
| 2004/0018694 | A1 | 1/2004 | Lee et al. |
| 2004/0018723 | A1 | 1/2004 | Byun et al. |
| 2004/0018750 | A1 | 1/2004 | Sophie et al. |
| 2004/0023125 | A1 | 2/2004 | Nozawa et al. |
| 2004/0023516 | A1 | 2/2004 | Londergan et al. |
| 2004/0025786 | A1 | 2/2004 | Kontani et al. |
| 2004/0025787 | A1 | 2/2004 | Selbrede et al. |
| 2004/0026372 | A1 | 2/2004 | Takenaka et al. |
| 2004/0029052 | A1 | 2/2004 | Park et al. |
| 2004/0031564 | A1 | 2/2004 | Gottscho et al. |
| 2004/0035358 | A1 | 2/2004 | Basceri et al. |
| 2004/0036129 | A1 | 2/2004 | Forbes et al. |
| 2004/0037339 | A1 | 2/2004 | Watson et al. |
| 2004/0037675 | A1 | 2/2004 | Zinger et al. |
| 2004/0038525 | A1 | 2/2004 | Meng et al. |
| 2004/0043149 | A1 | 3/2004 | Gordon et al. |
| 2004/0043544 | A1 | 3/2004 | Asai et al. |
| 2004/0048439 | A1 | 3/2004 | Soman |
| 2004/0048452 | A1 | 3/2004 | Sugawara et al. |
| 2004/0048492 | A1 | 3/2004 | Ishikawa et al. |
| 2004/0050325 | A1 | 3/2004 | Samoilov |
| 2004/0050496 | A1 | 3/2004 | Iwai et al. |
| 2004/0052972 | A1 | 3/2004 | Schmitt |
| 2004/0056017 | A1 | 3/2004 | Renken |
| 2004/0058517 | A1 | 3/2004 | Nallan et al. |
| 2004/0062081 | A1 | 4/2004 | Drewes |
| 2004/0063289 | A1 | 4/2004 | Ohta |
| 2004/0065255 | A1 | 4/2004 | Yang et al. |
| 2004/0069226 | A1 | 4/2004 | Yoshida et al. |
| 2004/0071897 | A1 | 4/2004 | Verplancken et al. |
| 2004/0077182 | A1 | 4/2004 | Lim et al. |
| 2004/0079286 | A1 | 4/2004 | Lindfors |
| 2004/0079960 | A1 | 4/2004 | Shakuda |
| 2004/0080697 | A1 | 4/2004 | Song |
| 2004/0082171 | A1 | 4/2004 | Shin et al. |
| 2004/0083961 | A1 | 5/2004 | Basceri |
| 2004/0083962 | A1 | 5/2004 | Bang et al. |
| 2004/0083964 | A1 | 5/2004 | Ingle et al. |
| 2004/0083975 | A1 | 5/2004 | Tong et al. |
| 2004/0087141 | A1 | 5/2004 | Ramanathan et al. |
| 2004/0087168 | A1 | 5/2004 | Granneman et al. |
| 2004/0089078 | A1 | 5/2004 | Gehner et al. |
| 2004/0089236 | A1 | 5/2004 | Yokogawa et al. |
| 2004/0092073 | A1 | 5/2004 | Cabral et al. |
| 2004/0092120 | A1 | 5/2004 | Wicker |
| 2004/0093963 | A1 | 5/2004 | Gehner et al. |
| 2004/0094206 | A1 | 5/2004 | Ishida |
| 2004/0094402 | A1 | 5/2004 | Gopalraja |
| 2004/0095074 | A1 | 5/2004 | Ishii et al. |
| 2004/0099213 | A1 | 5/2004 | Adomaitis et al. |
| 2004/0099635 | A1 | 5/2004 | Nishikawa |
| 2004/0101622 | A1 | 5/2004 | Park et al. |
| 2004/0103914 | A1 | 6/2004 | Cheng et al. |
| 2004/0104439 | A1 | 6/2004 | Haukka et al. |
| 2004/0105738 | A1 | 6/2004 | Ahn et al. |
| 2004/0106249 | A1 | 6/2004 | Huotari |
| 2004/0112288 | A1 | 6/2004 | Whitesell |
| 2004/0115936 | A1 | 6/2004 | DePetrillo et al. |
| 2004/0118342 | A1 | 6/2004 | Cheng et al. |
| 2004/0121620 | A1 | 6/2004 | Pomarede et al. |
| 2004/0124131 | A1 | 7/2004 | Aitchison |
| 2004/0124549 | A1 | 7/2004 | Curran |
| 2004/0126213 | A1 | 7/2004 | Pelzmann et al. |
| 2004/0126929 | A1 | 7/2004 | Tang et al. |
| 2004/0126990 | A1 | 7/2004 | Ohta |
| 2004/0127069 | A1 | 7/2004 | Yamazaki et al. |
| 2004/0129211 | A1 | 7/2004 | Blonigan et al. |
| 2004/0129671 | A1 | 7/2004 | Ji et al. |
| 2004/0134429 | A1 | 7/2004 | Yamanaka |
| 2004/0137756 | A1 | 7/2004 | Li et al. |
| 2004/0142577 | A1 | 7/2004 | Sugawara et al. |
| 2004/0144311 | A1 | 7/2004 | Chen |
| 2004/0144323 | A1 | 7/2004 | Kai |
| 2004/0144980 | A1 | 7/2004 | Ahn et al. |
| 2004/0146644 | A1 | 7/2004 | Xia et al. |
| 2004/0151844 | A1 | 8/2004 | Zhang et al. |
| 2004/0151845 | A1 | 8/2004 | Nguyen et al. |
| 2004/0152287 | A1 | 8/2004 | Sherrill et al. |
| 2004/0154746 | A1 | 8/2004 | Park |
| 2004/0159343 | A1 | 8/2004 | Shimbara et al. |
| 2004/0163590 | A1 | 8/2004 | Tran et al. |
| 2004/0168627 | A1 | 9/2004 | Conley et al. |
| 2004/0168742 | A1 | 9/2004 | Kim et al. |
| 2004/0168769 | A1 | 9/2004 | Matsuoka et al. |
| 2004/0169032 | A1 | 9/2004 | Murayama et al. |
| 2004/0185177 | A1 | 9/2004 | Basceri et al. |
| 2004/0187304 | A1 | 9/2004 | Chen et al. |
| 2004/0187777 | A1 | 9/2004 | Okamoto et al. |
| 2004/0187784 | A1 | 9/2004 | Sferlazzo |

(56) References Cited

U.S. PATENT DOCUMENTS

2004/0187790 A1 9/2004 Bader
2004/0187928 A1 9/2004 Ambrosina
2004/0198069 A1 10/2004 Metzner et al.
2004/0200499 A1 10/2004 Harvey et al.
2004/0202786 A1 10/2004 Wongsenakhum et al.
2004/0203251 A1 10/2004 Kawaguchi et al.
2004/0206305 A1 10/2004 Choi et al.
2004/0208228 A1 10/2004 Hashikura et al.
2004/0209477 A1 10/2004 Buxbaum et al.
2004/0211357 A1 10/2004 Gadgil
2004/0212947 A1 10/2004 Nguyen
2004/0213921 A1 10/2004 Leu
2004/0214399 A1 10/2004 Ahn et al.
2004/0214445 A1 10/2004 Shimizu et al.
2004/0217217 A1 11/2004 Han et al.
2004/0219793 A1 11/2004 Hishiya et al.
2004/0220699 A1 11/2004 Heden et al.
2004/0221807 A1 11/2004 Verghese et al.
2004/0221808 A1 11/2004 Kawano
2004/0223893 A1 11/2004 Tabata et al.
2004/0224478 A1 11/2004 Chudzik et al.
2004/0226507 A1 11/2004 Carpenter et al.
2004/0226515 A1 11/2004 Yendler et al.
2004/0228968 A1 11/2004 Basceri
2004/0231600 A1 11/2004 Lee
2004/0231799 A1 11/2004 Lee et al.
2004/0238523 A1 12/2004 Kuibira et al.
2004/0241322 A1 12/2004 Basceri et al.
2004/0241341 A1 12/2004 Lin
2004/0241998 A1 12/2004 Hanson
2004/0245091 A1 12/2004 Karim et al.
2004/0247779 A1 12/2004 Selvamanickam et al.
2004/0250600 A1 12/2004 Bevers et al.
2004/0253790 A1 12/2004 Ootsuka
2004/0253867 A1 12/2004 Matsumoto
2004/0261492 A1 12/2004 Zarkar et al.
2004/0261706 A1 12/2004 Lindfors et al.
2004/0261712 A1 12/2004 Hayashi et al.
2004/0261946 A1 12/2004 Endoh et al.
2004/0266011 A1 12/2004 Lee et al.
2005/0000428 A1 1/2005 Shero et al.
2005/0001062 A1 1/2005 McCracken et al.
2005/0003089 A1 1/2005 Won et al.
2005/0003600 A1 1/2005 Kasai et al.
2005/0003662 A1 1/2005 Jurisch et al.
2005/0006682 A1 1/2005 Bae et al.
2005/0008799 A1 1/2005 Tomiyasu et al.
2005/0009325 A1 1/2005 Chung et al.
2005/0016452 A1 1/2005 Ryu et al.
2005/0016470 A1 1/2005 Kang et al.
2005/0016956 A1 1/2005 Liu et al.
2005/0017272 A1 1/2005 Yamashita et al.
2005/0019026 A1 1/2005 Wang et al.
2005/0019494 A1 1/2005 Moghadam et al.
2005/0019960 A1 1/2005 Lee et al.
2005/0020071 A1 1/2005 Sonobe et al.
2005/0023231 A1 2/2005 Huang et al.
2005/0023624 A1 2/2005 Ahn et al.
2005/0026402 A1 2/2005 Jurgensen
2005/0033075 A1 2/2005 Chi et al.
2005/0034664 A1 2/2005 Koh et al.
2005/0034674 A1 2/2005 Ono
2005/0037154 A1 2/2005 Koh et al.
2005/0037578 A1 2/2005 Chen et al.
2005/0037610 A1 2/2005 Cha
2005/0037619 A1 2/2005 Granneman et al.
2005/0040144 A1 2/2005 Sellers
2005/0042778 A1 2/2005 Peukert
2005/0046825 A1 3/2005 Powell et al.
2005/0048797 A1 3/2005 Fukazawa
2005/0051093 A1 3/2005 Makino et al.
2005/0051100 A1 3/2005 Chiang et al.
2005/0051854 A1 3/2005 Cabral et al.
2005/0054175 A1 3/2005 Bauer
2005/0054198 A1 3/2005 Um
2005/0054228 A1 3/2005 March
2005/0056218 A1 3/2005 Sun et al.
2005/0056780 A1 3/2005 Miller et al.
2005/0059261 A1 3/2005 Basceri et al.
2005/0059262 A1 3/2005 Yin et al.
2005/0059264 A1 3/2005 Cheung
2005/0061964 A1 3/2005 Nagano et al.
2005/0062773 A1 3/2005 Fouet
2005/0063451 A1 3/2005 Abe et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070128 A1 3/2005 Xia et al.
2005/0070729 A1 3/2005 Kiyomori et al.
2005/0072357 A1 4/2005 Shero et al.
2005/0074576 A1 4/2005 Chaiken et al.
2005/0074983 A1 4/2005 Shinriki et al.
2005/0079124 A1 4/2005 Sanderson
2005/0079691 A1 4/2005 Kim et al.
2005/0081786 A1 4/2005 Kubista et al.
2005/0085090 A1 4/2005 Mui et al.
2005/0090123 A1 4/2005 Nishimura et al.
2005/0092247 A1 5/2005 Schmidt
2005/0092249 A1 5/2005 Kilpela et al.
2005/0092439 A1 5/2005 Keeton et al.
2005/0092733 A1 5/2005 Ito et al.
2005/0095770 A1 5/2005 Kumagai et al.
2005/0095779 A1 5/2005 Park et al.
2005/0095859 A1 5/2005 Chen et al.
2005/0098107 A1 5/2005 Du Bois et al.
2005/0100669 A1 5/2005 Kools et al.
2005/0101154 A1 5/2005 Huang
2005/0101843 A1 5/2005 Quinn et al.
2005/0104112 A1 5/2005 Haukka et al.
2005/0106762 A1 5/2005 Chakrapani et al.
2005/0106893 A1 5/2005 Wilk
2005/0107627 A1 5/2005 Dussarrat et al.
2005/0109461 A1 5/2005 Sun
2005/0110069 A1 5/2005 Kil et al.
2005/0112282 A1 5/2005 Gordon et al.
2005/0115946 A1 6/2005 Shim et al.
2005/0118804 A1 6/2005 Byun et al.
2005/0118837 A1 6/2005 Todd
2005/0120805 A1 6/2005 Lane
2005/0120962 A1 6/2005 Ushioda et al.
2005/0121145 A1 6/2005 Du Bois et al.
2005/0123690 A1 6/2005 Derderian et al.
2005/0130427 A1 6/2005 Seok-Jun
2005/0132957 A1 6/2005 El-Raghy
2005/0133160 A1 6/2005 Kennedy et al.
2005/0133161 A1 6/2005 Carpenter et al.
2005/0133166 A1 6/2005 Satitpunwaycha et al.
2005/0136188 A1 6/2005 Chang
2005/0136657 A1 6/2005 Yokoi et al.
2005/0139160 A1 6/2005 Lei et al.
2005/0141591 A1 6/2005 Sakano
2005/0142361 A1 6/2005 Nakanishi
2005/0145338 A1 7/2005 Park et al.
2005/0148162 A1 7/2005 Chen et al.
2005/0150601 A1 7/2005 Srivastava
2005/0151184 A1 7/2005 Lee et al.
2005/0153571 A1 7/2005 Senzaki
2005/0153573 A1 7/2005 Okudaira et al.
2005/0160987 A1 7/2005 Kasai et al.
2005/0161434 A1 7/2005 Sugawara et al.
2005/0164469 A1 7/2005 Haupt
2005/0170306 A1 8/2005 Oosterlaken et al.
2005/0172895 A1 8/2005 Kijima et al.
2005/0173003 A1 8/2005 Laverdiere et al.
2005/0175789 A1 8/2005 Helms
2005/0178333 A1 8/2005 Loke et al.
2005/0181535 A1 8/2005 Yun et al.
2005/0181555 A1 8/2005 Haukka et al.
2005/0183827 A1 8/2005 White et al.
2005/0186688 A1 8/2005 Basceri
2005/0187647 A1 8/2005 Wang et al.
2005/0191828 A1 9/2005 Al-Bayati et al.

(56) References Cited

U.S. PATENT DOCUMENTS

| | | | |
|---|---|---|---|
| 2005/0193948 | A1 | 9/2005 | Oohirabaru et al. |
| 2005/0193952 | A1 | 9/2005 | Goodman et al. |
| 2005/0199013 | A1 | 9/2005 | Vandroux et al. |
| 2005/0199342 | A1 | 9/2005 | Shajii et al. |
| 2005/0201908 | A1 | 9/2005 | Nakamura et al. |
| 2005/0208217 | A1 | 9/2005 | Shinriki et al. |
| 2005/0208219 | A1 | 9/2005 | Basceri |
| 2005/0208718 | A1 | 9/2005 | Lim et al. |
| 2005/0208778 | A1 | 9/2005 | Li |
| 2005/0211167 | A1 | 9/2005 | Gunji |
| 2005/0211384 | A1 | 9/2005 | Hayashi |
| 2005/0212119 | A1 | 9/2005 | Shero |
| 2005/0214457 | A1 | 9/2005 | Schmitt et al. |
| 2005/0214458 | A1 | 9/2005 | Meiere |
| 2005/0218462 | A1 | 10/2005 | Ahn et al. |
| 2005/0221021 | A1 | 10/2005 | Strang |
| 2005/0221618 | A1 | 10/2005 | AmRhein et al. |
| 2005/0223982 | A1 | 10/2005 | Park et al. |
| 2005/0223994 | A1 | 10/2005 | Blomiley et al. |
| 2005/0227502 | A1 | 10/2005 | Schmitt et al. |
| 2005/0229848 | A1 | 10/2005 | Shinriki |
| 2005/0229849 | A1 | 10/2005 | Silvetti et al. |
| 2005/0229972 | A1 | 10/2005 | Hoshi et al. |
| 2005/0233477 | A1 | 10/2005 | Yamazaki et al. |
| 2005/0238807 | A1 | 10/2005 | Lin et al. |
| 2005/0241176 | A1 | 11/2005 | Shero et al. |
| 2005/0241763 | A1 | 11/2005 | Huang et al. |
| 2005/0241765 | A1 | 11/2005 | Dhindsa et al. |
| 2005/0245058 | A1 | 11/2005 | Lee et al. |
| 2005/0249876 | A1 | 11/2005 | Kawahara et al. |
| 2005/0250340 | A1 | 11/2005 | Chen et al. |
| 2005/0251990 | A1 | 11/2005 | Choi |
| 2005/0252447 | A1 | 11/2005 | Zhao et al. |
| 2005/0252449 | A1 | 11/2005 | Nguyen et al. |
| 2005/0252455 | A1 | 11/2005 | Moriya et al. |
| 2005/0253061 | A1 | 11/2005 | Cameron et al. |
| 2005/0255257 | A1 | 11/2005 | Choi et al. |
| 2005/0255327 | A1 | 11/2005 | Chaney et al. |
| 2005/0258280 | A1 | 11/2005 | Goto et al. |
| 2005/0260347 | A1 | 11/2005 | Narwankar et al. |
| 2005/0260837 | A1 | 11/2005 | Walther et al. |
| 2005/0260850 | A1 | 11/2005 | Loke |
| 2005/0263072 | A1 | 12/2005 | Balasubramanian et al. |
| 2005/0263075 | A1 | 12/2005 | Wang et al. |
| 2005/0263719 | A1 | 12/2005 | Ohdaira et al. |
| 2005/0263932 | A1 | 12/2005 | Heugel |
| 2005/0268856 | A1 | 12/2005 | Miller |
| 2005/0271812 | A1 | 12/2005 | Myo et al. |
| 2005/0271813 | A1 | 12/2005 | Kher et al. |
| 2005/0272247 | A1 | 12/2005 | Ikeda et al. |
| 2005/0274323 | A1 | 12/2005 | Seidel et al. |
| 2005/0276928 | A1 | 12/2005 | Okumura et al. |
| 2005/0277271 | A1 | 12/2005 | Beintner |
| 2005/0282101 | A1 | 12/2005 | Adachi |
| 2005/0282350 | A1 | 12/2005 | Chou et al. |
| 2005/0284573 | A1 | 12/2005 | Egley et al. |
| 2005/0284991 | A1 | 12/2005 | Saez |
| 2005/0285097 | A1 | 12/2005 | Shang et al. |
| 2005/0285208 | A1 | 12/2005 | Ren et al. |
| 2005/0287725 | A1 | 12/2005 | Kitagawa |
| 2005/0287771 | A1 | 12/2005 | Seamons et al. |
| 2006/0000411 | A1 | 1/2006 | Seo |
| 2006/0006538 | A1 | 1/2006 | Allman et al. |
| 2006/0008997 | A1 | 1/2006 | Jang et al. |
| 2006/0009044 | A1 | 1/2006 | Igeta et al. |
| 2006/0013674 | A1 | 1/2006 | Elliott et al. |
| 2006/0013946 | A1 | 1/2006 | Park et al. |
| 2006/0014384 | A1 | 1/2006 | Lee et al. |
| 2006/0014397 | A1 | 1/2006 | Seamons et al. |
| 2006/0016783 | A1 | 1/2006 | Wu et al. |
| 2006/0019033 | A1 | 1/2006 | Muthukrishnan et al. |
| 2006/0019495 | A1 | 1/2006 | Marcadal et al. |
| 2006/0019502 | A1 | 1/2006 | Park et al. |
| 2006/0021572 | A1 | 2/2006 | Wolden |
| 2006/0021573 | A1 | 2/2006 | Monsma et al. |
| 2006/0021703 | A1 | 2/2006 | Umotoy et al. |
| 2006/0024439 | A2 | 2/2006 | Tuominen et al. |
| 2006/0026314 | A1 | 2/2006 | Franchuk et al. |
| 2006/0032443 | A1 | 2/2006 | Hasebe et al. |
| 2006/0040054 | A1 | 2/2006 | Pearlstein et al. |
| 2006/0040508 | A1 | 2/2006 | Ji |
| 2006/0046518 | A1 | 3/2006 | Hill et al. |
| 2006/0048710 | A1 | 3/2006 | Horiguchi et al. |
| 2006/0051505 | A1 | 3/2006 | Kortshagen et al. |
| 2006/0051520 | A1 | 3/2006 | Behle et al. |
| 2006/0051925 | A1 | 3/2006 | Ahn et al. |
| 2006/0057799 | A1 | 3/2006 | Horiguchi et al. |
| 2006/0057828 | A1 | 3/2006 | Omura |
| 2006/0057858 | A1 | 3/2006 | Chung et al. |
| 2006/0060930 | A1 | 3/2006 | Metz et al. |
| 2006/0062910 | A1 | 3/2006 | Meiere |
| 2006/0063346 | A1 | 3/2006 | Lee et al. |
| 2006/0068097 | A1 | 3/2006 | Yamasaki et al. |
| 2006/0068104 | A1 | 3/2006 | Ishizaka |
| 2006/0068121 | A1 | 3/2006 | Lee et al. |
| 2006/0068125 | A1 | 3/2006 | Radhakrishnan |
| 2006/0081558 | A1 | 4/2006 | Collins et al. |
| 2006/0087638 | A1 | 4/2006 | Hirayanagi |
| 2006/0090702 | A1 | 5/2006 | Koo et al. |
| 2006/0093756 | A1 | 5/2006 | Rajagopalan et al. |
| 2006/0094236 | A1 | 5/2006 | Elkins et al. |
| 2006/0096540 | A1 | 5/2006 | Choi |
| 2006/0097220 | A1 | 5/2006 | Kim et al. |
| 2006/0097305 | A1 | 5/2006 | Lee |
| 2006/0099782 | A1 | 5/2006 | Ritenour |
| 2006/0102968 | A1 | 5/2006 | Bojarczuk et al. |
| 2006/0105566 | A1 | 5/2006 | Waldfried et al. |
| 2006/0107898 | A1 | 5/2006 | Blomberg |
| 2006/0108221 | A1 | 5/2006 | Goodwin et al. |
| 2006/0108331 | A1 | 5/2006 | Nozawa et al. |
| 2006/0110930 | A1 | 5/2006 | Senzaki |
| 2006/0110934 | A1 | 5/2006 | Fukuchi |
| 2006/0113038 | A1 | 6/2006 | Gondhalekar et al. |
| 2006/0113675 | A1 | 6/2006 | Chang et al. |
| 2006/0113806 | A1 | 6/2006 | Tsuji et al. |
| 2006/0115589 | A1 | 6/2006 | Vukovic |
| 2006/0118240 | A1 | 6/2006 | Holber et al. |
| 2006/0118241 | A1 | 6/2006 | Ohmi et al. |
| 2006/0125099 | A1 | 6/2006 | Gordon et al. |
| 2006/0127067 | A1 | 6/2006 | Wintenberger et al. |
| 2006/0128142 | A1 | 6/2006 | Whelan et al. |
| 2006/0128168 | A1 | 6/2006 | Ahn et al. |
| 2006/0130751 | A1 | 6/2006 | Volfovski et al. |
| 2006/0130767 | A1 | 6/2006 | Herchen |
| 2006/0133955 | A1 | 6/2006 | Peters |
| 2006/0137608 | A1 | 6/2006 | Choi et al. |
| 2006/0137609 | A1 | 6/2006 | Puchacz et al. |
| 2006/0141155 | A1 | 6/2006 | Gordon et al. |
| 2006/0141758 | A1 | 6/2006 | Naumann et al. |
| 2006/0144820 | A1 | 7/2006 | Sawin et al. |
| 2006/0147626 | A1 | 7/2006 | Blomberg |
| 2006/0148151 | A1 | 7/2006 | Murthy et al. |
| 2006/0148180 | A1 | 7/2006 | Ahn et al. |
| 2006/0151117 | A1 | 7/2006 | Kasanami et al. |
| 2006/0154424 | A1 | 7/2006 | Yang et al. |
| 2006/0156979 | A1 | 7/2006 | Thakur et al. |
| 2006/0156981 | A1 | 7/2006 | Fondurulia |
| 2006/0162658 | A1 | 7/2006 | Weidman |
| 2006/0162661 | A1 | 7/2006 | Jung et al. |
| 2006/0162863 | A1 | 7/2006 | Kim et al. |
| 2006/0163612 | A1 | 7/2006 | Kouvetakis et al. |
| 2006/0163683 | A1 | 7/2006 | Roth et al. |
| 2006/0165892 | A1 | 7/2006 | Weidman |
| 2006/0166428 | A1 | 7/2006 | Kamioka |
| 2006/0172531 | A1 | 8/2006 | Lin et al. |
| 2006/0175669 | A1 | 8/2006 | Kim et al. |
| 2006/0176928 | A1 | 8/2006 | Nakamura et al. |
| 2006/0177855 | A1 | 8/2006 | Utermohlen |
| 2006/0182885 | A1 | 8/2006 | Lei et al. |
| 2006/0185589 | A1 | 8/2006 | Zehavi et al. |
| 2006/0188360 | A1 | 8/2006 | Bonora et al. |
| 2006/0191555 | A1 | 8/2006 | Yoshida et al. |
| 2006/0193979 | A1 | 8/2006 | Meiere et al. |
| 2006/0193980 | A1 | 8/2006 | Hasegawa |

(56) References Cited

U.S. PATENT DOCUMENTS

2006/0196418 A1 9/2006 Lindfors et al.
2006/0196420 A1 9/2006 Ushakov et al.
2006/0196421 A1 9/2006 Ronsse et al.
2006/0199357 A1 9/2006 Wan et al.
2006/0205194 A1 9/2006 Bauer
2006/0205223 A1 9/2006 Smayling
2006/0205231 A1 9/2006 Chou et al.
2006/0208215 A1 9/2006 Metzner et al.
2006/0211224 A1 9/2006 Matsuda
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0213441 A1 9/2006 Kobrin et al.
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0223337 A1 10/2006 Ahn et al.
2006/0226117 A1 10/2006 Bertram et al.
2006/0228496 A1* 10/2006 Choi .................. H01J 37/3244 118/715
2006/0228863 A1 10/2006 Zhang et al.
2006/0228888 A1 10/2006 Lee et al.
2006/0228898 A1 10/2006 Wajda et al.
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249175 A1 11/2006 Nowak et al.
2006/0249253 A1 11/2006 Dando
2006/0251827 A1 11/2006 Nowak
2006/0252228 A1 11/2006 Jeng
2006/0252244 A1 11/2006 Vaartstra et al.
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0026654 A1 2/2007 Huotari et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0065597 A1 3/2007 Kaido et al.
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.
2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087515 A1 4/2007 Yieh et al.
2007/0087579 A1 4/2007 Kitayama et al.
2007/0089670 A1 4/2007 Ikedo
2007/0092696 A1 4/2007 Tsukatani et al.
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111030 A1 5/2007 Nakano et al.
2007/0111470 A1 5/2007 Smythe
2007/0111545 A1 5/2007 Lee et al.
2007/0113788 A1 5/2007 Nozawa et al.
2007/0116872 A1 5/2007 Li et al.
2007/0116873 A1 5/2007 Li et al.
2007/0116887 A1 5/2007 Faguet
2007/0116888 A1 5/2007 Faguet
2007/0119370 A1 5/2007 Ma et al.
2007/0120275 A1 5/2007 Liu
2007/0123037 A1 5/2007 Lee et al.
2007/0123060 A1 5/2007 Rahtu
2007/0123189 A1 5/2007 Saito et al.
2007/0125762 A1 6/2007 Cui et al.
2007/0128538 A1 6/2007 Fairbairn et al.
2007/0128570 A1 6/2007 Goto et al.
2007/0128858 A1 6/2007 Haukka et al.
2007/0128876 A1 6/2007 Fukiage
2007/0128888 A1 6/2007 Goto et al.
2007/0129621 A1 6/2007 Kellogg et al.
2007/0131168 A1 6/2007 Gomi et al.
2007/0134821 A1 6/2007 Thakur et al.
2007/0134919 A1 6/2007 Gunji et al.
2007/0134942 A1 6/2007 Ahn et al.
2007/0137794 A1 6/2007 Qiu et al.
2007/0144442 A1 6/2007 Migita
2007/0146621 A1 6/2007 Yeom

(56) References Cited

U.S. PATENT DOCUMENTS

2007/0148347 A1 6/2007 Hatanpaa et al.
2007/0148350 A1 6/2007 Rahtu
2007/0148990 A1 6/2007 Deboer et al.
2007/0153625 A1 7/2007 Lundgren et al.
2007/0155138 A1 7/2007 Tomasini et al.
2007/0157466 A1 7/2007 Kida et al.
2007/0157683 A1 7/2007 Li
2007/0158026 A1 7/2007 Amikura
2007/0163440 A1 7/2007 Kim et al.
2007/0163490 A1 7/2007 Habel et al.
2007/0163625 A1 7/2007 Lee
2007/0163996 A1 7/2007 Horiguchi
2007/0166457 A1 7/2007 Yamoto et al.
2007/0166459 A1 7/2007 Chang et al.
2007/0166966 A1 7/2007 Todd et al.
2007/0166999 A1 7/2007 Vaarstra
2007/0170372 A1 7/2007 Horsky
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0181066 A1 8/2007 Cadwell et al.
2007/0184179 A1 8/2007 Waghray et al.
2007/0186849 A1 8/2007 Furuya
2007/0186952 A1 8/2007 Honda et al.
2007/0187362 A1 8/2007 Nakagawa et al.
2007/0187363 A1 8/2007 Oka et al.
2007/0190266 A1 8/2007 Fu et al.
2007/0190362 A1 8/2007 Weidman
2007/0190744 A1 8/2007 Hiraiwa et al.
2007/0190782 A1 8/2007 Park
2007/0199510 A1 8/2007 Weiner et al.
2007/0202678 A1 8/2007 Plombon et al.
2007/0205788 A1 9/2007 Natsuhara et al.
2007/0207275 A1 9/2007 Nowak et al.
2007/0209588 A1 9/2007 Li et al.
2007/0209590 A1 9/2007 Li
2007/0210890 A1 9/2007 Hsu et al.
2007/0212484 A1 9/2007 Li
2007/0212811 A1 9/2007 Hanawa et al.
2007/0212827 A1 9/2007 Girotra et al.
2007/0215048 A1 9/2007 Suzuki et al.
2007/0215278 A1 9/2007 Furuse et al.
2007/0215580 A1 9/2007 Koshiishi et al.
2007/0218200 A1 9/2007 Suzuki et al.
2007/0218705 A1 9/2007 Matsuki et al.
2007/0222131 A1 9/2007 Fukumoto et al.
2007/0224777 A1 9/2007 Hamelin
2007/0224833 A1 9/2007 Morisada et al.
2007/0227665 A1 10/2007 Matsumoto et al.
2007/0231488 A1 10/2007 Von Kaenel
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0238305 A1 10/2007 Delgadino et al.
2007/0241688 A1 10/2007 DeVancentis et al.
2007/0243317 A1 10/2007 Du Bois et al.
2007/0247075 A1 10/2007 Kim et al.
2007/0248767 A1 10/2007 Okura
2007/0248832 A1 10/2007 Maeda et al.
2007/0249131 A1 10/2007 Allen et al.
2007/0251444 A1 11/2007 Gros-Jean et al.
2007/0251456 A1 11/2007 Herchen et al.
2007/0252233 A1 11/2007 Yamazaki et al.
2007/0252244 A1 11/2007 Srividya et al.
2007/0252532 A1 11/2007 DeVancentis et al.
2007/0254414 A1 11/2007 Miyanami
2007/0258506 A1 11/2007 Schwagerman et al.
2007/0258855 A1 11/2007 Turcot et al.
2007/0259778 A1 11/2007 Spencer et al.
2007/0261868 A1 11/2007 Gross
2007/0264427 A1 11/2007 Shinriki et al.
2007/0264793 A1 11/2007 Oh et al.
2007/0264807 A1 11/2007 Leone et al.
2007/0266932 A1 11/2007 Hiramatsu
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281106 A1 12/2007 Lubomirsky et al.
2007/0281496 A1 12/2007 Ingle et al.
2007/0286957 A1 12/2007 Suzuki et al.
2007/0289534 A1 12/2007 Lubomirsky et al.
2007/0292974 A1 12/2007 Mizuno et al.
2007/0295602 A1 12/2007 Tiller et al.
2007/0298362 A1 12/2007 Rocha-Alvarez et al.
2007/0298565 A1 12/2007 Nieh et al.
2008/0003425 A1 1/2008 Spencer et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026162 A1 1/2008 Dickey et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0032514 A1 2/2008 Sano et al.
2008/0035055 A1 2/2008 Dip et al.
2008/0035306 A1 2/2008 White et al.
2008/0035607 A1 2/2008 O'Hara et al.
2008/0036354 A1 2/2008 Letz et al.
2008/0038485 A1 2/2008 Fukazawa et al.
2008/0038934 A1 2/2008 Vrtis et al.
2008/0042165 A1 2/2008 Sugizaki
2008/0042192 A1 2/2008 Park et al.
2008/0043803 A1 2/2008 Bandoh
2008/0044932 A1 2/2008 Samoilov et al.
2008/0044938 A1 2/2008 England et al.
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0063798 A1 3/2008 Kher et al.
2008/0066778 A1 3/2008 Matsushita et al.
2008/0067146 A1 3/2008 Onishi et al.
2008/0069951 A1 3/2008 Chacin et al.
2008/0069955 A1 3/2008 Hong et al.
2008/0072821 A1 3/2008 Dalton et al.
2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0092821 A1 4/2008 Otsuka et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.

(56) References Cited

U.S. PATENT DOCUMENTS

| | | | |
|---|---|---|---|
| 2008/0102630 | A1 | 5/2008 | Saito |
| 2008/0105276 | A1 | 5/2008 | Yeh et al. |
| 2008/0110401 | A1 | 5/2008 | Fujikawa et al. |
| 2008/0110568 | A1 | 5/2008 | Son et al. |
| 2008/0113094 | A1 | 5/2008 | Casper |
| 2008/0113096 | A1 | 5/2008 | Mahajani |
| 2008/0113097 | A1 | 5/2008 | Mahajani et al. |
| 2008/0118334 | A1 | 5/2008 | Bonora |
| 2008/0121177 | A1 | 5/2008 | Bang et al. |
| 2008/0121626 | A1 | 5/2008 | Thomas et al. |
| 2008/0121962 | A1 | 5/2008 | Forbes et al. |
| 2008/0124197 | A1 | 5/2008 | van der Meulen et al. |
| 2008/0124908 | A1 | 5/2008 | Forbes et al. |
| 2008/0124945 | A1 | 5/2008 | Miya et al. |
| 2008/0124946 | A1 | 5/2008 | Xiao et al. |
| 2008/0128726 | A1 | 6/2008 | Sakata et al. |
| 2008/0129209 | A1 | 6/2008 | Deakins et al. |
| 2008/0132046 | A1 | 6/2008 | Walther |
| 2008/0133154 | A1 | 6/2008 | Krauss et al. |
| 2008/0134887 | A1 | 6/2008 | Sherer |
| 2008/0135516 | A1 | 6/2008 | Yokogawa et al. |
| 2008/0135936 | A1 | 6/2008 | Nakajima |
| 2008/0142046 | A1 | 6/2008 | Johnson et al. |
| 2008/0142483 | A1 | 6/2008 | Hua |
| 2008/0146033 | A1 | 6/2008 | Park |
| 2008/0149031 | A1 | 6/2008 | Chu et al. |
| 2008/0149593 | A1 | 6/2008 | Bai et al. |
| 2008/0152463 | A1 | 6/2008 | Chidambaram et al. |
| 2008/0153308 | A1 | 6/2008 | Ogawa et al. |
| 2008/0153311 | A1 | 6/2008 | Padhi et al. |
| 2008/0156769 | A1 | 7/2008 | Weiner et al. |
| 2008/0157157 | A1 | 7/2008 | Tonomura |
| 2008/0157212 | A1 | 7/2008 | Lavoie et al. |
| 2008/0157365 | A1 | 7/2008 | Ott et al. |
| 2008/0173237 | A1 | 7/2008 | Collins |
| 2008/0173238 | A1 | 7/2008 | Nakashima et al. |
| 2008/0173240 | A1 | 7/2008 | Furukawahara |
| 2008/0173326 | A1 | 7/2008 | Gu et al. |
| 2008/0176335 | A1 | 7/2008 | Alberti et al. |
| 2008/0176375 | A1 | 7/2008 | Erben et al. |
| 2008/0176412 | A1 | 7/2008 | Komeda |
| 2008/0178608 | A1 | 7/2008 | Tandou et al. |
| 2008/0178805 | A1 | 7/2008 | Paterson et al. |
| 2008/0179104 | A1 | 7/2008 | Zhang |
| 2008/0179291 | A1 | 7/2008 | Collins et al. |
| 2008/0179715 | A1 | 7/2008 | Coppa |
| 2008/0182075 | A1 | 7/2008 | Chopra |
| 2008/0182390 | A1 | 7/2008 | Lemmi et al. |
| 2008/0182411 | A1 | 7/2008 | Elers |
| 2008/0191193 | A1 | 8/2008 | Li et al. |
| 2008/0193643 | A1 | 8/2008 | Dip |
| 2008/0194088 | A1 | 8/2008 | Srinivasan et al. |
| 2008/0194105 | A1 | 8/2008 | Dominguez et al. |
| 2008/0194113 | A1 | 8/2008 | Kim et al. |
| 2008/0194169 | A1 | 8/2008 | Sterling et al. |
| 2008/0199977 | A1 | 8/2008 | Weigel et al. |
| 2008/0202416 | A1 | 8/2008 | Provencher |
| 2008/0202689 | A1 | 8/2008 | Kim |
| 2008/0203487 | A1 | 8/2008 | Hohage et al. |
| 2008/0205483 | A1 | 8/2008 | Rempe et al. |
| 2008/0210162 | A1 | 9/2008 | Yonebayashi |
| 2008/0210278 | A1 | 9/2008 | Orii et al. |
| 2008/0211423 | A1 | 9/2008 | Shinmen et al. |
| 2008/0211526 | A1 | 9/2008 | Shinma |
| 2008/0213696 | A1 | 9/2008 | Meeus et al. |
| 2008/0214003 | A1 | 9/2008 | Xia et al. |
| 2008/0216077 | A1 | 9/2008 | Emani et al. |
| 2008/0216742 | A1 | 9/2008 | Takebayashi |
| 2008/0216958 | A1 | 9/2008 | Goto et al. |
| 2008/0220619 | A1 | 9/2008 | Matsushita et al. |
| 2008/0223130 | A1 | 9/2008 | Snell et al. |
| 2008/0223725 | A1 | 9/2008 | Han et al. |
| 2008/0224240 | A1 | 9/2008 | Ahn et al. |
| 2008/0228306 | A1 | 9/2008 | Yetter et al. |
| 2008/0229811 | A1 | 9/2008 | Zhao et al. |
| 2008/0230352 | A1 | 9/2008 | Hirata |
| 2008/0230371 | A1 | 9/2008 | McHugh |
| 2008/0233288 | A1 | 9/2008 | Clark |
| 2008/0237572 | A1 | 10/2008 | Chui et al. |
| 2008/0237604 | A1 | 10/2008 | Alshareef et al. |
| 2008/0241052 | A1 | 10/2008 | Hooper et al. |
| 2008/0241384 | A1 | 10/2008 | Jeong |
| 2008/0241387 | A1 | 10/2008 | Keto |
| 2008/0242116 | A1 | 10/2008 | Clark |
| 2008/0246101 | A1 | 10/2008 | Li et al. |
| 2008/0248310 | A1 | 10/2008 | Kim et al. |
| 2008/0248597 | A1 | 10/2008 | Qin et al. |
| 2008/0257102 | A1 | 10/2008 | Packer |
| 2008/0257494 | A1 | 10/2008 | Hayashi et al. |
| 2008/0260345 | A1 | 10/2008 | Mertesdorf et al. |
| 2008/0260963 | A1 | 10/2008 | Yoon et al. |
| 2008/0261405 | A1 | 10/2008 | Yang et al. |
| 2008/0261413 | A1 | 10/2008 | Mahajani |
| 2008/0264337 | A1 | 10/2008 | Sano et al. |
| 2008/0264443 | A1 | 10/2008 | Shrinivasan et al. |
| 2008/0267598 | A1 | 10/2008 | Nakamura |
| 2008/0268171 | A1 | 10/2008 | Ma et al. |
| 2008/0268635 | A1 | 10/2008 | Yu et al. |
| 2008/0272424 | A1 | 11/2008 | Kim et al. |
| 2008/0274369 | A1 | 11/2008 | Lee et al. |
| 2008/0276864 | A1 | 11/2008 | Koelmel et al. |
| 2008/0277647 | A1 | 11/2008 | Kouvetakis et al. |
| 2008/0277656 | A1 | 11/2008 | Park et al. |
| 2008/0277715 | A1 | 11/2008 | Ohmi et al. |
| 2008/0282970 | A1 | 11/2008 | Heys et al. |
| 2008/0283962 | A1 | 11/2008 | Dyer |
| 2008/0286463 | A1 | 11/2008 | Tiner et al. |
| 2008/0289574 | A1 | 11/2008 | Jacobs et al. |
| 2008/0289650 | A1 | 11/2008 | Arena |
| 2008/0289767 | A1 | 11/2008 | Tandou et al. |
| 2008/0291964 | A1 | 11/2008 | Shrimpling |
| 2008/0293198 | A1 | 11/2008 | Kojima et al. |
| 2008/0295872 | A1 | 12/2008 | Riker et al. |
| 2008/0298945 | A1 | 12/2008 | Cox |
| 2008/0299326 | A1 | 12/2008 | Fukazawa |
| 2008/0299758 | A1 | 12/2008 | Harada et al. |
| 2008/0302303 | A1 | 12/2008 | Choi et al. |
| 2008/0303744 | A1 | 12/2008 | Hirayama et al. |
| 2008/0305014 | A1 | 12/2008 | Honda |
| 2008/0305246 | A1 | 12/2008 | Choi et al. |
| 2008/0305443 | A1 | 12/2008 | Nakamura |
| 2008/0314319 | A1 | 12/2008 | Hamano et al. |
| 2008/0314892 | A1 | 12/2008 | Graham |
| 2008/0315292 | A1 | 12/2008 | Ji et al. |
| 2008/0317972 | A1 | 12/2008 | Hendriks |
| 2009/0000550 | A1 | 1/2009 | Tran et al. |
| 2009/0000551 | A1 | 1/2009 | Choi et al. |
| 2009/0000769 | A1 | 1/2009 | Lin et al. |
| 2009/0004875 | A1 | 1/2009 | Shen et al. |
| 2009/0011145 | A1 | 1/2009 | Yun |
| 2009/0011150 | A1 | 1/2009 | Jeon et al. |
| 2009/0011608 | A1 | 1/2009 | Nabatame |
| 2009/0014879 | A1 | 1/2009 | Park et al. |
| 2009/0017227 | A1 | 1/2009 | Fu et al. |
| 2009/0017631 | A1 | 1/2009 | Bencher |
| 2009/0017733 | A1 | 1/2009 | Takahashi et al. |
| 2009/0020072 | A1 | 1/2009 | Mizunaga et al. |
| 2009/0023229 | A1 | 1/2009 | Matsushita |
| 2009/0029503 | A1 | 1/2009 | Arai |
| 2009/0029528 | A1 | 1/2009 | Sanchez et al. |
| 2009/0029564 | A1 | 1/2009 | Yamashita et al. |
| 2009/0031954 | A1 | 2/2009 | Nishikido et al. |
| 2009/0033907 | A1 | 2/2009 | Watson |
| 2009/0035463 | A1 | 2/2009 | Dip |
| 2009/0035584 | A1 | 2/2009 | Tran et al. |
| 2009/0035927 | A1 | 2/2009 | Olsen et al. |
| 2009/0035946 | A1 | 2/2009 | Pierreux et al. |
| 2009/0035947 | A1 | 2/2009 | Horii |
| 2009/0036292 | A1 | 2/2009 | Sun et al. |
| 2009/0039475 | A1 | 2/2009 | Shioya |
| 2009/0041952 | A1 | 2/2009 | Yoon et al. |
| 2009/0041984 | A1 | 2/2009 | Mayers et al. |
| 2009/0042344 | A1 | 2/2009 | Ye et al. |
| 2009/0042408 | A1 | 2/2009 | Maeda |

(56) References Cited

U.S. PATENT DOCUMENTS

| | | | |
|---|---|---|---|
| 2009/0045749 | A1 | 2/2009 | Ganachev et al. |
| 2009/0045829 | A1 | 2/2009 | Awazu |
| 2009/0047426 | A1 | 2/2009 | Park et al. |
| 2009/0047433 | A1 | 2/2009 | Kim et al. |
| 2009/0047447 | A1 | 2/2009 | Sawin et al. |
| 2009/0050621 | A1 | 2/2009 | Awazu |
| 2009/0052498 | A1 | 2/2009 | Halpin et al. |
| 2009/0053023 | A1 | 2/2009 | Wakabayashi |
| 2009/0053900 | A1 | 2/2009 | Nozawa et al. |
| 2009/0053906 | A1 | 2/2009 | Miya et al. |
| 2009/0056112 | A1 | 3/2009 | Kobayashi |
| 2009/0056629 | A1 | 3/2009 | Katz et al. |
| 2009/0057269 | A1 | 3/2009 | Katz et al. |
| 2009/0060480 | A1 | 3/2009 | Herchen |
| 2009/0061083 | A1 | 3/2009 | Chiang et al. |
| 2009/0061644 | A1 | 3/2009 | Chiang et al. |
| 2009/0061647 | A1 | 3/2009 | Mallick et al. |
| 2009/0075490 | A1 | 3/2009 | Dussarrat |
| 2009/0075491 | A1 | 3/2009 | Liu et al. |
| 2009/0080136 | A1 | 3/2009 | Nagayama et al. |
| 2009/0081879 | A1 | 3/2009 | Sukekawa et al. |
| 2009/0084317 | A1 | 4/2009 | Wu |
| 2009/0085156 | A1 | 4/2009 | Dewey et al. |
| 2009/0087585 | A1 | 4/2009 | Lee et al. |
| 2009/0087964 | A1 | 4/2009 | Maeda et al. |
| 2009/0087967 | A1 | 4/2009 | Todd |
| 2009/0090382 | A1 | 4/2009 | Morisada |
| 2009/0093080 | A1 | 4/2009 | Choi et al. |
| 2009/0093094 | A1 | 4/2009 | Ye et al. |
| 2009/0093100 | A1 | 4/2009 | Xia et al. |
| 2009/0095221 | A1 | 4/2009 | Tam et al. |
| 2009/0104351 | A1 | 4/2009 | Kakegawa |
| 2009/0104594 | A1 | 4/2009 | Webb |
| 2009/0104789 | A1 | 4/2009 | Mallick et al. |
| 2009/0107404 | A1 | 4/2009 | Ogliari et al. |
| 2009/0108308 | A1 | 4/2009 | Yang et al. |
| 2009/0112458 | A1 | 4/2009 | Nakai |
| 2009/0115064 | A1 | 5/2009 | Sandhu et al. |
| 2009/0116936 | A1 | 5/2009 | Marubayashi et al. |
| 2009/0117717 | A1 | 5/2009 | Tomasini et al. |
| 2009/0117723 | A1 | 5/2009 | Kim et al. |
| 2009/0117746 | A1 | 5/2009 | Masuda |
| 2009/0120580 | A1 | 5/2009 | Kagoshima et al. |
| 2009/0122293 | A1 | 5/2009 | Shibazaki |
| 2009/0122458 | A1 | 5/2009 | Lischer et al. |
| 2009/0124131 | A1 | 5/2009 | Breunsbach et al. |
| 2009/0130331 | A1 | 5/2009 | Asai |
| 2009/0130859 | A1 | 5/2009 | Itatani et al. |
| 2009/0136665 | A1 | 5/2009 | Choi et al. |
| 2009/0136668 | A1 | 5/2009 | Gregg et al. |
| 2009/0136683 | A1 | 5/2009 | Fukasawa et al. |
| 2009/0137055 | A1 | 5/2009 | Bognar |
| 2009/0139657 | A1 | 6/2009 | Lee et al. |
| 2009/0142905 | A1 | 6/2009 | Yamazaki |
| 2009/0142933 | A1 | 6/2009 | Yajima et al. |
| 2009/0142935 | A1 | 6/2009 | Fukazawa et al. |
| 2009/0146322 | A1 | 6/2009 | Weling et al. |
| 2009/0147819 | A1 | 6/2009 | Goodman et al. |
| 2009/0155488 | A1 | 6/2009 | Nakano et al. |
| 2009/0156015 | A1 | 6/2009 | Park et al. |
| 2009/0156017 | A1 | 6/2009 | Fukazawa et al. |
| 2009/0159000 | A1 | 6/2009 | Aggarwal et al. |
| 2009/0159002 | A1 | 6/2009 | Bera et al. |
| 2009/0159424 | A1 | 6/2009 | Liu et al. |
| 2009/0162647 | A1 | 6/2009 | Sun et al. |
| 2009/0162996 | A1 | 6/2009 | Ramaswarmy et al. |
| 2009/0163038 | A1 | 6/2009 | Miyoshi |
| 2009/0165715 | A1 | 7/2009 | Oh |
| 2009/0165721 | A1 | 7/2009 | Pitney et al. |
| 2009/0165722 | A1 | 7/2009 | Ha |
| 2009/0166616 | A1 | 7/2009 | Uchiyama |
| 2009/0176018 | A1 | 7/2009 | Zou et al. |
| 2009/0179365 | A1 | 7/2009 | Lerner et al. |
| 2009/0183520 | A1 | 7/2009 | Yukimoto |
| 2009/0186479 | A1 | 7/2009 | Okabe et al. |
| 2009/0186571 | A1 | 7/2009 | Haro |
| 2009/0194233 | A1 | 8/2009 | Tamura et al. |
| 2009/0197015 | A1 | 8/2009 | Kudela et al. |
| 2009/0197411 | A1 | 8/2009 | Dussarrat et al. |
| 2009/0200494 | A1 | 8/2009 | Hatem |
| 2009/0200547 | A1 | 8/2009 | Griffin et al. |
| 2009/0204403 | A1 | 8/2009 | Hollander et al. |
| 2009/0206056 | A1 | 8/2009 | Xu |
| 2009/0209081 | A1 | 8/2009 | Matero |
| 2009/0211523 | A1 | 8/2009 | Kuppurao et al. |
| 2009/0211525 | A1 | 8/2009 | Sarigiannis et al. |
| 2009/0214825 | A1 | 8/2009 | Sun et al. |
| 2009/0217871 | A1 | 9/2009 | Kim et al. |
| 2009/0221149 | A1 | 9/2009 | Hammond et al. |
| 2009/0221151 | A1 | 9/2009 | Honda et al. |
| 2009/0223441 | A1 | 9/2009 | Arena et al. |
| 2009/0227094 | A1 | 9/2009 | Bateman |
| 2009/0230211 | A1 | 9/2009 | Kobayashi et al. |
| 2009/0232985 | A1 | 9/2009 | Dussarrat et al. |
| 2009/0236014 | A1 | 9/2009 | Wilson |
| 2009/0236276 | A1 | 9/2009 | Kurth et al. |
| 2009/0236315 | A1 | 9/2009 | Willwerth et al. |
| 2009/0239386 | A1 | 9/2009 | Suzaki et al. |
| 2009/0242130 | A1 | 10/2009 | Tian et al. |
| 2009/0242957 | A1 | 10/2009 | Ma et al. |
| 2009/0246374 | A1 | 10/2009 | Vukovic |
| 2009/0246399 | A1 | 10/2009 | Goundar |
| 2009/0246971 | A1 | 10/2009 | Reid et al. |
| 2009/0250004 | A1 | 10/2009 | Yamada et al. |
| 2009/0250955 | A1 | 10/2009 | Aoki |
| 2009/0255901 | A1 | 10/2009 | Okita |
| 2009/0256127 | A1 | 10/2009 | Feist et al. |
| 2009/0261331 | A1 | 10/2009 | Yang et al. |
| 2009/0266296 | A1 | 10/2009 | Tachibana et al. |
| 2009/0267135 | A1 | 10/2009 | Tanaka et al. |
| 2009/0267225 | A1 | 10/2009 | Eguchi |
| 2009/0269506 | A1 | 10/2009 | Okura et al. |
| 2009/0269507 | A1 | 10/2009 | Yu et al. |
| 2009/0269941 | A1 | 10/2009 | Raisanen |
| 2009/0275205 | A1 | 11/2009 | Kiehlbauch et al. |
| 2009/0275210 | A1 | 11/2009 | Shanker et al. |
| 2009/0277510 | A1 | 11/2009 | Shikata |
| 2009/0277874 | A1 | 11/2009 | Rui et al. |
| 2009/0280248 | A1 | 11/2009 | Goodman et al. |
| 2009/0283041 | A1 | 11/2009 | Tomiyasu et al. |
| 2009/0283217 | A1 | 11/2009 | Lubomirsky et al. |
| 2009/0284156 | A1 | 11/2009 | Banna et al. |
| 2009/0286400 | A1 | 11/2009 | Heo et al. |
| 2009/0286402 | A1 | 11/2009 | Xia et al. |
| 2009/0286405 | A1 | 11/2009 | Okesaku et al. |
| 2009/0289300 | A1 | 11/2009 | Sasaki et al. |
| 2009/0291208 | A1 | 11/2009 | Gordon et al. |
| 2009/0291566 | A1 | 11/2009 | Ueno et al. |
| 2009/0297696 | A1 | 12/2009 | Pore et al. |
| 2009/0297710 | A1 | 12/2009 | Lindfors |
| 2009/0297731 | A1 | 12/2009 | Goundar |
| 2009/0298257 | A1 | 12/2009 | Lee et al. |
| 2009/0302002 | A1 | 12/2009 | Collins et al. |
| 2009/0302434 | A1 | 12/2009 | Pallem et al. |
| 2009/0304558 | A1 | 12/2009 | Patton |
| 2009/0308315 | A1 | 12/2009 | de Ridder |
| 2009/0308425 | A1 | 12/2009 | Yednak |
| 2009/0311857 | A1 | 12/2009 | Todd et al. |
| 2009/0314208 | A1 | 12/2009 | Zhou et al. |
| 2009/0314309 | A1 | 12/2009 | Sankarakrishnan et al. |
| 2009/0315093 | A1 | 12/2009 | Li et al. |
| 2009/0317214 | A1 | 12/2009 | Hsiao et al. |
| 2009/0320754 | A1 | 12/2009 | Oya |
| 2009/0320881 | A1 | 12/2009 | Aitchison |
| 2009/0324971 | A1 | 12/2009 | De Vries et al. |
| 2009/0324989 | A1 | 12/2009 | Witz et al. |
| 2009/0325391 | A1 | 12/2009 | De Vusser et al. |
| 2009/0325469 | A1 | 12/2009 | Koo et al. |
| 2010/0000608 | A1 | 1/2010 | Goto et al. |
| 2010/0001409 | A1 | 1/2010 | Humbert et al. |
| 2010/0003406 | A1 | 1/2010 | Lam et al. |
| 2010/0006031 | A1 | 1/2010 | Choi et al. |
| 2010/0006923 | A1 | 1/2010 | Fujitsuka |
| 2010/0008656 | A1 | 1/2010 | Sorabji et al. |

(56) References Cited

U.S. PATENT DOCUMENTS

2010/0012036 A1 1/2010 Silva et al.
2010/0012153 A1 1/2010 Shigemoto et al.
2010/0014479 A1 1/2010 Kim
2010/0015813 A1 1/2010 McGinnis et al.
2010/0018460 A1 1/2010 Singh et al.
2010/0018913 A1 1/2010 Blum
2010/0022097 A1 1/2010 Yamoto et al.
2010/0024727 A1 2/2010 Kim et al.
2010/0024872 A1 2/2010 Kishimoto
2010/0025766 A1 2/2010 Nuttinck et al.
2010/0025796 A1 2/2010 Dabiran
2010/0031884 A1 2/2010 Aggarwal et al.
2010/0032587 A1 2/2010 Hosch et al.
2010/0032842 A1 2/2010 Herdt et al.
2010/0034719 A1 2/2010 Dussarrat et al.
2010/0038687 A1 2/2010 Klaus et al.
2010/0040441 A1 2/2010 Obikane
2010/0041179 A1 2/2010 Lee
2010/0041243 A1 2/2010 Cheng et al.
2010/0046321 A1 2/2010 McLaughlin et al.
2010/0050943 A1 3/2010 Kato et al.
2010/0051584 A1 3/2010 Okita et al.
2010/0051597 A1 3/2010 Morita et al.
2010/0055312 A1 3/2010 Kato et al.
2010/0055316 A1 3/2010 Honma
2010/0055318 A1 3/2010 Volf et al.
2010/0055442 A1 3/2010 Kellock
2010/0055898 A1 3/2010 Chang et al.
2010/0058984 A1 3/2010 Marubayashi
2010/0065758 A1 3/2010 Liu et al.
2010/0068009 A1 3/2010 Kimura
2010/0068383 A1 3/2010 Kato et al.
2010/0068414 A1 3/2010 Takahashi et al.
2010/0068891 A1 3/2010 Hatanaka et al.
2010/0075037 A1 3/2010 Marsh et al.
2010/0075488 A1 3/2010 Collins et al.
2010/0075507 A1 3/2010 Chang et al.
2010/0078601 A1 4/2010 Pallem et al.
2010/0078746 A1 4/2010 Jung
2010/0081094 A1 4/2010 Hasebe et al.
2010/0081293 A1 4/2010 Mallick et al.
2010/0086703 A1 4/2010 Mangum et al.
2010/0087069 A1 4/2010 Miya et al.
2010/0089320 A1 4/2010 Kim
2010/0089870 A1 4/2010 Hiroshima et al.
2010/0090149 A1 4/2010 Thompson et al.
2010/0092679 A1 4/2010 Lee et al.
2010/0092696 A1 4/2010 Shinriki
2010/0093187 A1 4/2010 Lee et al.
2010/0094430 A1 4/2010 Krumdieck
2010/0098862 A1 4/2010 Xu et al.
2010/0101728 A1 4/2010 Iwasaki
2010/0102417 A1 4/2010 Ganguli et al.
2010/0105936 A1 4/2010 Tada et al.
2010/0111648 A1 5/2010 Tamura et al.
2010/0112496 A1 5/2010 Nakajima et al.
2010/0116207 A1 5/2010 Givens
2010/0116208 A1 5/2010 Sangam
2010/0116209 A1 5/2010 Kato
2010/0119439 A1 5/2010 Shindou
2010/0119727 A1 5/2010 Takagi
2010/0119844 A1 5/2010 Sun et al.
2010/0120261 A1 5/2010 Kim et al.
2010/0121100 A1 5/2010 Shay
2010/0124610 A1 5/2010 Aikawa et al.
2010/0124618 A1 5/2010 Kobayashi et al.
2010/0124621 A1 5/2010 Kobayashi et al.
2010/0126415 A1 5/2010 Ishino et al.
2010/0126539 A1 5/2010 Lee et al.
2010/0126605 A1 5/2010 Stones
2010/0126666 A1 5/2010 Tandou et al.
2010/0129548 A1 5/2010 Sneh
2010/0129670 A1 5/2010 Sun et al.
2010/0129990 A1 5/2010 Nishizawa et al.
2010/0130015 A1 5/2010 Nakajima et al.
2010/0130017 A1 5/2010 Luo et al.
2010/0130105 A1 5/2010 Lee
2010/0133255 A1 6/2010 Bahng et al.
2010/0134023 A1 6/2010 Mills
2010/0136216 A1 6/2010 Tsuei et al.
2010/0140221 A1 6/2010 Kikuchi et al.
2010/0140684 A1 6/2010 Ozawa
2010/0143609 A1 6/2010 Fukazawa et al.
2010/0144150 A1 6/2010 Sills et al.
2010/0144162 A1 6/2010 Lee et al.
2010/0144968 A1 6/2010 Lee et al.
2010/0145547 A1 6/2010 Darabnia et al.
2010/0147396 A1 6/2010 Yamagishi et al.
2010/0151206 A1 6/2010 Wu et al.
2010/0159638 A1 6/2010 Jeong
2010/0159707 A1 6/2010 Huang et al.
2010/0162752 A1 7/2010 Tabata et al.
2010/0162956 A1 7/2010 Murakami et al.
2010/0163187 A1 7/2010 Yokogawa et al.
2010/0163524 A1 7/2010 Arai
2010/0163937 A1 7/2010 Clendenning
2010/0166630 A1 7/2010 Gu et al.
2010/0168404 A1 7/2010 Girolami et al.
2010/0170441 A1 7/2010 Won et al.
2010/0170868 A1 7/2010 Lin et al.
2010/0173432 A1 7/2010 White et al.
2010/0178137 A1 7/2010 Chintalapati et al.
2010/0178423 A1 7/2010 Shimizu et al.
2010/0180819 A1 7/2010 Hatanaka et al.
2010/0183825 A1 7/2010 Becker et al.
2010/0184302 A1 7/2010 Lee et al.
2010/0186669 A1 7/2010 Shin et al.
2010/0189923 A1 7/2010 Goundar et al.
2010/0193501 A1 8/2010 Zucker et al.
2010/0193955 A1 8/2010 Milligan et al.
2010/0195392 A1 8/2010 Freeman
2010/0195690 A1 8/2010 Moench et al.
2010/0197107 A1 8/2010 Matsuzaki
2010/0202860 A1 8/2010 Reed
2010/0203242 A1 8/2010 Borden
2010/0206767 A1 8/2010 Odashima et al.
2010/0209598 A1 8/2010 Xu et al.
2010/0210108 A1 8/2010 Ishizaka et al.
2010/0219757 A1 9/2010 Benzerrouk et al.
2010/0221452 A1 9/2010 Kang
2010/0224130 A1 9/2010 Smith et al.
2010/0227458 A1 9/2010 Chung et al.
2010/0229795 A1 9/2010 Tanabe
2010/0229965 A1 9/2010 Kashima et al.
2010/0230051 A1 9/2010 Iizuka
2010/0230863 A1 9/2010 Moench et al.
2010/0233885 A1 9/2010 Kushibiki et al.
2010/0233886 A1 9/2010 Yang et al.
2010/0236691 A1 9/2010 Yamazaki
2010/0243166 A1 9/2010 Hayashi et al.
2010/0244688 A1 9/2010 Braun et al.
2010/0246630 A1 9/2010 Kaszynski et al.
2010/0248465 A1 9/2010 Yi et al.
2010/0252434 A1 10/2010 Roy
2010/0255196 A1 10/2010 Geisler et al.
2010/0255198 A1 10/2010 Cleary et al.
2010/0255218 A1 10/2010 Oka et al.
2010/0255625 A1 10/2010 De Vries
2010/0255658 A1 10/2010 Aggarwal
2010/0258809 A1 10/2010 Muller
2010/0259152 A1 10/2010 Yasuda et al.
2010/0266765 A1 10/2010 White et al.
2010/0267224 A1 10/2010 Choi et al.
2010/0267248 A1 10/2010 Ma et al.
2010/0270675 A1 10/2010 Harada
2010/0275846 A1 11/2010 Kitagawa
2010/0279008 A1 11/2010 Takagi
2010/0279512 A1 11/2010 Udea et al.
2010/0282163 A1 11/2010 Aggarwal et al.
2010/0282170 A1 11/2010 Nishizawa
2010/0282645 A1 11/2010 Wang
2010/0285237 A1 11/2010 Ditizio et al.
2010/0285319 A1 11/2010 Kwak et al.
2010/0294199 A1 11/2010 Tran et al.

(56) References Cited

U.S. PATENT DOCUMENTS

2010/0297391 A1 11/2010 Kley
2010/0301752 A1 12/2010 Bakre et al.
2010/0304047 A1 12/2010 Yang et al.
2010/0307415 A1 12/2010 Shero et al.
2010/0317177 A1 12/2010 Huang et al.
2010/0317198 A1 12/2010 Antonelli
2010/0322604 A1 12/2010 Fondurulia et al.
2010/0322822 A1 12/2010 Fritchie et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 van Schravendijk
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089419 A1 4/2011 Yamazaki et al.
2011/0089469 A1 4/2011 Merckling
2011/0091650 A1 4/2011 Noguchi et al.
2011/0092077 A1 4/2011 Xu et al.
2011/0097901 A1 4/2011 Banna et al.
2011/0098841 A1 4/2011 Tsuda
2011/0100489 A1 5/2011 Orito et al.
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117728 A1 5/2011 Su et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0127702 A1 6/2011 Gautam et al.
2011/0132542 A1 6/2011 Ilzuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171380 A1 7/2011 Higashi et al.
2011/0171775 A1 7/2011 Yamamoto et al.
2011/0175011 A1 7/2011 Ehrne et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0186984 A1 8/2011 Saito et al.
2011/0192820 A1 8/2011 Yeom et al.
2011/0195574 A1 8/2011 Blasco et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0212625 A1 9/2011 Toyoda et al.
2011/0217838 A1 9/2011 Hsieh et al.
2011/0220874 A1 9/2011 Hanrath
2011/0223334 A1 9/2011 Yudovsky et al.
2011/0226421 A1 9/2011 Hayashi
2011/0232678 A1 9/2011 Shih et al.
2011/0236201 A1 9/2011 Shende
2011/0236594 A1 9/2011 Haverkamp et al.
2011/0236600 A1 9/2011 Fox et al.
2011/0237040 A1 9/2011 Ng et al.
2011/0237082 A1 9/2011 Nakajima et al.
2011/0239936 A1 10/2011 Suzaki et al.
2011/0239940 A1 10/2011 Benvenuti et al.
2011/0244673 A1 10/2011 Cho et al.
2011/0253044 A1 10/2011 Tam et al.
2011/0254052 A1 10/2011 Kouvetakis
2011/0256675 A1 10/2011 Avouris
2011/0256692 A1 10/2011 Tam et al.
2011/0256724 A1 10/2011 Chandrasekharan et al.
2011/0256726 A1 10/2011 Lavoie et al.
2011/0256727 A1 10/2011 Beynet et al.
2011/0256734 A1 10/2011 Hausmann et al.
2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.
2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0286819 A1 11/2011 Shibata et al.
2011/0291243 A1 12/2011 Seamons
2011/0294075 A1 12/2011 Chen et al.
2011/0294288 A1 12/2011 Lee et al.
2011/0297088 A1 12/2011 Song et al.
2011/0298062 A1 12/2011 Ganguli et al.
2011/0300720 A1 12/2011 Fu
2011/0305102 A1 12/2011 Berger et al.
2011/0305856 A1 12/2011 Bonn

(56) References Cited

U.S. PATENT DOCUMENTS

| | | | |
|---|---|---|---|
| 2011/0308453 | A1 | 12/2011 | Su et al. |
| 2011/0308460 | A1 | 12/2011 | Hong et al. |
| 2011/0312191 | A1 | 12/2011 | Ohkura et al. |
| 2011/0318142 | A1 | 12/2011 | Gage et al. |
| 2011/0318888 | A1 | 12/2011 | Komatsu et al. |
| 2011/0318935 | A1 | 12/2011 | Oyabu et al. |
| 2012/0001172 | A1 | 1/2012 | Shang et al. |
| 2012/0003500 | A1 | 1/2012 | Yoshida et al. |
| 2012/0003599 | A1 | 1/2012 | Patalay et al. |
| 2012/0003726 | A1 | 1/2012 | Jones et al. |
| 2012/0003831 | A1 | 1/2012 | Kang et al. |
| 2012/0006489 | A1 | 1/2012 | Okita |
| 2012/0009802 | A1 | 1/2012 | Lavoie |
| 2012/0012556 | A1 | 1/2012 | Matsumoto et al. |
| 2012/0021252 | A1 | 1/2012 | Lee |
| 2012/0024223 | A1 | 2/2012 | Torres et al. |
| 2012/0024227 | A1 | 2/2012 | Takasuka et al. |
| 2012/0024231 | A1 | 2/2012 | Horino |
| 2012/0024478 | A1 | 2/2012 | Huang et al. |
| 2012/0024479 | A1 | 2/2012 | Palagashvili et al. |
| 2012/0027547 | A1 | 2/2012 | Jager et al. |
| 2012/0028454 | A1 | 2/2012 | Swaminathan et al. |
| 2012/0028469 | A1 | 2/2012 | Onizawa et al. |
| 2012/0031333 | A1 | 2/2012 | Kurita et al. |
| 2012/0031500 | A1 | 2/2012 | Hirose et al. |
| 2012/0032311 | A1 | 2/2012 | Gates |
| 2012/0033695 | A1 | 2/2012 | Hayashi et al. |
| 2012/0034793 | A1 | 2/2012 | Narushima et al. |
| 2012/0036732 | A1 | 2/2012 | Varadarajan |
| 2012/0040097 | A1 | 2/2012 | Volf et al. |
| 2012/0040528 | A1 | 2/2012 | Kim et al. |
| 2012/0043556 | A1 | 2/2012 | Dube et al. |
| 2012/0043617 | A1 | 2/2012 | Nakagawa et al. |
| 2012/0046421 | A1 | 2/2012 | Darling et al. |
| 2012/0052681 | A1 | 3/2012 | Marsh |
| 2012/0055401 | A1 | 3/2012 | Tozawa |
| 2012/0058270 | A1 | 3/2012 | Winter et al. |
| 2012/0058630 | A1 | 3/2012 | Quinn |
| 2012/0064690 | A1 | 3/2012 | Hirota et al. |
| 2012/0064726 | A1 | 3/2012 | Nozawa et al. |
| 2012/0064764 | A1 | 3/2012 | Islam |
| 2012/0068242 | A1 | 3/2012 | Shin et al. |
| 2012/0070136 | A1 | 3/2012 | Koelmel et al. |
| 2012/0070997 | A1 | 3/2012 | Larson |
| 2012/0073400 | A1 | 3/2012 | Wang |
| 2012/0074533 | A1 | 3/2012 | Aoyama |
| 2012/0077349 | A1 | 3/2012 | Li et al. |
| 2012/0077350 | A1 | 3/2012 | Miya et al. |
| 2012/0080756 | A1 | 4/2012 | Suzuki |
| 2012/0083134 | A1 | 4/2012 | Wu et al. |
| 2012/0088031 | A1 | 4/2012 | Neel |
| 2012/0088369 | A1 | 4/2012 | Weidman et al. |
| 2012/0090704 | A1 | 4/2012 | Laverdiere et al. |
| 2012/0091522 | A1 | 4/2012 | Ozaki et al. |
| 2012/0094010 | A1 | 4/2012 | Sugiura et al. |
| 2012/0094468 | A1 | 4/2012 | Bhatia et al. |
| 2012/0098107 | A1 | 4/2012 | Raisanen et al. |
| 2012/0100464 | A1 | 4/2012 | Kageyama |
| 2012/0103264 | A1 | 5/2012 | Choi et al. |
| 2012/0103522 | A1 | 5/2012 | Hohenwarter |
| 2012/0103939 | A1 | 5/2012 | Wu et al. |
| 2012/0104514 | A1 | 5/2012 | Park et al. |
| 2012/0107607 | A1 | 5/2012 | Takaki et al. |
| 2012/0108039 | A1 | 5/2012 | Zajaji |
| 2012/0108048 | A1 | 5/2012 | Lim et al. |
| 2012/0111271 | A1 | 5/2012 | Begarney et al. |
| 2012/0114877 | A1 | 5/2012 | Lee |
| 2012/0115250 | A1 | 5/2012 | Ariga et al. |
| 2012/0115257 | A1 | 5/2012 | Matsuyam et al. |
| 2012/0119337 | A1 | 5/2012 | Sasaki et al. |
| 2012/0121823 | A1 | 5/2012 | Chhabra |
| 2012/0122275 | A1 | 5/2012 | Koo et al. |
| 2012/0122302 | A1 | 5/2012 | Weisman et al. |
| 2012/0122319 | A1 | 5/2012 | Shimizu |
| 2012/0125258 | A1 | 5/2012 | Lee |
| 2012/0126300 | A1 | 5/2012 | Park et al. |
| 2012/0128897 | A1 | 5/2012 | Xiao et al. |
| 2012/0135145 | A1 | 5/2012 | Je et al. |
| 2012/0139009 | A1 | 6/2012 | Ning et al. |
| 2012/0145078 | A1 | 6/2012 | Huang et al. |
| 2012/0146113 | A1 | 6/2012 | Suzuki et al. |
| 2012/0149207 | A1 | 6/2012 | Graff |
| 2012/0149213 | A1 | 6/2012 | Nittala |
| 2012/0156108 | A1 | 6/2012 | Fondurulia et al. |
| 2012/0156890 | A1 | 6/2012 | Yim et al. |
| 2012/0160172 | A1 | 6/2012 | Wamura et al. |
| 2012/0160809 | A1 | 6/2012 | Ishibashi et al. |
| 2012/0161126 | A1 | 6/2012 | Yamazaki |
| 2012/0161405 | A1 | 6/2012 | Mohn |
| 2012/0164327 | A1 | 6/2012 | Sato |
| 2012/0164837 | A1 | 6/2012 | Tan et al. |
| 2012/0164842 | A1 | 6/2012 | Watanabe |
| 2012/0164846 | A1 | 6/2012 | Ha et al. |
| 2012/0170170 | A1 | 7/2012 | Gros-Jean |
| 2012/0171391 | A1 | 7/2012 | Won |
| 2012/0171874 | A1 | 7/2012 | Thridandam et al. |
| 2012/0175518 | A1 | 7/2012 | Godet et al. |
| 2012/0175751 | A1 | 7/2012 | Gatineau et al. |
| 2012/0177845 | A1 | 7/2012 | Odedra et al. |
| 2012/0180719 | A1 | 7/2012 | Inoue et al. |
| 2012/0180954 | A1 | 7/2012 | Yang et al. |
| 2012/0183689 | A1 | 7/2012 | Suzuki et al. |
| 2012/0186521 | A1 | 7/2012 | Iwasaki et al. |
| 2012/0186573 | A1 | 7/2012 | Jdira et al. |
| 2012/0187083 | A1 | 7/2012 | Hashizume |
| 2012/0187305 | A1 | 7/2012 | Elam et al. |
| 2012/0187375 | A1 | 7/2012 | Guo et al. |
| 2012/0190178 | A1 | 7/2012 | Wang et al. |
| 2012/0190185 | A1 | 7/2012 | Rogers |
| 2012/0190208 | A1 | 7/2012 | Ozu et al. |
| 2012/0196048 | A1 | 8/2012 | Ueda |
| 2012/0196242 | A1 | 8/2012 | Volfovski et al. |
| 2012/0196450 | A1 | 8/2012 | Balseanu et al. |
| 2012/0202358 | A1 | 8/2012 | Gealy et al. |
| 2012/0206033 | A1 | 8/2012 | Matsuyama |
| 2012/0207456 | A1 | 8/2012 | Kim et al. |
| 2012/0212121 | A1 | 8/2012 | Lin |
| 2012/0213947 | A1 | 8/2012 | Lee |
| 2012/0214318 | A1 | 8/2012 | Fukazawa et al. |
| 2012/0216743 | A1 | 8/2012 | Itoh et al. |
| 2012/0219735 | A1 | 8/2012 | Bakker et al. |
| 2012/0219824 | A1 | 8/2012 | Prolier |
| 2012/0220139 | A1 | 8/2012 | Lee et al. |
| 2012/0222813 | A1 | 9/2012 | Pal et al. |
| 2012/0222815 | A1 | 9/2012 | Sabri et al. |
| 2012/0225192 | A1 | 9/2012 | Yudovsky et al. |
| 2012/0225561 | A1 | 9/2012 | Watanabe |
| 2012/0231611 | A1 | 9/2012 | Gatineau et al. |
| 2012/0231771 | A1 | 9/2012 | Marcus |
| 2012/0232340 | A1 | 9/2012 | Levy et al. |
| 2012/0238074 | A1 | 9/2012 | Santhanam et al. |
| 2012/0240858 | A1 | 9/2012 | Taniyama et al. |
| 2012/0241089 | A1 | 9/2012 | Dielmann et al. |
| 2012/0241411 | A1 | 9/2012 | Darling et al. |
| 2012/0244703 | A1 | 9/2012 | Nakayama et al. |
| 2012/0247386 | A1 | 10/2012 | Sanchez et al. |
| 2012/0252229 | A1 | 10/2012 | Timans et al. |
| 2012/0258257 | A1 | 10/2012 | Nguyen et al. |
| 2012/0263875 | A1 | 10/2012 | Brenninger et al. |
| 2012/0263876 | A1 | 10/2012 | Haukka et al. |
| 2012/0263887 | A1 | 10/2012 | Papasouliotis et al. |
| 2012/0264051 | A1 | 10/2012 | Angelov et al. |
| 2012/0264305 | A1 | 10/2012 | Nakano |
| 2012/0267048 | A1 | 10/2012 | Moyama et al. |
| 2012/0269962 | A1 | 10/2012 | Blomberg et al. |
| 2012/0269967 | A1 | 10/2012 | Yudovsky et al. |
| 2012/0270339 | A1 | 10/2012 | Xie et al. |
| 2012/0270384 | A1 | 10/2012 | Sanchez et al. |
| 2012/0270393 | A1 | 10/2012 | Pore et al. |
| 2012/0270407 | A1 | 10/2012 | Werner et al. |
| 2012/0273052 | A1 | 11/2012 | Ye et al. |
| 2012/0273162 | A1 | 11/2012 | Mahadeswaraswamy |
| 2012/0276306 | A1 | 11/2012 | Ueda |
| 2012/0288625 | A1 | 11/2012 | Furuya et al. |

(56) References Cited

U.S. PATENT DOCUMENTS

2012/0289053 A1 11/2012 Holland et al.
2012/0289056 A1 11/2012 Bergman et al.
2012/0289057 A1 11/2012 DeDontney
2012/0295427 A1 11/2012 Bauer
2012/0295449 A1 11/2012 Fukazawa
2012/0302055 A1 11/2012 Pore et al.
2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Hanada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1 12/2012 Isobayashi
2012/0320491 A1 12/2012 Doh et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2012/0329208 A1 12/2012 Pore et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011630 A1 1/2013 Sullivan et al.
2013/0011983 A1 1/2013 Tsai
2013/0011984 A1 1/2013 Wang et al.
2013/0012003 A1 1/2013 Haukka et al.
2013/0012034 A1 1/2013 Ahn et al.
2013/0014697 A1 1/2013 Kanayama
2013/0014896 A1 1/2013 Shoji et al.
2013/0017503 A1 1/2013 De Ridder et al.
2013/0019944 A1 1/2013 Hekmatshoar-Tabai et al.
2013/0019945 A1 1/2013 Hekmatshoar-Tabai et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037532 A1 2/2013 Volfovski et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0059415 A1 3/2013 Kato et al.
2013/0061755 A1 3/2013 Frederick
2013/0062753 A1 3/2013 Nguyen et al.
2013/0062839 A1 3/2013 Tschinderle et al.
2013/0064973 A1 3/2013 Chen et al.
2013/0065189 A1 3/2013 Yoshii et al.
2013/0068391 A1 3/2013 Mazzocco et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0075788 A1 3/2013 Tomabechi
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0085618 A1 4/2013 Ding
2013/0089667 A1 4/2013 Lai et al.
2013/0089716 A1 4/2013 Krishnamurthy et al.
2013/0089988 A1 4/2013 Wang et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.
2013/0109172 A1 5/2013 Collins et al.
2013/0109192 A1 5/2013 Hawkins et al.
2013/0112251 A1 5/2013 Hang et al.
2013/0113085 A1 5/2013 Michaelson et al.
2013/0115383 A1 5/2013 Lu et al.
2013/0115763 A1 5/2013 Takamure et al.
2013/0115768 A1 5/2013 Pore et al.
2013/0118405 A1 5/2013 Ho et al.
2013/0118895 A1 5/2013 Roozeboom et al.
2013/0119018 A1 5/2013 Kanarik et al.
2013/0122712 A1 5/2013 Kim et al.
2013/0122722 A1 5/2013 Cissell et al.
2013/0126515 A1 5/2013 Shero et al.
2013/0129577 A1 5/2013 Halpin et al.
2013/0130490 A1 5/2013 Lee et al.
2013/0134148 A1 5/2013 Tachikawa
2013/0137279 A1 5/2013 Yamamoto et al.
2013/0143401 A1 6/2013 Yu et al.
2013/0143415 A1 6/2013 Yudovsky et al.
2013/0145587 A1 6/2013 Adhiprakasha
2013/0145984 A1 6/2013 Zhang et al.
2013/0147050 A1 6/2013 Bonner, III et al.
2013/0149874 A1 6/2013 Hirose et al.
2013/0152933 A1 6/2013 Lischer et al.
2013/0157409 A1 6/2013 Vaidya
2013/0157521 A1 6/2013 Aldrich et al.
2013/0160709 A1 6/2013 White et al.
2013/0161629 A1 6/2013 Han et al.
2013/0162142 A1 6/2013 Nishino et al.
2013/0164458 A1 6/2013 Soininen et al.
2013/0168353 A1 7/2013 Okita et al.
2013/0168354 A1 7/2013 Kanarik
2013/0171818 A1 7/2013 Kim et al.
2013/0175596 A1 7/2013 Cheng et al.
2013/0177706 A1 7/2013 Baluja et al.
2013/0180448 A1 7/2013 Sakaue et al.
2013/0183814 A1 7/2013 Huang et al.
2013/0186340 A1 7/2013 Omori et al.
2013/0189635 A1 7/2013 Lim et al.
2013/0189854 A1 7/2013 Hausmann et al.
2013/0196502 A1 8/2013 Haukka et al.
2013/0196507 A1 8/2013 Ma et al.
2013/0200518 A1 8/2013 Ahmed et al.
2013/0202387 A1 8/2013 Hiroki
2013/0203258 A1 8/2013 Chen et al.
2013/0203266 A1 8/2013 Hintze
2013/0203267 A1 8/2013 Pomarede et al.
2013/0206066 A1 8/2013 Han et al.
2013/0209940 A1 8/2013 Sakamoto et al.
2013/0210241 A1 8/2013 Lavoie et al.
2013/0213300 A1 8/2013 Sung et al.
2013/0214232 A1 8/2013 Tendulkar et al.
2013/0216710 A1 8/2013 Masuda et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0219853 A1 8/2013 Little et al.
2013/0220550 A1 8/2013 Koo et al.
2013/0224964 A1 8/2013 Fukazawa
2013/0228225 A1 9/2013 Leeser

(56) References Cited

U.S. PATENT DOCUMENTS

| | | | |
|---|---|---|---|
| 2013/0228902 | A1 | 9/2013 | Tomizawa et al. |
| 2013/0230814 | A1 | 9/2013 | Dunn et al. |
| 2013/0230987 | A1 | 9/2013 | Draeger et al. |
| 2013/0234203 | A1 | 9/2013 | Tsai et al. |
| 2013/0242287 | A1 | 9/2013 | Schlezinger |
| 2013/0247937 | A1 | 9/2013 | Nunomura et al. |
| 2013/0256265 | A1 | 10/2013 | Darling et al. |
| 2013/0256838 | A1 | 10/2013 | Sanchez et al. |
| 2013/0256962 | A1 | 10/2013 | Ranish |
| 2013/0260371 | A1 | 10/2013 | Holt |
| 2013/0264659 | A1 | 10/2013 | Jung |
| 2013/0267045 | A1 | 10/2013 | Lee et al. |
| 2013/0269609 | A1 | 10/2013 | Leeser |
| 2013/0269612 | A1 | 10/2013 | Cheng et al. |
| 2013/0270600 | A1 | 10/2013 | Helander et al. |
| 2013/0270676 | A1 | 10/2013 | Lindert et al. |
| 2013/0273330 | A1 | 10/2013 | Wang et al. |
| 2013/0276978 | A1 | 10/2013 | Bluck et al. |
| 2013/0280891 | A1 | 10/2013 | Kim et al. |
| 2013/0285155 | A1 | 10/2013 | Glass |
| 2013/0287526 | A1 | 10/2013 | Bluck et al. |
| 2013/0288427 | A1 | 10/2013 | Hung et al. |
| 2013/0288471 | A1 | 10/2013 | Chi |
| 2013/0288480 | A1 | 10/2013 | Sanchez et al. |
| 2013/0288485 | A1 | 10/2013 | Liang et al. |
| 2013/0292047 | A1 | 11/2013 | Tian et al. |
| 2013/0292676 | A1 | 11/2013 | Milligan et al. |
| 2013/0292807 | A1 | 11/2013 | Raisanen et al. |
| 2013/0295779 | A1 | 11/2013 | Chandra et al. |
| 2013/0299944 | A1 | 11/2013 | Lai et al. |
| 2013/0302520 | A1 | 11/2013 | Wang et al. |
| 2013/0302999 | A1 | 11/2013 | Won et al. |
| 2013/0303803 | A1 | 11/2013 | Doerr et al. |
| 2013/0309876 | A1 | 11/2013 | Ogawa |
| 2013/0312663 | A1 | 11/2013 | Khosla et al. |
| 2013/0313656 | A1 | 11/2013 | Tong |
| 2013/0319290 | A1 | 12/2013 | Xiao et al. |
| 2013/0320429 | A1 | 12/2013 | Thomas |
| 2013/0323435 | A1 | 12/2013 | Xiao et al. |
| 2013/0323859 | A1 | 12/2013 | Chen et al. |
| 2013/0323935 | A1 | 12/2013 | Suzuki et al. |
| 2013/0330165 | A1 | 12/2013 | Wimplinger |
| 2013/0330911 | A1 | 12/2013 | Huang et al. |
| 2013/0330933 | A1 | 12/2013 | Fukazawa et al. |
| 2013/0333619 | A1 | 12/2013 | Omari |
| 2013/0337172 | A1 | 12/2013 | Lee |
| 2013/0337583 | A1 | 12/2013 | Kobayashi et al. |
| 2013/0337639 | A1 | 12/2013 | Ivanstov et al. |
| 2013/0337653 | A1 | 12/2013 | Kovalgin et al. |
| 2013/0340619 | A1 | 12/2013 | Tammera |
| 2013/0340678 | A1 | 12/2013 | Wamura et al. |
| 2013/0344248 | A1 | 12/2013 | Clark |
| 2014/0000843 | A1 | 1/2014 | Dunn et al. |
| 2014/0001520 | A1 | 1/2014 | Glass |
| 2014/0004274 | A1 | 1/2014 | Thompson |
| 2014/0007808 | A1 | 1/2014 | Okabe et al. |
| 2014/0014642 | A1 | 1/2014 | Elliot et al. |
| 2014/0014644 | A1 | 1/2014 | Akiba et al. |
| 2014/0015108 | A1 | 1/2014 | Kim et al. |
| 2014/0015186 | A1 | 1/2014 | Wessel et al. |
| 2014/0017408 | A1 | 1/2014 | Gandikota et al. |
| 2014/0017414 | A1 | 1/2014 | Fukazawa et al. |
| 2014/0017908 | A1 | 1/2014 | Beynet et al. |
| 2014/0020619 | A1 | 1/2014 | Vincent et al. |
| 2014/0020764 | A1 | 1/2014 | Woelk et al. |
| 2014/0020839 | A1 | 1/2014 | Kenney et al. |
| 2014/0023794 | A1 | 1/2014 | Mahajani et al. |
| 2014/0024223 | A1 | 1/2014 | Kilpi et al. |
| 2014/0027884 | A1 | 1/2014 | Tang et al. |
| 2014/0030447 | A1 | 1/2014 | Lee |
| 2014/0033978 | A1 | 2/2014 | Adachi et al. |
| 2014/0034240 | A1 | 2/2014 | Kim et al. |
| 2014/0034632 | A1 | 2/2014 | Pan et al. |
| 2014/0036274 | A1 | 2/2014 | Marquardt et al. |
| 2014/0045324 | A1 | 2/2014 | Brabant et al. |
| 2014/0045342 | A1 | 2/2014 | Mallick et al. |
| 2014/0047705 | A1 | 2/2014 | Singh |
| 2014/0048765 | A1 | 2/2014 | Ma et al. |
| 2014/0053866 | A1 | 2/2014 | Baluja et al. |
| 2014/0056679 | A1 | 2/2014 | Yamabe et al. |
| 2014/0056770 | A1 | 2/2014 | Bedard et al. |
| 2014/0057187 | A1 | 2/2014 | Suzuki et al. |
| 2014/0057454 | A1 | 2/2014 | Subramonium |
| 2014/0058179 | A1 | 2/2014 | Stevens et al. |
| 2014/0060147 | A1 | 3/2014 | Sarin et al. |
| 2014/0060572 | A1 | 3/2014 | Yasumuro et al. |
| 2014/0061770 | A1 | 3/2014 | Lee |
| 2014/0062304 | A1 | 3/2014 | Nakano et al. |
| 2014/0065841 | A1 | 3/2014 | Matero |
| 2014/0067110 | A1 | 3/2014 | Lawson et al. |
| 2014/0072710 | A1 | 3/2014 | Valle |
| 2014/0072726 | A1 | 3/2014 | Kim |
| 2014/0072925 | A1 | 3/2014 | Kaneko |
| 2014/0073082 | A1 | 3/2014 | Song |
| 2014/0073143 | A1 | 3/2014 | Alokozai et al. |
| 2014/0076861 | A1 | 3/2014 | Cornelius et al. |
| 2014/0077240 | A1 | 3/2014 | Roucka et al. |
| 2014/0080314 | A1 | 3/2014 | Sasajima et al. |
| 2014/0084341 | A1 | 3/2014 | Weeks |
| 2014/0087490 | A1 | 3/2014 | Kahlon |
| 2014/0087544 | A1 | 3/2014 | Tolle |
| 2014/0087564 | A1 | 3/2014 | Shimizu et al. |
| 2014/0094027 | A1 | 4/2014 | Azumo et al. |
| 2014/0096716 | A1 | 4/2014 | Chung et al. |
| 2014/0097468 | A1 | 4/2014 | Okita |
| 2014/0099794 | A1 | 4/2014 | Ingle et al. |
| 2014/0099798 | A1 | 4/2014 | Tsuji |
| 2014/0103145 | A1 | 4/2014 | White et al. |
| 2014/0106574 | A1 | 4/2014 | Kang et al. |
| 2014/0110798 | A1 | 4/2014 | Cai |
| 2014/0113457 | A1 | 4/2014 | Sims |
| 2014/0116335 | A1 | 5/2014 | Tsuji et al. |
| 2014/0117380 | A1 | 5/2014 | Loboda et al. |
| 2014/0120312 | A1 | 5/2014 | He et al. |
| 2014/0120487 | A1 | 5/2014 | Kaneko |
| 2014/0120678 | A1 | 5/2014 | Shinriki et al. |
| 2014/0120723 | A1 | 5/2014 | Fu et al. |
| 2014/0120738 | A1 | 5/2014 | Jung |
| 2014/0120750 | A1 | 5/2014 | Johnson |
| 2014/0127422 | A1 | 5/2014 | Shao et al. |
| 2014/0127907 | A1 | 5/2014 | Yang |
| 2014/0130687 | A1 | 5/2014 | Shibusawa et al. |
| 2014/0138779 | A1 | 5/2014 | Xie et al. |
| 2014/0141165 | A1 | 5/2014 | Sato et al. |
| 2014/0141625 | A1 | 5/2014 | Fukazawa et al. |
| 2014/0141674 | A1 | 5/2014 | Galbreath et al. |
| 2014/0144375 | A1 | 5/2014 | Kim et al. |
| 2014/0144500 | A1 | 5/2014 | Cao et al. |
| 2014/0145332 | A1 | 5/2014 | Ryan et al. |
| 2014/0147587 | A1 | 5/2014 | Endo et al. |
| 2014/0148924 | A1 | 5/2014 | Brak et al. |
| 2014/0158154 | A1 | 6/2014 | Kondo et al. |
| 2014/0158786 | A1 | 6/2014 | Santo |
| 2014/0159170 | A1 | 6/2014 | Raisanen et al. |
| 2014/0162401 | A1 | 6/2014 | Kawano et al. |
| 2014/0167187 | A1 | 6/2014 | Kuo et al. |
| 2014/0170320 | A1 | 6/2014 | Yamamoto et al. |
| 2014/0170335 | A1 | 6/2014 | Shao et al. |
| 2014/0174354 | A1 | 6/2014 | Arai |
| 2014/0174357 | A1 | 6/2014 | Kim et al. |
| 2014/0174927 | A1 | 6/2014 | Bashir et al. |
| 2014/0175054 | A1 | 6/2014 | Carlson et al. |
| 2014/0179091 | A1 | 6/2014 | Clark |
| 2014/0179092 | A1 | 6/2014 | Kim |
| 2014/0182053 | A1 | 7/2014 | Huang |
| 2014/0182689 | A1 | 7/2014 | Shareef et al. |
| 2014/0187022 | A1 | 7/2014 | Falster et al. |
| 2014/0187045 | A1 | 7/2014 | Hua et al. |
| 2014/0190581 | A1 | 7/2014 | Nagase et al. |
| 2014/0191389 | A1 | 7/2014 | Lee et al. |
| 2014/0193983 | A1 | 7/2014 | Lavoie |
| 2014/0202382 | A1 | 7/2014 | Kim et al. |
| 2014/0202386 | A1 | 7/2014 | Taga |
| 2014/0202388 | A1 | 7/2014 | Um et al. |

(56) References Cited

U.S. PATENT DOCUMENTS

2014/0209976 A1 7/2014 Yang et al.
2014/0213061 A1 7/2014 Huang et al.
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.
2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0242808 A1 8/2014 Akiyama et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0252710 A1 9/2014 Cuvalci et al.
2014/0256160 A1 9/2014 Wada et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0271081 A1 9/2014 Lavitsky et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0327117 A1 11/2014 Bencher et al.
2014/0339981 A1 11/2014 Komatsu et al.
2014/0346142 A1 11/2014 Chapuis et al.
2014/0346600 A1 11/2014 Cheng et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0360430 A1 12/2014 Armour et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0004806 A1 1/2015 Ndiege et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024567 A1 1/2015 Tsai et al.
2015/0024609 A1 1/2015 Milligan et al.
2015/0030766 A1 1/2015 Lind et al.
2015/0030782 A1 1/2015 Ivanov et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa et al.
2015/0061078 A1 3/2015 Abel et al.
2015/0064923 A1 3/2015 Matsumoto et al.
2015/0069354 A1 3/2015 Helander et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.
2015/0087139 A1 3/2015 O'Neill et al.
2015/0087154 A1 3/2015 Guha et al.
2015/0091057 A1 4/2015 Xie et al.
2015/0091134 A1 4/2015 Amaratunga et al.
2015/0094470 A1 4/2015 Sanchez et al.
2015/0096973 A1 4/2015 Dunn et al.
2015/0099065 A1 4/2015 Canizares et al.
2015/0099072 A1 4/2015 Takamure et al.
2015/0099123 A1 4/2015 Barbee et al.
2015/0099342 A1 4/2015 Tsai
2015/0099374 A1 4/2015 Kakimoto et al.
2015/0099375 A1 4/2015 Haripin et al.
2015/0102466 A1 4/2015 Colinge
2015/0104574 A1 4/2015 Lee et al.
2015/0104575 A1 4/2015 Takoudis et al.
2015/0110147 A1 4/2015 Mizuno
2015/0110968 A1 4/2015 Lavoie et al.
2015/0111374 A1 4/2015 Bao
2015/0111395 A1 4/2015 Hashimoto et al.
2015/0114295 A1 4/2015 Kim et al.
2015/0118009 A1 4/2015 Hsieh et al.
2015/0118846 A1 4/2015 Isii et al.
2015/0118863 A1 4/2015 Rathod et al.
2015/0122180 A1 5/2015 Chang et al.
2015/0125628 A1 5/2015 Kim et al.
2015/0126036 A1 5/2015 Zhao
2015/0132212 A1 5/2015 Winkler et al.
2015/0132953 A1 5/2015 Nowling et al.
2015/0137315 A1 5/2015 Chen et al.
2015/0140210 A1 5/2015 Jung et al.
2015/0144060 A1 5/2015 Park
2015/0147482 A1 5/2015 Kang et al.
2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155140 A1 6/2015 Lee et al.
2015/0155177 A1 6/2015 Zhang et al.
2015/0155370 A1 6/2015 Tsai et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Barik et al.
2015/0167165 A1 6/2015 Lindfors
2015/0167705 A1 6/2015 Lee et al.
2015/0170907 A1 6/2015 Haukka et al.
2015/0170914 A1 6/2015 Haukka et al.
2015/0170945 A1 6/2015 Segawa et al.

(56) References Cited

U.S. PATENT DOCUMENTS

2015/0170947 A1 6/2015 Bluck
2015/0170954 A1 6/2015 Agarwal
2015/0170975 A1 6/2015 Blatchford et al.
2015/0171177 A1 6/2015 Cheng et al.
2015/0174768 A1 6/2015 Rodnick
2015/0175467 A1 6/2015 Denifl et al.
2015/0176124 A1 6/2015 Greer et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0247259 A1 9/2015 Hekmatshoar-Tabari et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins
2015/0267301 A1 9/2015 Hill et al.
2015/0270140 A1 9/2015 Gupta et al.
2015/0270146 A1 9/2015 Yoshihara et al.
2015/0275355 A1 10/2015 Mallikarjunan et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0303056 A1 10/2015 Varadarajan et al.
2015/0307982 A1 10/2015 Firouzdor et al.
2015/0307989 A1 10/2015 Lindfors
2015/0308586 A1 10/2015 Shugrue et al.
2015/0311043 A1 10/2015 Sun et al.
2015/0311151 A1 10/2015 Chi et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340266 A1 11/2015 Ngo et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.

(56) References Cited

U.S. PATENT DOCUMENTS

| | | | |
|---|---|---|---|
| 2016/0133307 | A1 | 5/2016 | Lee et al. |
| 2016/0133504 | A1 | 5/2016 | Chu et al. |
| 2016/0133628 | A1 | 5/2016 | Xie |
| 2016/0141172 | A1 | 5/2016 | Kang |
| 2016/0145738 | A1 | 5/2016 | Liu et al. |
| 2016/0148800 | A1 | 5/2016 | Henri et al. |
| 2016/0148801 | A1 | 5/2016 | Yabe et al. |
| 2016/0148806 | A1 | 5/2016 | Henri et al. |
| 2016/0148811 | A1 | 5/2016 | Nakatani et al. |
| 2016/0148821 | A1 | 5/2016 | Singh |
| 2016/0152649 | A1 | 6/2016 | Gordon |
| 2016/0153088 | A1 | 6/2016 | Tsuji et al. |
| 2016/0155629 | A1 | 6/2016 | Hawryluk et al. |
| 2016/0163556 | A1 | 6/2016 | Briggs et al. |
| 2016/0163558 | A1 | 6/2016 | Hudson et al. |
| 2016/0163561 | A1 | 6/2016 | Hudson et al. |
| 2016/0163711 | A1 | 6/2016 | Arndt et al. |
| 2016/0163972 | A1 | 6/2016 | Swaminathan et al. |
| 2016/0168699 | A1 | 6/2016 | Fukazawa et al. |
| 2016/0168704 | A1 | 6/2016 | Choi et al. |
| 2016/0169766 | A1 | 6/2016 | Ishibashi et al. |
| 2016/0172189 | A1 | 6/2016 | Tapily |
| 2016/0172296 | A1 | 6/2016 | Lim et al. |
| 2016/0175805 | A1 | 6/2016 | Catchpole et al. |
| 2016/0177448 | A1 | 6/2016 | Ikeda |
| 2016/0181117 | A1 | 6/2016 | Arghavani et al. |
| 2016/0181128 | A1 | 6/2016 | Mori |
| 2016/0181368 | A1 | 6/2016 | Weeks |
| 2016/0190137 | A1 | 6/2016 | Tsai et al. |
| 2016/0195331 | A1 | 7/2016 | Hyon et al. |
| 2016/0196969 | A1 | 7/2016 | Berry et al. |
| 2016/0196970 | A1 | 7/2016 | Takamure et al. |
| 2016/0203995 | A1 | 7/2016 | Kanarik et al. |
| 2016/0204005 | A1 | 7/2016 | Oki et al. |
| 2016/0204436 | A1 | 7/2016 | Barker et al. |
| 2016/0211135 | A1 | 7/2016 | Noda et al. |
| 2016/0211147 | A1 | 7/2016 | Fukazawa |
| 2016/0211166 | A1 | 7/2016 | Yan et al. |
| 2016/0215387 | A1 | 7/2016 | Liu et al. |
| 2016/0217857 | A1 | 7/2016 | Paudel |
| 2016/0218028 | A1 | 7/2016 | Schaller et al. |
| 2016/0222504 | A1 | 8/2016 | Haukka et al. |
| 2016/0222509 | A1 | 8/2016 | Honma |
| 2016/0222516 | A1 | 8/2016 | Ikeda et al. |
| 2016/0225588 | A1 | 8/2016 | Shaikh et al. |
| 2016/0225607 | A1 | 8/2016 | Yamamoto et al. |
| 2016/0225632 | A1 | 8/2016 | Shaikh et al. |
| 2016/0237559 | A1 | 8/2016 | Tsuji |
| 2016/0245704 | A1 | 8/2016 | Osaka et al. |
| 2016/0256187 | A1 | 9/2016 | Shelton et al. |
| 2016/0268102 | A1 | 9/2016 | White |
| 2016/0268107 | A1 | 9/2016 | White |
| 2016/0273095 | A1 | 9/2016 | Lin et al. |
| 2016/0273101 | A1 | 9/2016 | Komori et al. |
| 2016/0273106 | A1 | 9/2016 | Kanjolia et al. |
| 2016/0273128 | A1 | 9/2016 | Kang |
| 2016/0276148 | A1 | 9/2016 | Qian et al. |
| 2016/0276212 | A1 | 9/2016 | Horikoshi |
| 2016/0279629 | A1 | 9/2016 | Michishita et al. |
| 2016/0281223 | A1 | 9/2016 | Sowa et al. |
| 2016/0281230 | A1 | 9/2016 | Varadarajan et al. |
| 2016/0284517 | A1 | 9/2016 | Saido |
| 2016/0284542 | A1 | 9/2016 | Noda et al. |
| 2016/0289828 | A1 | 10/2016 | Shero et al. |
| 2016/0293398 | A1 | 10/2016 | Danek et al. |
| 2016/0293609 | A1 | 10/2016 | Jha et al. |
| 2016/0305015 | A1 | 10/2016 | Nakamura et al. |
| 2016/0307739 | A1 | 10/2016 | Lee et al. |
| 2016/0307740 | A1 | 10/2016 | Kim et al. |
| 2016/0307766 | A1 | 10/2016 | Jongbloed et al. |
| 2016/0312360 | A1 | 10/2016 | Rasheed et al. |
| 2016/0314960 | A1 | 10/2016 | Cheng et al. |
| 2016/0314962 | A1 | 10/2016 | Higashino et al. |
| 2016/0314964 | A1 | 10/2016 | Tang et al. |
| 2016/0314967 | A1 | 10/2016 | Tolle |
| 2016/0315168 | A1 | 10/2016 | Dussarrat et al. |
| 2016/0334709 | A1 | 11/2016 | Huli et al. |
| 2016/0336178 | A1 | 11/2016 | Swaminathan et al. |
| 2016/0336392 | A1 | 11/2016 | Tominaga et al. |
| 2016/0343612 | A1 | 11/2016 | Wang et al. |
| 2016/0345384 | A1 | 11/2016 | Zhang et al. |
| 2016/0351413 | A1 | 12/2016 | Schmidt et al. |
| 2016/0351747 | A1 | 12/2016 | Forrest et al. |
| 2016/0358772 | A1 | 12/2016 | Xie |
| 2016/0362783 | A1 | 12/2016 | Tolle et al. |
| 2016/0362813 | A1 | 12/2016 | Bao et al. |
| 2016/0365280 | A1 | 12/2016 | Brink et al. |
| 2016/0365414 | A1 | 12/2016 | Peng et al. |
| 2016/0372321 | A1 | 12/2016 | Krishnan et al. |
| 2016/0372365 | A1 | 12/2016 | Tang et al. |
| 2016/0372744 | A1 | 12/2016 | Essaki et al. |
| 2016/0376700 | A1 | 12/2016 | Haukka |
| 2016/0376701 | A1 | 12/2016 | Takewaki et al. |
| 2016/0376704 | A1 | 12/2016 | Raisanen |
| 2016/0379826 | A9 | 12/2016 | Arghavani et al. |
| 2016/0379851 | A1 | 12/2016 | Swaminathan et al. |
| 2016/0381732 | A1 | 12/2016 | Moench et al. |
| 2017/0009347 | A1 | 1/2017 | Jang et al. |
| 2017/0009367 | A1 | 1/2017 | Harris et al. |
| 2017/0011889 | A1 | 1/2017 | Winkler et al. |
| 2017/0011926 | A1 | 1/2017 | Harada et al. |
| 2017/0011950 | A1 | 1/2017 | Schmotzer |
| 2017/0018477 | A1 | 1/2017 | Kato |
| 2017/0018570 | A1 | 1/2017 | Lue et al. |
| 2017/0022612 | A1 | 1/2017 | Lei et al. |
| 2017/0025280 | A1 | 1/2017 | Milligan |
| 2017/0025291 | A1 | 1/2017 | Lin |
| 2017/0029945 | A1 | 2/2017 | Kamakura |
| 2017/0032942 | A1 | 2/2017 | Walfried |
| 2017/0032943 | A1 | 2/2017 | Spaulding et al. |
| 2017/0032992 | A1 | 2/2017 | Hoechbauer |
| 2017/0033004 | A1 | 2/2017 | Siew et al. |
| 2017/0037513 | A1 | 2/2017 | Haukka |
| 2017/0040146 | A1 | 2/2017 | Huang et al. |
| 2017/0040164 | A1 | 2/2017 | Wang et al. |
| 2017/0040198 | A1 | 2/2017 | Lin et al. |
| 2017/0040206 | A1 | 2/2017 | Schmotzer et al. |
| 2017/0044664 | A1 | 2/2017 | Dussarrat et al. |
| 2017/0044665 | A1 | 2/2017 | Shon et al. |
| 2017/0044666 | A1 | 2/2017 | Jang et al. |
| 2017/0047446 | A1 | 2/2017 | Margetis et al. |
| 2017/0051402 | A1 | 2/2017 | Mori |
| 2017/0051405 | A1 | 2/2017 | Fukazawa et al. |
| 2017/0051406 | A1 | 2/2017 | Mori et al. |
| 2017/0051408 | A1 | 2/2017 | Kosuke et al. |
| 2017/0053811 | A1 | 2/2017 | Fung et al. |
| 2017/0058402 | A1 | 3/2017 | Wenxu et al. |
| 2017/0062204 | A1 | 3/2017 | Suzuki et al. |
| 2017/0062209 | A1 | 3/2017 | Shiba |
| 2017/0062210 | A1 | 3/2017 | Visser et al. |
| 2017/0062218 | A1 | 3/2017 | Duan et al. |
| 2017/0062224 | A1 | 3/2017 | Fu et al. |
| 2017/0062258 | A1 | 3/2017 | Bluck |
| 2017/0069725 | A1 | 3/2017 | Bhimarasetti et al. |
| 2017/0091320 | A1 | 3/2017 | Psota et al. |
| 2017/0092469 | A1 | 3/2017 | Kurita et al. |
| 2017/0092531 | A1 | 3/2017 | Coomer |
| 2017/0092535 | A1 | 3/2017 | Kimihiko et al. |
| 2017/0092847 | A1 | 3/2017 | Kim et al. |
| 2017/0100742 | A1 | 4/2017 | Pore et al. |
| 2017/0102612 | A1 | 4/2017 | Meyers et al. |
| 2017/0103907 | A1 | 4/2017 | Chu et al. |
| 2017/0104061 | A1 | 4/2017 | Peng et al. |
| 2017/0107621 | A1 | 4/2017 | Suemori |
| 2017/0110313 | A1 | 4/2017 | Tang et al. |
| 2017/0110601 | A1 | 4/2017 | Blomberg et al. |
| 2017/0114460 | A1 | 4/2017 | Kim et al. |
| 2017/0114464 | A1 | 4/2017 | Iriuda et al. |
| 2017/0114465 | A1 | 4/2017 | Kalutarage et al. |
| 2017/0117141 | A1 | 4/2017 | Zhu et al. |
| 2017/0117202 | A1 | 4/2017 | Tang et al. |
| 2017/0117203 | A1 | 4/2017 | Tang et al. |
| 2017/0117222 | A1 | 4/2017 | Kim et al. |
| 2017/0121845 | A1 | 5/2017 | Grutzmacher et al. |

(56) References Cited

U.S. PATENT DOCUMENTS

2017/0130332 A1 5/2017 Stumpf
2017/0136578 A1 5/2017 Yoshimura
2017/0140924 A1 5/2017 Suzuki et al.
2017/0140925 A1 5/2017 Suzuki et al.
2017/0145564 A1 5/2017 Bertuch et al.
2017/0146909 A1 5/2017 Smith
2017/0148918 A1 5/2017 Ye et al.
2017/0152968 A1 6/2017 Raj et al.
2017/0154757 A1 6/2017 Winkler et al.
2017/0154770 A1 6/2017 Margetis et al.
2017/0154895 A1 6/2017 Huo
2017/0159177 A1 6/2017 Monsma et al.
2017/0165624 A1 6/2017 Ravoin et al.
2017/0167023 A1 6/2017 Proia et al.
2017/0170033 A1 6/2017 Okabe et al.
2017/0173696 A1 6/2017 Sheinman
2017/0175290 A1 6/2017 Chen et al.
2017/0178899 A1 6/2017 Kabansky et al.
2017/0178939 A1 6/2017 Omori
2017/0178942 A1 6/2017 Sakata et al.
2017/0179036 A1 6/2017 Chen et al.
2017/0186621 A1 6/2017 Zaitsu
2017/0186754 A1 6/2017 Blomberg et al.
2017/0191159 A1 7/2017 Polyak et al.
2017/0191164 A1 7/2017 Alokozai et al.
2017/0191685 A1 7/2017 Ronne et al.
2017/0191861 A1 7/2017 Rondano et al.
2017/0196562 A1 7/2017 Shelton
2017/0200622 A1 7/2017 Shiokawa et al.
2017/0204516 A1 7/2017 Nguyen et al.
2017/0213960 A1 7/2017 de Araujo et al.
2017/0216762 A1 8/2017 Shugrue et al.
2017/0218515 A1 8/2017 Shin et al.
2017/0222008 A1 8/2017 Hsu et al.
2017/0226636 A1 8/2017 Xiao
2017/0232457 A1 8/2017 Toshiki et al.
2017/0233868 A1 8/2017 Donoso et al.
2017/0243734 A1 8/2017 Ishikawa et al.
2017/0250068 A1 8/2017 Ishikawa et al.
2017/0250075 A1 8/2017 Caymax et al.
2017/0253968 A1 9/2017 Yahata
2017/0256393 A1 9/2017 Kim et al.
2017/0256417 A1 9/2017 Chou
2017/0256429 A1 9/2017 Lawson et al.
2017/0260649 A1 9/2017 Coomer
2017/0263437 A1 9/2017 Li et al.
2017/0263438 A1 9/2017 Li et al.
2017/0267527 A1 9/2017 Kim et al.
2017/0267531 A1 9/2017 Haukka
2017/0271143 A1 9/2017 Fukiage et al.
2017/0271191 A1 9/2017 Yoo et al.
2017/0271256 A1 9/2017 Inatsuka
2017/0271501 A1 9/2017 Avci et al.
2017/0278705 A1 9/2017 Murakami et al.
2017/0278707 A1 9/2017 Margetis et al.
2017/0283312 A1 10/2017 Lee et al.
2017/0283313 A1 10/2017 Lee et al.
2017/0287681 A1 10/2017 Nitadori et al.
2017/0287744 A1 10/2017 Kobayashi et al.
2017/0294318 A1 10/2017 Yoshida et al.
2017/0294339 A1 10/2017 Tapily
2017/0294499 A1 10/2017 Lu et al.
2017/0301519 A1 10/2017 Naim et al.
2017/0301542 A1 10/2017 Maes et al.
2017/0303382 A1 10/2017 Smith et al.
2017/0306478 A1 10/2017 Raisanen et al.
2017/0306479 A1 10/2017 Raisanen et al.
2017/0306480 A1 10/2017 Zhu et al.
2017/0306494 A1 10/2017 Lin et al.
2017/0309490 A1 10/2017 Ogawa
2017/0309528 A1 10/2017 Bansal et al.
2017/0314125 A1 11/2017 Fenwick et al.
2017/0316933 A1 11/2017 Xie et al.
2017/0316940 A1 11/2017 Ishikawa et al.
2017/0317194 A1 11/2017 Tang et al.
2017/0323783 A1 11/2017 Sanchez et al.
2017/0323784 A1 11/2017 Faguet et al.
2017/0338111 A1 11/2017 Takamure et al.
2017/0338133 A1 11/2017 Tan et al.
2017/0338134 A1 11/2017 Tan et al.
2017/0338192 A1 11/2017 Lee et al.
2017/0342559 A1 11/2017 Fukazawa et al.
2017/0343896 A1 11/2017 Darling et al.
2017/0345674 A1 11/2017 Ranjan et al.
2017/0350688 A1 12/2017 Boyd et al.
2017/0358445 A1 12/2017 O'Shaugnessy et al.
2017/0358482 A1 12/2017 Chen et al.
2017/0358670 A1 12/2017 Kub et al.
2017/0362710 A1 12/2017 Ge et al.
2017/0365467 A1 12/2017 Shimamoto et al.
2017/0369993 A1 12/2017 Sun
2017/0372884 A1 12/2017 Margetis et al.
2017/0372919 A1 12/2017 Manna et al.
2017/0373188 A1 12/2017 Mochizuki et al.
2018/0005814 A1 1/2018 Kumar et al.
2018/0010243 A1 1/2018 Lee et al.
2018/0010247 A1 1/2018 Niskanen
2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047621 A1 2/2018 Armini
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.
2018/0061851 A1 3/2018 Ootsuka
2018/0068844 A1 3/2018 Chen et al.
2018/0068862 A1 3/2018 Terakura et al.
2018/0068950 A1 3/2018 Bruley et al.
2018/0069019 A1 3/2018 Kim et al.
2018/0076021 A1 3/2018 Fukushima et al.
2018/0083435 A1 3/2018 Redler
2018/0087152 A1 3/2018 Yoshida
2018/0087154 A1 3/2018 Pore et al.
2018/0087156 A1 3/2018 Kohei et al.
2018/0090583 A1 3/2018 Choi et al.
2018/0094350 A1 4/2018 Verghese et al.
2018/0094351 A1 4/2018 Verghese et al.
2018/0096821 A1 4/2018 Lubomirsky
2018/0096844 A1 4/2018 Dutartre et al.
2018/0097076 A1 4/2018 Cheng et al.
2018/0102276 A1 4/2018 Zhu et al.
2018/0105701 A1 4/2018 Larsson et al.
2018/0105930 A1 4/2018 Kang et al.
2018/0108587 A1 4/2018 Jiang
2018/0114680 A1 4/2018 Kim et al.
2018/0119283 A1 5/2018 Fukazawa
2018/0122642 A1 5/2018 Raisanen
2018/0122709 A1 5/2018 Xie
2018/0122959 A1 5/2018 Calka et al.
2018/0126379 A1 5/2018 Ramsey et al.
2018/0127876 A1 5/2018 Tolle et al.
2018/0130652 A1 5/2018 Pettinger et al.
2018/0130701 A1 5/2018 Chun
2018/0135172 A1 5/2018 Nogami et al.
2018/0135173 A1 5/2018 Kim et al.
2018/0135179 A1 5/2018 Toshiyuki et al.
2018/0138036 A1 5/2018 Baldesseroni et al.
2018/0142353 A1 5/2018 Tetsuya et al.

(56) References Cited

U.S. PATENT DOCUMENTS

| | | | |
|---|---|---|---|
| 2018/0142357 A1 | 5/2018 | Yoshikazu | |
| 2018/0148832 A1 | 5/2018 | Chatterjee et al. | |
| 2018/0151346 A1 | 5/2018 | Blanquart | |
| 2018/0151358 A1 | 5/2018 | Margetis et al. | |
| 2018/0151588 A1 | 5/2018 | Tsutsumi et al. | |
| 2018/0155832 A1 | 6/2018 | Hamalainen et al. | |
| 2018/0155836 A1 | 6/2018 | Arai et al. | |
| 2018/0158688 A1 | 6/2018 | Chen | |
| 2018/0158716 A1 | 6/2018 | Konkola et al. | |
| 2018/0163305 A1 | 6/2018 | Batzer et al. | |
| 2018/0166258 A1 | 6/2018 | Kim et al. | |
| 2018/0166315 A1 | 6/2018 | Coomer | |
| 2018/0171472 A1 | 6/2018 | Yamada et al. | |
| 2018/0171475 A1 | 6/2018 | Maes et al. | |
| 2018/0171477 A1 | 6/2018 | Kim et al. | |
| 2018/0172172 A1 | 6/2018 | Oehler et al. | |
| 2018/0173109 A1 | 6/2018 | Gronheid et al. | |
| 2018/0174801 A1 | 6/2018 | Chen et al. | |
| 2018/0174826 A1 | 6/2018 | Raaijmakers et al. | |
| 2018/0179625 A1 | 6/2018 | Takagi et al. | |
| 2018/0180509 A1 | 6/2018 | Sawachi et al. | |
| 2018/0182613 A1 | 6/2018 | Blanquart et al. | |
| 2018/0182618 A1 | 6/2018 | Blanquart et al. | |
| 2018/0187303 A1 | 7/2018 | Gatineau et al. | |
| 2018/0189923 A1 | 7/2018 | Zhong et al. | |
| 2018/0190496 A1 | 7/2018 | Ashihara et al. | |
| 2018/0195174 A1 | 7/2018 | Kim et al. | |
| 2018/0204733 A1 | 7/2018 | Sherpa et al. | |
| 2018/0209042 A1 | 7/2018 | Wu et al. | |
| 2018/0211834 A1 | 7/2018 | Takamure et al. | |
| 2018/0223047 A1 | 8/2018 | Xiao et al. | |
| 2018/0223429 A1 | 8/2018 | Fukazawa et al. | |
| 2018/0230595 A1 | 8/2018 | Suda et al. | |
| 2018/0233372 A1 | 8/2018 | Vayrynen et al. | |
| 2018/0245215 A1 | 8/2018 | Lei et al. | |
| 2018/0246101 A1 | 8/2018 | Sasisekharan et al. | |
| 2018/0254211 A1 | 9/2018 | Kosakai et al. | |
| 2018/0258532 A1 | 9/2018 | Kato et al. | |
| 2018/0265294 A1 | 9/2018 | Hayashi | |
| 2018/0265972 A1 | 9/2018 | Firouzdor et al. | |
| 2018/0265973 A1 | 9/2018 | Firouzdor et al. | |
| 2018/0269057 A1 | 9/2018 | Lei et al. | |
| 2018/0274098 A1 | 9/2018 | Takagi et al. | |
| 2018/0277338 A1 | 9/2018 | Fukada et al. | |
| 2018/0277423 A1 | 9/2018 | Lottes | |
| 2018/0286638 A1 | 10/2018 | Susa | |
| 2018/0286663 A1 | 10/2018 | Kobayashi et al. | |
| 2018/0286668 A1 | 10/2018 | Baum et al. | |
| 2018/0286672 A1 | 10/2018 | Van Aerde et al. | |
| 2018/0286675 A1 | 10/2018 | Blomberg et al. | |
| 2018/0286711 A1 | 10/2018 | Oosterlaken et al. | |
| 2018/0294187 A1 | 10/2018 | Thombare et al. | |
| 2018/0305247 A1 | 10/2018 | Feng et al. | |
| 2018/0308686 A1 | 10/2018 | Xie et al. | |
| 2018/0308701 A1 | 10/2018 | Na et al. | |
| 2018/0312966 A1 | 11/2018 | Chan et al. | |
| 2018/0315597 A1 | 11/2018 | Varadarajan et al. | |
| 2018/0315838 A1 | 11/2018 | Morrow et al. | |
| 2018/0323055 A1 | 11/2018 | Woodruff et al. | |
| 2018/0323056 A1 | 11/2018 | Woodruff et al. | |
| 2018/0323059 A1 | 11/2018 | Bhargava et al. | |
| 2018/0325414 A1 | 11/2018 | Marashdeh et al. | |
| 2018/0327892 A1 | 11/2018 | Wu et al. | |
| 2018/0327898 A1 | 11/2018 | Wu et al. | |
| 2018/0327899 A1 | 11/2018 | Wu et al. | |
| 2018/0331117 A1 | 11/2018 | Titus et al. | |
| 2018/0337087 A1 | 11/2018 | Sandhu et al. | |
| 2018/0350587 A1 | 12/2018 | Jia et al. | |
| 2018/0350588 A1 | 12/2018 | Raisanen et al. | |
| 2018/0350620 A1 | 12/2018 | Zaitsu et al. | |
| 2018/0350653 A1 | 12/2018 | Jeong et al. | |
| 2018/0355480 A1 | 12/2018 | Kondo | |
| 2018/0355484 A1 | 12/2018 | Lansalot-Matras et al. | |
| 2018/0358222 A1 | 12/2018 | Venkatasubramanian et al. | |
| 2018/0363131 A1 | 12/2018 | Lee et al. | |
| 2018/0363139 A1 | 12/2018 | Rajavelu et al. | |
| 2018/0366314 A1 | 12/2018 | Niskanen et al. | |
| 2018/0371610 A1 | 12/2018 | Banerjee et al. | |
| 2019/0003050 A1 | 1/2019 | Dezelah et al. | |
| 2019/0003052 A1 | 1/2019 | Shero et al. | |
| 2019/0006797 A1 | 1/2019 | Paynter et al. | |
| 2019/0013199 A1 | 1/2019 | Bhargava et al. | |
| 2019/0019670 A1 | 1/2019 | Lin et al. | |
| 2019/0019714 A1 | 1/2019 | Kosakai et al. | |
| 2019/0027573 A1 | 1/2019 | Zhu et al. | |
| 2019/0027583 A1 | 1/2019 | Margetis et al. | |
| 2019/0027584 A1 | 1/2019 | Margetis et al. | |
| 2019/0027605 A1 | 1/2019 | Tolle et al. | |
| 2019/0032209 A1 | 1/2019 | Huggare | |
| 2019/0032998 A1 | 1/2019 | Jdira et al. | |
| 2019/0035605 A1 | 1/2019 | Suzuki | |
| 2019/0035647 A1 | 1/2019 | Lee et al. | |
| 2019/0035698 A1 | 1/2019 | Tanaka | |
| 2019/0035810 A1 | 1/2019 | Chun et al. | |
| 2019/0040529 A1 | 2/2019 | Verbaas et al. | |
| 2019/0046947 A1 | 2/2019 | Strohm et al. | |
| 2019/0051544 A1 | 2/2019 | Verbaas | |
| 2019/0051548 A1 | 2/2019 | den Hartog Besselink et al. | |
| 2019/0051555 A1 | 2/2019 | Hill et al. | |
| 2019/0057857 A1 | 2/2019 | Ishikawa et al. | |
| 2019/0057858 A1 | 2/2019 | Hausmann et al. | |
| 2019/0058043 A1 | 2/2019 | Dewey et al. | |
| 2019/0062907 A1 | 2/2019 | Kim et al. | |
| 2019/0062917 A1 | 2/2019 | Sung et al. | |
| 2019/0066978 A1 | 2/2019 | Um et al. | |
| 2019/0066997 A1 | 2/2019 | Klaver et al. | |
| 2019/0067003 A1 | 2/2019 | Zope et al. | |
| 2019/0067004 A1 | 2/2019 | Kohen et al. | |
| 2019/0067014 A1 | 2/2019 | Shrestha et al. | |
| 2019/0067016 A1 | 2/2019 | Zhu et al. | |
| 2019/0067085 A1 | 2/2019 | Kweskin | |
| 2019/0067094 A1 | 2/2019 | Zope et al. | |
| 2019/0067095 A1 | 2/2019 | Zhu et al. | |
| 2019/0078206 A1 | 3/2019 | Wu et al. | |
| 2019/0080903 A1 | 3/2019 | Abel et al. | |
| 2019/0081072 A1 | 3/2019 | Chun et al. | |
| 2019/0085451 A1 | 3/2019 | Lei et al. | |
| 2019/0086807 A1 | 3/2019 | Kachel et al. | |
| 2019/0088555 A1 | 3/2019 | Xie et al. | |
| 2019/0089143 A1 | 3/2019 | Malone et al. | |
| 2019/0093221 A1 | 3/2019 | Jdira et al. | |
| 2019/0096708 A1 | 3/2019 | Sharma | |
| 2019/0106788 A1 | 4/2019 | Hawkins et al. | |
| 2019/0109002 A1 | 4/2019 | Mattinen et al. | |
| 2019/0109009 A1 | 4/2019 | Longrie et al. | |
| 2019/0109043 A1 | 4/2019 | Wang et al. | |
| 2019/0112711 A1 | 4/2019 | Lyons et al. | |
| 2019/0115206 A1 | 4/2019 | Kim et al. | |
| 2019/0115237 A1 | 4/2019 | den Hartog Besselink et al. | |
| 2019/0115451 A1 | 4/2019 | Lee et al. | |
| 2019/0131124 A1 | 5/2019 | Kohen et al. | |
| 2019/0140067 A1 | 5/2019 | Zhu et al. | |
| 2019/0148177 A1 | 5/2019 | Yin et al. | |
| 2019/0148224 A1 | 5/2019 | Kuroda et al. | |
| 2019/0148398 A1 | 5/2019 | Kim et al. | |
| 2019/0148556 A1 | 5/2019 | Wang et al. | |
| 2019/0153593 A1 | 5/2019 | Zhu et al. | |
| 2019/0157054 A1 | 5/2019 | White et al. | |
| 2019/0157067 A1 | 5/2019 | Bhuyan et al. | |
| 2019/0163056 A1 | 5/2019 | Maes et al. | |
| 2019/0164763 A1 | 5/2019 | Raisanen et al. | |
| 2019/0172701 A1 | 6/2019 | Jia et al. | |
| 2019/0172714 A1 | 6/2019 | Bobek et al. | |
| 2019/0176435 A1 | 6/2019 | Bellman et al. | |
| 2019/0181002 A1 | 6/2019 | Iijima et al. | |
| 2019/0185999 A1 | 6/2019 | Shanbhag et al. | |
| 2019/0189447 A1 | 6/2019 | Kamp et al. | |
| 2019/0198297 A1 | 6/2019 | Aramaki et al. | |
| 2019/0198359 A1 | 6/2019 | Kamimura et al. | |
| 2019/0198571 A1 | 6/2019 | Xu et al. | |
| 2019/0204029 A1 | 7/2019 | Tanabe | |
| 2019/0211450 A1 | 7/2019 | Adachi et al. | |
| 2019/0217277 A1 | 7/2019 | Jeon et al. | |
| 2019/0221433 A1 | 7/2019 | Raisanen et al. | |

(56) References Cited

U.S. PATENT DOCUMENTS

2019/0229008 A1 7/2019 Rokkam et al.
2019/0233446 A1 8/2019 MacDonald et al.
2019/0233940 A1 8/2019 Guo et al.
2019/0237325 A1 8/2019 Wang et al.
2019/0237327 A1 8/2019 Kohen et al.
2019/0244803 A1 8/2019 Suzuki
2019/0249300 A1 8/2019 Hatanpaa et al.
2019/0249303 A1 8/2019 Kuroda et al.
2019/0252195 A1 8/2019 Haukka
2019/0252196 A1 8/2019 Vayrynen et al.
2019/0259611 A1 8/2019 Nakano et al.
2019/0259612 A1 8/2019 Nozawa et al.
2019/0264324 A1 8/2019 Shugrue et al.
2019/0271078 A1 9/2019 Raisanen et al.
2019/0272981 A1 9/2019 Xu et al.
2019/0272993 A1 9/2019 Mattinen et al.
2019/0273133 A1 9/2019 Agrawal et al.
2019/0276934 A1 9/2019 Verghese et al.
2019/0287769 A1 9/2019 Blomberg et al.
2019/0295837 A1 9/2019 Pore et al.
2019/0301014 A1 10/2019 Pierreux et al.
2019/0304776 A1 10/2019 Choi
2019/0304780 A1 10/2019 Kohen et al.
2019/0304790 A1 10/2019 Mousa et al.
2019/0304821 A1 10/2019 Pierreux et al.
2019/0311894 A1 10/2019 Girard et al.
2019/0311897 A1 10/2019 Kang et al.
2019/0311940 A1 10/2019 Choi et al.
2019/0318910 A1 10/2019 Mori
2019/0318923 A1 10/2019 Blanquart et al.
2019/0319100 A1 10/2019 Chen et al.
2019/0322812 A1 10/2019 Wojtecki et al.
2019/0330740 A1 10/2019 Klaver
2019/0333753 A1 10/2019 Ueda et al.
2019/0333761 A1 10/2019 Tois et al.
2019/0338418 A1 11/2019 Goradia et al.
2019/0346300 A1 11/2019 Kim et al.
2019/0348261 A1 11/2019 Lin et al.
2019/0348273 A1 11/2019 Tang et al.
2019/0348515 A1 11/2019 Li et al.
2019/0362970 A1 11/2019 Wang et al.
2019/0362989 A1 11/2019 Reuter et al.
2019/0363006 A1 11/2019 Min
2019/0363015 A1 11/2019 Cheng et al.
2019/0368040 A1 12/2019 Kachel et al.
2019/0368041 A1 12/2019 Sreeram et al.
2019/0371594 A1 12/2019 Niskanen et al.
2019/0371640 A1 12/2019 Raisanen et al.
2019/0375638 A1 12/2019 Haukka
2019/0376180 A1 12/2019 Niskanen
2019/0378711 A1 12/2019 Suzuki et al.
2019/0378916 A1 12/2019 Tang et al.
2019/0385907 A1 12/2019 Gottheim et al.
2019/0390338 A1 12/2019 Raisanen et al.
2019/0390343 A1 12/2019 Min et al.
2019/0393304 A1 12/2019 Guillorn et al.
2019/0393308 A1 12/2019 Lo et al.
2020/0002811 A1 1/2020 Sreeram et al.
2020/0002812 A1 1/2020 Lee et al.
2020/0012081 A1 1/2020 Komai
2020/0013612 A1 1/2020 Blanquart et al.
2020/0013613 A1 1/2020 Blanquart
2020/0013626 A1 1/2020 Longrie et al.
2020/0013629 A1 1/2020 de Roest et al.
2020/0018421 A1 1/2020 Shugrue
2020/0035489 A1 1/2020 Huang et al.
2020/0040458 A1 2/2020 Ma et al.
2020/0048768 A1 2/2020 Wiegers et al.
2020/0052056 A1 2/2020 Park et al.
2020/0052089 A1 2/2020 Yu et al.
2020/0056282 A1 2/2020 Raisanen et al.
2020/0056286 A1 2/2020 Shero et al.
2020/0058469 A1 2/2020 Ranjan et al.
2020/0063262 A1 2/2020 Katou et al.
2020/0064737 A1 2/2020 de Roest
2020/0066512 A1 2/2020 Tois et al.
2020/0066552 A1 2/2020 Susa
2020/0080200 A1 3/2020 Um et al.
2020/0083054 A1 3/2020 Väyrynen et al.
2020/0083375 A1 3/2020 Tolle et al.
2020/0083469 A1 3/2020 Lhullier
2020/0102649 A1 4/2020 Reed
2020/0102653 A1 4/2020 Muralidhar et al.
2020/0105579 A1 4/2020 Zhu
2020/0105594 A1 4/2020 Cheng et al.
2020/0105895 A1 4/2020 Tang et al.
2020/0109472 A1 4/2020 Um et al.
2020/0111669 A1 4/2020 Zaitsu et al.
2020/0111690 A1 4/2020 Oosterlaken
2020/0118811 A1 4/2020 Utsuno et al.
2020/0118815 A1 4/2020 Fukazawa et al.
2020/0118817 A1 4/2020 Blomberg et al.
2020/0119038 A1 4/2020 Hopkins et al.
2020/0126771 A1 4/2020 Roh et al.
2020/0126840 A1 4/2020 Roh et al.
2020/0131634 A1 4/2020 Gao et al.
2020/0135512 A1 4/2020 Oosterlaken et al.
2020/0135915 A1 4/2020 Savant et al.
2020/0140995 A1 5/2020 Blanquart et al.
2020/0141003 A1 5/2020 Lee et al.
2020/0144058 A1 5/2020 Kohen
2020/0152473 A1 5/2020 Tapily et al.
2020/0152750 A1 5/2020 Morrow et al.
2020/0161129 A1 5/2020 Mattinen et al.
2020/0161438 A1 5/2020 Tang et al.
2020/0168485 A1 5/2020 Fluit
2020/0173020 A1 6/2020 Huggare
2020/0176244 A1 6/2020 Lee et al.
2020/0176246 A1 6/2020 Huotari et al.
2020/0181770 A1 6/2020 Longrie et al.
2020/0185249 A1 6/2020 Rice et al.
2020/0185257 A1 6/2020 Nishiwaki
2020/0194253 A1 6/2020 Banerjee et al.
2020/0194268 A1 6/2020 Sharma
2020/0203157 A1 6/2020 Su
2020/0224309 A1 7/2020 Sreeram et al.
2020/0224311 A1 7/2020 Niskanen et al.
2020/0227243 A1 7/2020 Kim et al.
2020/0227250 A1 7/2020 Pore et al.
2020/0227325 A1 7/2020 Xie et al.
2020/0232096 A1 7/2020 Hatanpää et al.
2020/0234989 A1 7/2020 Jeong
2020/0251328 A1 8/2020 Zaitsu et al.
2020/0258766 A1 8/2020 Garssen et al.
2020/0266057 A1 8/2020 Lee et al.
2020/0266097 A1 8/2020 Liu et al.
2020/0266098 A1 8/2020 Pore et al.
2020/0266208 A1 8/2020 Kim et al.
2020/0270749 A1 8/2020 Li et al.
2020/0270752 A1 8/2020 Pierreux et al.
2020/0273728 A1 8/2020 Benjaminson et al.
2020/0273729 A1 8/2020 Verbaas et al.
2020/0279721 A1 9/2020 White et al.
2020/0279758 A1 9/2020 Sharma
2020/0283893 A1 9/2020 Byun et al.
2020/0283894 A1 9/2020 Lehn et al.
2020/0284467 A1 9/2020 Lindeboom et al.
2020/0286725 A1 9/2020 Sharma et al.
2020/0286726 A1 9/2020 Shero et al.
2020/0294789 A1 9/2020 Woodruff et al.
2020/0303180 A1 9/2020 Kim et al.
2020/0303196 A1 9/2020 Chen et al.
2020/0309455 A1 10/2020 Fluit
2020/0312652 A1 10/2020 Kang et al.
2020/0312681 A1 10/2020 Tanaka et al.
2020/0318237 A1 10/2020 Fukazawa
2020/0321209 A1 10/2020 Ishikawa et al.
2020/0332416 A1 10/2020 Fluit
2020/0340113 A1 10/2020 Hatanpää et al.
2020/0340138 A1 10/2020 Tolle et al.
2020/0343134 A1 10/2020 Kovalgin et al.
2020/0343358 A1 10/2020 Zhu et al.
2020/0350193 A1 11/2020 Garssen
2020/0354836 A1 11/2020 Yednak et al.

(56) References Cited

U.S. PATENT DOCUMENTS

2020/0355296 A1 11/2020 Shugrue et al.
2020/0357631 A1 11/2020 Ueda
2020/0365391 A1 11/2020 Blanquart et al.
2020/0365433 A1 11/2020 de Ridder et al.
2020/0365434 A1 11/2020 de Ridder
2020/0365444 A1 11/2020 Hill et al.
2020/0373152 A1 11/2020 Blanquart
2020/0385861 A1 12/2020 Deye et al.
2020/0385867 A1 12/2020 Kim et al.
2020/0385868 A1 12/2020 Kim et al.
2020/0395199 A1 12/2020 Miyama
2020/0395209 A1 12/2020 Yoshimoto et al.
2020/0395444 A1 12/2020 Lo et al.
2020/0402846 A1 12/2020 Collins et al.
2021/0002762 A1 1/2021 Jun et al.
2021/0005449 A1 1/2021 Blanquart et al.
2021/0005450 A1 1/2021 Mattinen et al.
2021/0005723 A1 1/2021 Tang et al.
2021/0013010 A1 1/2021 Yoshikawa et al.
2021/0013034 A1 1/2021 Wu et al.
2021/0013037 A1 1/2021 Sun et al.
2021/0013042 A1 1/2021 Väyrynen et al.
2021/0013085 A1 1/2021 Roh et al.
2021/0017648 A1 1/2021 Kubota et al.
2021/0020429 A1 1/2021 Khazaka et al.
2021/0020431 A1 1/2021 Blanquart et al.
2021/0020432 A1 1/2021 Blanquart
2021/0020467 A1 1/2021 Sekiguchi
2021/0020470 A1 1/2021 Lee
2021/0028021 A1 1/2021 Mousa et al.
2021/0032754 A1 2/2021 White et al.
2021/0033977 A1 2/2021 Raaijmakers et al.
2021/0035785 A1 2/2021 Jeong et al.
2021/0035786 A1 2/2021 Jeong et al.
2021/0035802 A1 2/2021 Tolle et al.
2021/0035824 A1 2/2021 de Ridder
2021/0035839 A1 2/2021 de Ridder
2021/0035840 A1 2/2021 de Ridder et al.
2021/0035841 A1 2/2021 Fluit
2021/0035842 A1 2/2021 de Ridder
2021/0035854 A1 2/2021 Yoo et al.
2021/0040613 A1 2/2021 White et al.
2021/0040615 A1 2/2021 White et al.
2021/0041284 A1 2/2021 Yednak
2021/0043444 A1 2/2021 Blanquart
2021/0050231 A1 2/2021 Oosterlaken
2021/0054500 A1 2/2021 Zope et al.
2021/0054504 A1 2/2021 Wang et al.
2021/0057214 A1 2/2021 Kengoyama et al.
2021/0057223 A1 2/2021 Stevens et al.
2021/0057275 A1 2/2021 Pierreux et al.
2021/0057570 A1 2/2021 Lin et al.
2021/0066075 A1 3/2021 Zhang et al.
2021/0066079 A1 3/2021 Lima et al.
2021/0066080 A1 3/2021 Mattinen et al.
2021/0066083 A1 3/2021 Haukka
2021/0066084 A1 3/2021 Raisanen et al.
2021/0070783 A1 3/2021 Odedra et al.
2021/0071296 A1 3/2021 Watarai et al.
2021/0071298 A1 3/2021 Maes et al.
2021/0074527 A1 3/2021 Lee et al.
2021/0082692 A1 3/2021 Kikuchi
2021/0090878 A1 3/2021 Kang et al.
2021/0095372 A1 4/2021 Minjauw et al.
2021/0102289 A1 4/2021 Tsuji et al.
2021/0102290 A1 4/2021 Acosta et al.
2021/0102292 A1 4/2021 Lin et al.
2021/0104384 A1 4/2021 Parkhe
2021/0104399 A1 4/2021 Kuroda et al.
2021/0108328 A1 4/2021 Yanagisawa
2021/0111025 A1 4/2021 Zyulkov et al.
2021/0111053 A1 4/2021 De Ridder
2021/0118667 A1 4/2021 Fukazawa et al.
2021/0118679 A1 4/2021 Lima et al.
2021/0118687 A1 4/2021 Wang et al.
2021/0125827 A1 4/2021 Khazaka et al.
2021/0125832 A1 4/2021 Bhatnagar
2021/0134588 A1 5/2021 Kohen et al.
2021/0134959 A1 5/2021 Lima et al.
2021/0140043 A1 5/2021 Thombare et al.
2021/0143003 A1 5/2021 Fukuda et al.
2021/0151315 A1 5/2021 Pierreux et al.
2021/0151348 A1 5/2021 Utsuno et al.
2021/0151352 A1 5/2021 Zope et al.
2021/0156024 A1 5/2021 Roh et al.
2021/0156030 A1 5/2021 Shugrue
2021/0159077 A1 5/2021 Longrie et al.
2021/0166910 A1 6/2021 Kim et al.
2021/0166924 A1 6/2021 Moon et al.
2021/0166925 A1 6/2021 Moon et al.
2021/0166940 A1 6/2021 Nozawa
2021/0172064 A1 6/2021 Moon
2021/0175052 A1 6/2021 Takahashi et al.
2021/0180184 A1 6/2021 Verni et al.
2021/0180188 A1 6/2021 Kim et al.
2021/0180189 A1 6/2021 Shugrue et al.
2021/0193458 A1 6/2021 Salmi et al.
2021/0205758 A1 7/2021 Kimtee et al.
2021/0207269 A1 7/2021 Huang et al.
2021/0207270 A1 7/2021 de Ridder et al.
2021/0210373 A1 7/2021 Singu et al.
2021/0214842 A1 7/2021 Yoon et al.
2021/0225615 A1 7/2021 Yoshida
2021/0225622 A1 7/2021 Shoji
2021/0225642 A1 7/2021 Utsuno et al.
2021/0225643 A1 7/2021 Kuroda et al.
2021/0230744 A1 7/2021 Kimtee et al.
2021/0230746 A1 7/2021 Shiba
2021/0233772 A1 7/2021 Zhu et al.
2021/0238736 A1 8/2021 Butail et al.
2021/0238742 A1 8/2021 Susa et al.
2021/0239614 A1 8/2021 Muralidhar et al.
2021/0242011 A1 8/2021 Shero et al.
2021/0246556 A1 8/2021 Mori
2021/0247693 A1 8/2021 Maes et al.
2021/0249303 A1 8/2021 Blanquart
2021/0254216 A1 8/2021 Mori et al.
2021/0254238 A1 8/2021 Khazaka et al.
2021/0257213 A1 8/2021 Kikuchi et al.
2021/0257509 A1 8/2021 Nishiwaki
2021/0265134 A1 8/2021 Singh et al.
2021/0265158 A1 8/2021 Kaneko
2021/0268554 A1 9/2021 Mori
2021/0269914 A1 9/2021 Väyrynen et al.
2021/0272821 A1 9/2021 Oosterlaken
2021/0273109 A1 9/2021 Yamazaki et al.
2021/0280448 A1 9/2021 Ganguli et al.
2021/0285102 A1 9/2021 Yoon et al.
2021/0287878 A1 9/2021 Um et al.
2021/0287912 A1 9/2021 Shiba et al.
2021/0287928 A1 9/2021 Kim et al.
2021/0288476 A1 9/2021 Wei
2021/0292902 A1 9/2021 Kajbafvala et al.
2021/0296130 A1 9/2021 Longrie et al.
2021/0296144 A1 9/2021 Lin et al.
2021/0310125 A1 10/2021 Ma et al.
2021/0313150 A1 10/2021 Kang et al.
2021/0313167 A1 10/2021 Pore et al.
2021/0313170 A1 10/2021 Suzuki
2021/0313178 A1 10/2021 Nakano
2021/0313182 A1 10/2021 Zhu et al.
2021/0317576 A1 10/2021 Väyrynen et al.
2021/0319982 A1 10/2021 Kim et al.
2021/0320003 A1 10/2021 Sugiura et al.
2021/0320010 A1 10/2021 Wang et al.
2021/0320020 A1 10/2021 Oosterlaken et al.
2021/0324510 A1 10/2021 Kuwano et al.
2021/0324518 A1 10/2021 de Ridder
2021/0327704 A1 10/2021 Kajbafvala et al.
2021/0327714 A1 10/2021 Lee et al.

(56) References Cited

U.S. PATENT DOCUMENTS

| | | | |
|---|---|---|---|
| 2021/0327715 | A1 | 10/2021 | Xie et al. |
| 2021/0328036 | A1 | 10/2021 | Li et al. |

FOREIGN PATENT DOCUMENTS

| | | |
|---|---|---|
| CN | 2588350 | 11/2003 |
| CN | 1563483 | 1/2005 |
| CN | 1655362 | 8/2005 |
| CN | 1664987 | 9/2005 |
| CN | 1825535 | 8/2006 |
| CN | 101047143 | 10/2007 |
| CN | 101142012 | 3/2008 |
| CN | 101609858 | 12/2009 |
| CN | 101681873 | 3/2010 |
| CN | 101308794 | 9/2010 |
| CN | 102094183 | 6/2011 |
| CN | 102383106 | 3/2012 |
| CN | 103014846 | 4/2013 |
| CN | 102539019 | 9/2013 |
| CN | 103515222 | 1/2014 |
| CN | 102373440 | 7/2014 |
| CN | 203721699 | 7/2014 |
| CN | 104244620 | 12/2014 |
| CN | 104307264 | 1/2015 |
| CN | 104498895 | 4/2015 |
| CN | 104517892 | 4/2015 |
| CN | 204629865 | 9/2015 |
| CN | 105253917 | 1/2016 |
| CN | 205448240 | 8/2016 |
| CN | 104342637 | 2/2017 |
| CN | 206145834 | 5/2017 |
| CN | 104233226 | 6/2017 |
| CN | 106895521 | 6/2017 |
| CN | 104201108 | 11/2017 |
| CN | 104630735 | 12/2017 |
| CN | 107675144 | 2/2018 |
| CN | 108389798 | 8/2018 |
| CN | 106011785 | 10/2018 |
| CN | 108910843 | 11/2018 |
| CN | 109000352 | 12/2018 |
| DE | 8902307 | 8/1989 |
| DE | 3836696 | 12/1989 |
| DE | 3626724 | 6/1994 |
| DE | 10133013 | 1/2003 |
| DE | 102008052750 | 6/2009 |
| EP | 0058571 | 8/1982 |
| EP | 0499004 | 8/1992 |
| EP | 0634785 | 1/1995 |
| EP | 0550058 | 11/1998 |
| EP | 0887632 | 12/1998 |
| EP | 678909 | 7/1999 |
| EP | 1061567 | 12/2000 |
| EP | 1889817 | 2/2008 |
| EP | 2036600 | 3/2009 |
| EP | 2426233 | 7/2012 |
| FR | 686869 | 7/1930 |
| FR | 1408266 | 8/1965 |
| FR | 2233614 | 1/1975 |
| FR | 2517790 | 6/1983 |
| FR | 2610007 | 8/1990 |
| FR | 2708624 | 2/1995 |
| GB | 400010 | 10/1933 |
| GB | 752-277 | 7/1956 |
| GB | 1186889 | 6/1966 |
| GB | 1514921 | 6/1978 |
| GB | 2051875 | 1/1981 |
| JP | 58-19462 | 4/1983 |
| JP | S5979545 | 5/1984 |
| JP | S59127847 | 7/1984 |
| JP | 59-211779 | 11/1984 |
| JP | S60110133 | 6/1985 |
| JP | 61038863 | 2/1986 |
| JP | S62237236 | 10/1987 |
| JP | S63136532 | 6/1988 |
| JP | H0165766 | 6/1989 |
| JP | H01185176 | 7/1989 |
| JP | H01-296613 | 11/1989 |
| JP | H01-307229 | 12/1989 |
| JP | H01313954 | 12/1989 |
| JP | H02-93071 | 4/1990 |
| JP | H02-185038 | 7/1990 |
| JP | H02-217469 | 8/1990 |
| JP | H03-044472 | 2/1991 |
| JP | H03-155625 | 7/1991 |
| JP | H03211753 | 9/1991 |
| JP | H03-248427 | 11/1991 |
| JP | H04-29313 | 1/1992 |
| JP | H04-115531 | 4/1992 |
| JP | H05-6880 | 1/1993 |
| JP | H05-23079 | 3/1993 |
| JP | 405118928 | 5/1993 |
| JP | H05-118928 | 5/1993 |
| JP | H05-171446 | 7/1993 |
| JP | H05-291142 | 11/1993 |
| JP | H06-053210 | 2/1994 |
| JP | H06-84888 | 3/1994 |
| JP | H06-140399 | 5/1994 |
| JP | H0616433 | 6/1994 |
| JP | 6204231 | 7/1994 |
| JP | H06-319177 | 11/1994 |
| JP | H06-338497 | 12/1994 |
| JP | H07-297271 | 1/1995 |
| JP | H0729836 | 1/1995 |
| JP | 07066267 | 3/1995 |
| JP | H07-74162 | 3/1995 |
| JP | H07-109576 | 4/1995 |
| JP | 07034936 | 8/1995 |
| JP | H07-034936 | 8/1995 |
| JP | H07-225214 | 8/1995 |
| JP | 7-272694 | 10/1995 |
| JP | H07-283149 | 10/1995 |
| JP | H07-209093 | 11/1995 |
| JP | H08-181135 | 7/1996 |
| JP | H08-335558 | 12/1996 |
| JP | H09-064149 | 3/1997 |
| JP | 9-89676 | 4/1997 |
| JP | H09-148322 | 6/1997 |
| JP | H10-41096 | 2/1998 |
| JP | H10-50635 | 2/1998 |
| JP | H10-50800 | 2/1998 |
| JP | H10-064696 | 3/1998 |
| JP | H10-153494 | 6/1998 |
| JP | H10-227703 | 8/1998 |
| JP | H10-0261620 | 9/1998 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002118066 | 4/2002 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004088077 | 3/2004 |
| JP | 2004091848 | 3/2004 |

(56) References Cited

FOREIGN PATENT DOCUMENTS

| | | |
|---|---|---|
| JP | 2004113270 | 4/2004 |
| JP | 2004128019 | 4/2004 |
| JP | 2004134553 | 4/2004 |
| JP | 2004163293 | 6/2004 |
| JP | 2004244298 | 9/2004 |
| JP | 2004244661 | 9/2004 |
| JP | 2004294638 | 10/2004 |
| JP | 3589954 | 11/2004 |
| JP | 2004310019 | 11/2004 |
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124831 | 5/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015021175 | 2/2015 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 2017220011 | 12/2017 |
| JP | 6519897 | 5/2019 |
| KR | 1998-0026850 | 7/1998 |
| KR | 20000000946 | 1/2000 |
| KR | 10-0253664 | 4/2000 |
| KR | 10-2000-0031098 | 6/2000 |
| KR | 10-2000-0045257 | 7/2000 |
| KR | 100273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-2006-0129566 | 12/2006 |
| KR | 10-0688484 | 2/2007 |
| KR | 20070041701 | 4/2007 |
| KR | 10-2007-0079797 | 8/2007 |
| KR | 10-2007-0084683 | 8/2007 |
| KR | 10-2007-0117817 | 12/2007 |
| KR | 2008-0058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0015073 | 2/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0122701 | 11/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-2013-0129149 | 11/2013 |
| KR | 10-1347962 | 1/2014 |
| KR | 10-1491726 | 2/2015 |
| KR | 10-1535573 | 7/2015 |
| KR | 101758892 | 7/2017 |
| KR | 10-2019-0032077 | 3/2019 |
| NL | 8600255 | 9/1987 |
| NL | 8701549 | 2/1989 |
| RU | 1786406 | 1/1993 |
| SU | 494614 | 2/1976 |
| SU | 1408319 | 7/1988 |
| TW | 538327 | 6/2003 |
| TW | 540093 | 7/2003 |
| TW | M292692 | 6/2006 |
| TW | 200731357 | 8/2007 |
| TW | 200903625 | 1/2009 |
| TW | 201213596 | 4/2012 |
| TW | 201234453 | 8/2012 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | I514509 | 12/2015 |
| TW | 201613231 | 4/2016 |
| TW | M553518 | 12/2017 |
| TW | D196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004007800 | 1/2004 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |

(56) References Cited

FOREIGN PATENT DOCUMENTS

| | | |
|---|---|---|
| WO | 2006054854 | 5/2006 |
| WO | 2006056091 | 6/2006 |
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |
| WO | 2007024720 | 3/2007 |
| WO | 2007027165 | 3/2007 |
| WO | 2007076195 | 7/2007 |
| WO | 2007088940 | 8/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2013177269 | 11/2013 |
| WO | 2014107290 | 7/2014 |
| WO | 2015026230 | 2/2015 |
| WO | 2015107009 | 7/2015 |
| WO | 2015112728 | 7/2015 |
| WO | 2015127614 | 9/2015 |
| WO | 2016019795 | 2/2016 |
| WO | 2018109553 | 6/2016 |
| WO | 2018109554 | 6/2016 |
| WO | 2017108713 | 6/2017 |
| WO | 2017108714 | 6/2017 |
| WO | 2017125401 | 7/2017 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2019030565 | 2/2019 |
| WO | 2019103610 | 5/2019 |
| WO | 2019103613 | 5/2019 |
| WO | 2019142055 | 7/2019 |
| WO | 2019152055 | 8/2019 |
| WO | 2019158960 | 8/2019 |
| WO | 2019214578 | 11/2019 |
| WO | 2019217749 | 11/2019 |
| WO | 2019229537 | 12/2019 |
| WO | 2020002995 | 1/2020 |
| WO | 2020003000 | 1/2020 |
| WO | 2020118100 | 6/2020 |
| WO | 2021072042 | 4/2021 |

OTHER PUBLICATIONS

CNIPA; Office Action dated Mar. 1, 2021 in Application No. 201710131319.1.

CNIPA; Notice of Allowance dated Mar. 30, 2021 in Application No. 201710762817.6.

CNIPA; Office Action dated Jan. 28, 2021 in Application No. 201711057557.9.

CNIPA; Office Action dated Jan. 26, 2021 in Application No. 201711057929.8.

CNIPA; Office Action dated Apr. 19, 2021 in Application No. 201711328250.8.

CNIPA; Notice of Allowance dated Apr. 7, 2021 in Application No. 201780044761.9.

CNIPA; Office Action dated Jan. 29, 2021 in Application No. 201780076230.8.

CNIPA; Office Action dated Jan. 27, 2021 in Application No. 201780076321.1.

CNIPA; Office Action dated Mar. 24, 2021 in Application No. 201880048547.5.

CNIPA; Office Action dated Dec. 22, 2020 in Application No. 201910378791.4.

CNIPA; Notice of Allowance dated Apr. 7, 2021 in Application No. 202030579755.8.

EPO; Extended European Search Report dated Apr. 6, 2021 in Application No. 21150514.4.

JPO; Notice of Allowance dated Apr. 6, 2021 in Application No. 2017-139817.

JPO; Office Action dated Mar. 31, 2021 in Application No. 2018-024655.

JPO; Notice of Allowance dated Mar. 17, 2021 in Application No. 2020-010953.

KIPO; Office Action dated Mar. 23, 2021 in Application No. 10-2014-0011765.

KIPO; Office Action dated Apr. 27, 2021 in Application No. 10-2014-0027217.

KIPO; Notice of Allowance dated Apr. 15, 2021 in Application No. 10-2014-0103853.

KIPO; Notice of Allowance dated Mar. 25, 2021 in Application No. 10-2014-0128626.

KIPO; Office Action dated Apr. 20, 2021 in Application No. 10-2014-0136089.

KIPO; Office Action dated Mar. 19, 2021 in Application No. 10-2014-0156196.

KIPO; Office Action dated Mar. 29, 2021 in Application No. 10-2014-0165685.

KIPO; Office Action dated Apr. 5, 2021 in Application No. 10-2015-0031720.

KIPO; Office Action dated Apr. 19, 2021 in Application No. 10-2015-0035094.

KIPO; Office Action dated Mar. 8, 2021 in Application No. 10-2017-0054647.

KIPO; Office Action dated Mar. 10, 2021 in Application No. 10-2017-0055703.

KIPO; Notice of Allowance dated May 24, 2021 in Application No. 10-2020-0101096.

KIPO; Notice of Allowance dated Apr. 1, 2021 in Application No. 30-2020-0030139 (M001).

KIPO; Notice of Allowance dated Apr. 1, 2021 in Application No. 30-2020-0030139 (M002).

TIPO; Notice of Allowance dated May 13, 2021 in Application No. 105122394.

TIPO; Notice of Allowance dated Mar. 5, 2021 in Application No. 105131284.

TIPO; Office Action dated Feb. 25, 2021 in Application No. 105134275.

TIPO; Notice of Allowance dated Mar. 4, 2021 in Application No. 106100823.

(56) References Cited

OTHER PUBLICATIONS

TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 2021 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.

(56) References Cited

OTHER PUBLICATIONS

USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of Si1xGex using Si2H6 and Ge2H6" Solid-State Electronics, 88, pp. 2-9 (2013).
Yanguas-Gil et al. "Modulation of the Growth per Cycle in Atomic Layer Deposition Using Reversible Surface Functionalization" Chemistry of Materials, 25, pp. 4849-4860 (2013).
CNIPA; Office Action dated Oct. 16, 2020 in Application No. 201610131743.1.
CNIPA; Office Action dated Jun. 16, 2020 in Application No. 201610897958.4.
CNIPA; Office Action dated Jul. 3, 2020 in Application No. 201610898822.5.
CNIPA; Notice of Allowance dated Oct. 9, 2020 in Application No. 201610898822.5.
CNIPA; Notice of Allowance dated Nov. 4, 2020 in Application No. 201710173292.2.
CNIPA; Office Action dated Aug. 31, 2020 in Application No. 201780044761.9.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.

(56) References Cited

OTHER PUBLICATIONS

CNIPA; Notice of Allowance dated Aug. 7, 2020 in Application No. 202030053609.1.
EPO; Office Action dated Jul. 29, 2008 in Application No. 00902194.0.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
JPO; Office Action dated Jun. 1, 2020 in Application No. 2016-206625.
JPO; Office Action dated Aug. 28, 2020 in Application No. 2017-139817.
JPO; Notice of Allowance dated Jul. 1, 2020 in Application No. 2019-025168.
JPO; Office Action dated Aug. 24, 2020 in Application No. 2019-119908.
JPO; Office Action dated Jun. 29, 2020 in Application No. 2020-502653.
KIPO; Decision of Intellectual Property Trial and Appeal Board dated Jun. 23, 2020 in Application No. 10-2012-0076564.
KIPO; Notice of Allowance dated Sep. 25, 2020 in Application No. 10-2013-0049598.
KIPO; Notice of Allowance dated Aug. 13, 2020 in Application No. 10-2013-0098575.
KIPO; Notice of Allowance dated Oct. 27, 2020 in Application No. 10-2014-0011764.
KIPO; Office Action dated Jul. 21, 2020 in Application No. 10-2014-0011765.
KIPO; Notice of Allowance dated Sep. 8, 2020 in Application No. 10-2014-0021615.
KIPO; Office Action dated Oct. 26, 2020 in Application No. 10-2014-0027217.
KIPO; Notice of Allowance dated Oct. 12, 2020 in Application No. 10-2014-0027305.
KIPO; Office Action dated Jul. 9, 2020 in Application No. 10-2014-0060120.
KIPO; Office Action dated Aug. 18, 2020 in Application No. 10-2014-0071653.
KIPO; Notice of Allowance dated Oct. 19, 2020 in Application No. 10-2014-0086902.
KIPO; Notice of Allowance dated Sep. 27, 2020 in Application No. 10-2014-0091092.
KIPO; Office Action dated Oct. 5, 2020 in Application No. 10-2014-0103853.
KIPO; Office Action dated Oct. 7, 2020 in Application No. 10-2014-0128626.
KIPO; Office Action dated Jul. 21, 2020 in Application No. 10-2017-0087308.
KIPO; Notice of Allowance dated Oct. 26, 2020 in Application No. 10-2017-0087308.
KIPO; Office Action dated Jun. 30, 2020 in Application No. 10-2019-0044213.
KIPO; Notice of Allowance dated Oct. 28, 2020 in Application No. 10-2020-0009462.
KIPO; Notice of Allowance dated Jul. 20, 2020 in Application No. 10-2020-7000992.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 22, 2020 in Application No. 30-2019-0058076.
TIPO; Notice of Allowance dated Jul. 1, 2020 in Application No. 105101537.
TIPO; Notice of Allowance dated Sep. 4, 2020 in Application No. 105111990.
TIPO; Office Action dated Sep. 7, 2020 in Application No. 105122394.
TIPO; Notice of Allowance dated Aug. 31, 2020 in Application No. 105122586.
TIPO; Office Action dated Sep. 18, 2020 in Application No. 105129977.
TIPO; Notice of Allowance dated Sep. 25, 2020 in Application No. 105130130.
TIPO; Office Action Received Aug. 25, 2020 in Application No. 105131284.
TIPO; Office Action dated Aug. 25, 2020 in Application No. 105131896.
TIPO; Office Action dated Sep. 30, 2020 in Application No. 105142668.
TIPO; Office Action dated Aug. 11, 2020 in Application No. 106100823.
TIPO; Office Action dated Jun. 17, 2020 in Application No. 106108152.
TIPO; Office Action dated Oct. 7, 2020 in Application No. 106108522.
TIPO; Office Action dated Aug. 21, 2020 in Application No. 106111548.
TIPO; Office Action dated Oct. 8, 2020 in Application No. 106111693.
TIPO; Office Action dated Sep. 30, 2020 in Application No. 106113604.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Oct. 8, 2020 in Application No. 106123203.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Sep. 25, 2020 in Application No. 108307759.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.

(56) References Cited

OTHER PUBLICATIONS

USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Notice of Allowance dated Jul. 6, 2020 in U.S. Appl. No. 13/184,351.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Advisory Action dated Nov. 10, 2015 in U.S. Appl. No. 14/079,302.
USPTO; Notice of Allowance dated Sep. 3, 2020 in U.S. Appl. No. 14/444,744.
USPTO; Notice of Allowance dated Aug. 6, 2020 in U.S. Appl. No. 14/457,058.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Aug. 3, 2020 in U.S. Appl. No. 14/829,565.
USPTO; Notice of Allowance dated Aug. 18, 2020 in U.S. Appl. No. 15/135,258.
USPTO; Non-Final Office Action dated Oct. 6, 2020 in U.S. Appl. No. 15/262,990.
USPTO; Final Office Action dated Oct. 2, 2020 in U.S. Appl. No. 15/286,503.
USPTO; Non-Final Office Action dated Sep. 2, 2020 in U.S. Appl. No. 15/377,439.
USPTO; Non-Final Office Action dated Jul. 1, 2020 in U.S. Appl. No. 15/380,909.
USPTO; Final Office Action dated Jul. 23, 2020 in U.S. Appl. No. 15/380,921.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Sep. 30, 2020 in U.S. Appl. No. 15/491,726.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Sep. 3, 2020 in U.S. Appl. No. 15/636,307.
USPTO; Notice of Allowance dated Jul. 2, 2020 in U.S. Appl. No. 15/672,096.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Oct. 6, 2020 in U.S. Appl. No. 15/691,241.
USPTO; Final Office Action dated Sep. 24, 2020 in U.S. Appl. No. 15/726,959.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Notice of Allowance dated Sep. 30, 2020 in U.S. Appl. No. 15/815,483.
USPTO; Final Office Action dated Sep. 17, 2020 in U.S. Appl. No. 15/835,328.
USPTO; Final Office Action dated Aug. 6, 2020 in U.S. Appl. No. 15/835,352.
USPTO; Notice of Allowance dated Aug. 17, 2020 in U.S. Appl. No. 15/843,899.
USPTO; Notice of Allowance dated Jun. 30, 2020 in U.S. Appl. No. 15/860,564.
USPTO; Notice of Allowance dated Aug. 19, 2020 in U.S. Appl. No. 15/861,418.
USPTO; Non-Final Office Action dated Sep. 2, 2020 in U.S. Appl. No. 15/890,037.
USPTO; Notice of Allowance dated Aug. 26, 2020 in U.S. Appl. No. 15/896,986.
USPTO; Non-Final Office Action dated Sep. 9, 2020 in U.S. Appl. No. 15/909,705.
USPTO; Final Office Action dated Sep. 24, 2020 in U.S. Appl. No. 15/917,224.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.

(56) References Cited

OTHER PUBLICATIONS

USPTO; Final Office Action dated Oct. 15, 2020 in U.S. Appl. No. 15/925,532.
USPTO; Non-Final Office Action dated Oct. 6, 2020 in U.S. Appl. No. 15/940,729.
USPTO; Non-Final Office Action dated Aug. 3, 2020 in U.S. Appl. No. 15/940,759.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Non-Final Office Action dated Oct. 6, 2020 in U.S. Appl. No. 15/967,146.
USPTO; Final Office Action dated Sep. 3, 2020 in U.S. Appl. No. 15/974,948.
USPTO; Notice of Allowance dated Oct. 14, 2020 in U.S. Appl. No. 15/974,988.
USPTO; Final Office Action dated Nov. 25, 2020 in U.S. Appl. No. 15/985,539.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Final Office Action dated Sep. 14, 2020 in U.S. Appl. No. 16/000,109.
USPTO; Final Office Action dated Oct. 6, 2020 in U.S. Appl. No. 16/000,125.
USPTO; Final Office Action dated Oct. 22, 2020 in U.S. Appl. No. 16/000,156.
USPTO; Final Office Action dated Oct. 15, 2020 in U.S. Appl. No. 16/004,041.
USPTO; Non-Final Office Action dated Sep. 8, 2020 in U.S. Appl. No. 16/039,817.
USPTO; Non-Final Office Action dated Nov. 24, 2020 in U.S. Appl. No. 16/039,938.
USPTO; Non-Final Office Action dated Aug. 4, 2020 in U.S. Appl. No. 16/042,791.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Notice of Allowance dated Sep. 14, 2020 in U.S. Appl. No. 16/100,012.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Final Office Action dated Nov. 19, 2020 in U.S. Appl. No. 16/128,282.
USPTO; Notice of Allowance dated Aug. 5, 2020 in U.S. Appl. No. 16/130,798.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Jul. 30, 2020 in U.S. Appl. No. 16/151,074.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Notice of Allowance dated Jul. 24, 2020 in U.S. Appl. No. 16/158,077.
USPTO; Non-Final Office Action dated Jul. 23, 2020 in U.S. Appl. No. 16/167,164.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Non-Final Office Action dated Nov. 4, 2020 in U.S. Appl. No. 16/176,517.
USPTO; Non-Final Office Action dated Oct. 29, 2020 in U.S. Appl. No. 16/183,258.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Final Office Action dated Nov. 27, 2020 in U.S. Appl. No. 16/205,899.
USPTO; Non-Final Office Action dated Jul. 15, 2020 in U.S. Appl. No. 16/210,922.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Final Office Action dated Oct. 14, 2020 in U.S. Appl. No. 16/251,534.
USPTO; Final Office Action dated Nov. 18, 2020 in U.S. Appl. No. 16/252,567.
USPTO; Notice of Allowance dated Aug. 6, 2020 in U.S. Appl. No. 16/255,639.
USPTO; Notice of Allowance dated Aug. 5, 2020 in U.S. Appl. No. 16/258,187.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Non-Final Office Action dated Aug. 5, 2020 in U.S. Appl. No. 16/397,045.
USPTO; Non-Final Office Action dated Aug. 19, 2020 in U.S. Appl. No. 16/400,814.
USPTO; Notice of Allowance dated Sep. 18, 2020 in U.S. Appl. No. 16/454,063.
USPTO; Non-Final Office Action dated Nov. 27, 2020 in U.S. Appl. No. 16/468,258.
USPTO; Non-Final Office Action dated Nov. 5, 2020 in U.S. Appl. No. 16/546,543.
USPTO; Notice of Allowance dated Sep. 16, 2020 in U.S. Appl. No. 16/598,768.
USPTO; Non-Final Office Action dated Oct. 16, 2020 in U.S. Appl. No. 16/679,885.
USPTO; Non-Final Office Action dated Nov. 16, 2020 in U.S. Appl. No. 16/713,311.

(56) References Cited

OTHER PUBLICATIONS

USPTO; Final Office Action dated Oct. 2, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Final Office Action dated Sep. 9, 2020 in U.S. Appl. No. 29/726,623.
USPTO; Notice of Allowance dated Nov. 23, 2020 in U.S. Appl. No. 29/726,623.
WIPO; International Search Report dated Oct. 13, 1998 in Application No. PCT/FI1998/000571.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.
WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
Akiyama et al. "Macro- and micro-scale simulation of growth rate and composition in MOCVD of yttria-stabilized zirconia" J. Crystal Growth 241, pp. 352-362 (2002).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Atta et al. "The Catalytic Activity of Ruthenates ARuO3 (A=Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Brewin et al. "UPS to deploy Bluetooth, wireless LAN network" Internet, pp. 1-5 (2001).
Bulletin Plasma Source—Dec. 2002: Type AX7610—Downstream Plasma Source. Source location: MKS Instruments, Inc. http://www.mksinst.com/. Accessed: Aug. 6, 2015. pp. 1-4 (2002).
Bulletin ASTRONe—Apr. 2002: Type AX7680—Reactive Gas Generator. Source location: MKS Instruments, Inc. http://www.mksinst.com/. Accessed: Aug. 6, 2015. pp. 1-2 (2002).
Bulletin ASTRONex—Jul. 2009: Type AX7685—Reactive Gas Generator. Source location: MKS Instruments, Inc. http://www.mksinst.com/. Accessed: Aug. 6, 2015. pp. 1-2 (2002).
Bulletin ASTRON hf-s—Mar. 2005: Type AX7645—Reactive Gas Generator. Source location: MKS Instruments, Inc. http://www.mksinst.com/. Accessed: Aug. 6, 2015. pp. 1-2 (2005).
Bulletin ENG-XSTREAM-340-09 OM Aug. 2006: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—Sep. 2006: Type AX7690—Remote Plasma Source. Source location: MKS Instruments, Inc. http://www.mksinst.com/. Accessed: Aug. 6, 2015. pp. 1-2 (2006).
Callaghan et al. "Magnetic Interactions in Ternary Ruthenium Oxides" Inorganic Chemistry, vol. 5, No. 9, pp. 1572-1576 (1966).
Choi et al. "UV irradiation effects on the bonding structure and electrical properties of ultra low-k SiOC(—H) thin films for 45 nm technology node" Current Applied Physics, 11, S109-S113 (2011).
Closser et al., "Molecular Layer Deposition of a Highly Stable Silicon Oxycarbide Thin Film Using an Organic Chlorosilane and Water," ACS Applied Materials & Interfaces 10, pp. 24266-24274 (2018).
Crystal IS "Application Note: Using UV Reflective Materials to Maximize Disinfection"; AN011; Jun. 16, 2016, found at https://www.klaran.com/using-uv-reflective-materials-to-maximize-disinfection.
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Esposito et al. "Preparation and characterization of lead ruthenate based composite cathodes for SOFC applications" Mater. Res. Soc. Symp. Proc., vol. 835, 6 pages (2005).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Hong et al. "Ultralow-dielectric-constant amoprhous boron nitride" Nature, vol. 582, 16 pages (2020).
Hubert et al., "A Stacked Sonos Technology, up to 4 Levels and 6nm Crystalline Nanowires, With Gate-All-Around or Independent Gates (-Flash), Suitable for Full 3D Integration," Minatec, IEDM09-637-640 (2009).

(56) References Cited

OTHER PUBLICATIONS

Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Johnson et al. "A brief review of atomic layer deposition: from fundamentals to applications" Materials Today, vol. 17, Issue 5, pp. 236-246 (2014).
Juppo et al. "Deposition of molybdenum thin films by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kovalgin et al. "Hot-Wire Assisted ALD: A Study Powered by In Situ Spectroscopic Ellipsometry" Adv. Mater. Interfaces 4, 1700058, 11 pages (2017).
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kumar et al. "Bringing the benefits of Java to Bluetooth" http://www.allembedded.com/story/OEG20020519S001, pp. 1-3 (2002).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Naslain et al. "Synthesis of highly tailored ceramic matrix composites by pressure-pulsed CVI" Solid State Ionics, 141-142, pp. 541-548 (2001).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Posseme et al. "Alternative process for thin layer etching: Application to nitride spacer etching stopping on silicon germanium" Apply. Phys. Lett. 105, 051604, pp. 1-4 (2014).
Provine et al. "Atomic Layer Deposition: Introduction to the Theory and Cambridge Nanotech Savannah & Fiji" NNIN ALD Roadshow Presentation, 49 pages (2012).
Rosemount 1199 Diaphragm Seal Systems, Product Data Sheet, 92 pages (2008).
Senateur et al. "Pulsed Injection MOCVD of Functional Electronic Oxides" Adv. Mater. Opt. Electron, 10, pp. 155-161 (2000).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).
Stannowski et al. "Growth process and properties of silicon nitride deposited by hot-wire chemical vapor deposition" J Applied Physics, vol. 93 No. 5, 9 pages (2013).
Tomozeiu et al. "Effects of UV photon irradiation on SiOx ($0<x<2$) structural properties" Applied Surface Science 253, pp. 376-380 (2006).
U.S. Appl. No. 60/394,086, filed Jul. 3, 2002 in the name of Jacques Schmitt, and entitled "ALD on a Rotary Susceptor" pp. 1-23 (2002).
U.S. Appl. No. 62/293,897, filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016).
Venkatesan et al. "A rugged lead-ruthenate pyrochlore membrane catalyst for highly seelctive oxidation of alcohols" J. Molecular Catalysis A: Chemical 250, pp. 87-93 (2006).
Xiao "Introduction to Semiconductor Manufacturing Technology" SPIE Press, ISBN 978-0-08194-9092-6, pp. 237-245 (2012).
Yuan et al. "A Bifunctional Air Electrode Catalyzed by Lead Ruthenate for Li-Air Batteries" ECS Transactions 69(19), pp. 23-32 (2015).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
CNIPA; Notice of Allowance dated Dec. 21, 2020 in Application No. 201610982040.X.
CNIPA; Office Action dated Nov. 20, 2020 in Application No. 201710762817.6.
CNIPA; Notice of Allowance dated Dec. 28, 2020 in Application No. 201930704935.1.
CNIPA; Notice of Allowance dated Dec. 10, 2020 in Application No. 202030352604.9.
CNIPA; Office Action dated Jan. 25, 2021 in Application No. 202030579755.8.
JPO; Notice of Allowance dated Nov. 27, 2020 in Application No. 2016-206625.
JPO; Office Action dated Jan. 26, 2021 in Application No. 2017-139817.
JPO; Notice of Allowance dated Nov. 26, 2020 in Application No. 2020-502653.
KIPO; Office Action dated Jan. 25, 2021 in Application No. 10-2014-0011765.
KIPO; Notice of Allowance dated Jan. 4, 2021 in Application No. 10-2014-0060120.

(56) References Cited

OTHER PUBLICATIONS

KIPO; Notice of Allowance dated Jan. 4, 2021 in Application No. 10-2014-0071653.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Jan. 25, 2021 in Application No. 10-2014-0145220.
KIPO; Office Action dated Jan. 6, 2021 in Application No. 10-2015-0025314.
KIPO; Office Action dated Dec. 23, 2020 in Application No. 10-2019-0044213.
KIPO; Office Action dated Nov. 14, 2020 in Application No. 10-2020-0101096.
KIPO; Notice of Allowance dated Oct. 20, 2020 in Application No. 30-2019-0054642.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in U.S. Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.
USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Advisory Action dated Jan. 14, 2021 in U.S. Appl. No. 16/055,532.
USPTO; Final Office Action dated Dec. 15, 2020 in U.S. Appl. No. 16/108,950.
USPTO; Final Office Action dated Jan. 6, 2021 in U.S. Appl. No. 16/117,530.
USPTO; Notice of Allowance dated Feb. 12, 2021 in U.S. Appl. No. 16/128,282.
USPTO; Notice of Allowance dated Feb. 8, 2021 in U.S. Appl. No. 16/132,142.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Final Office Action dated Dec. 18, 2020 in U.S. Appl. No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.
USPTO; Non-Final Office Action dated Jan. 12, 2021 in U.S. Appl. No. 16/453,249.

(56) References Cited

OTHER PUBLICATIONS

USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Notice of Allowance dated Dec. 28, 2020 in U.S. Appl. No. 16/833,279.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages (1999).
Kim et al. "High Growth Rate in Atomic Layer Deposition of TiO2 Thin Films by UV Irradiation" Electrochemical and Solid-State Letters, 14(4), pp. H146-H148 (2011).
Lee et al. "Enhancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VCl4 as Precursor" Coatings, 8, 431, pp. 1-11 (2018).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of Y2O3 Thin Films from β-Diketonate Precursors" Chemical Vapor Deposition 7(1) pp. 44-50 (2001).
U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.

(56) References Cited

OTHER PUBLICATIONS

TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.

(56) References Cited

OTHER PUBLICATIONS

USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.

(56) References Cited

OTHER PUBLICATIONS

USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of the Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pp. G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1—xO2-d (x=0. 25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).

(56) References Cited

OTHER PUBLICATIONS

Zientara et al. Journal of the European Ceramic Society, 27, Abstract, 1 page (2007).
CNIPA; Office Action dated Jan. 10, 2013 in Application No. 201080015699.9.
CNIPA; Office Action dated Aug. 1, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
CNIPA; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.
CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.
CNIPA; Office Action dated Sep. 9, 2016 in Application No. 201280057542.1.
CNIPA; Notice of Allowance dated Jan. 3, 2017 in Application No. 201280057542.1.
CNIPA; Office Action dated Dec. 5, 2016 in Application No. 201310412808.6.
CNIPA; Notice of Allowance dated Jul. 20, 2017 in Application No. 201310412808.6.
CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Nov. 4, 2019 in Application No. 201610898822.5.
CNIPA; Office Action dated May 18, 2020 in Application No. 201610982040.X.
CNIPA; Office Action dated May 29, 2020 in Application No. 201710131319.1.
CNIPA; Office Action dated Jun. 1, 2020 in Application No. 201710173292.2.
CNIPA; Office Action dated Dec. 20, 2018 in Application No. 201710738549.4.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Nov. 11, 2019 in Application No. 201810379112.0.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Jun. 2, 2020 in Application No. 202030048819.1.
CNIPA; Notice of Allowance dated May 15, 2020 in Application No. 202030048854.3.
CNIPA; Notice of Allowance dated May 15, 2020 in Application No. 202030053560.X.
CNIPA; Notice of Allowance dated May 20, 2020 in Application No. 202030053634.X.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.

(56) References Cited

OTHER PUBLICATIONS

EPO; Office Action dated Aug. 10, 2018 in Application No. 09767208.3.
EPO; Notice of Allowance dated Aug. 1, 2019 in Application No. 09767208.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.

(56) References Cited

OTHER PUBLICATIONS

KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Office Action dated Feb. 3, 2020 in Application No. 10-2014-0021615.
KIPO; Office Action dated Feb. 15, 2020 in Application No. 10-2014-0027305.
KIPO; Office Action dated May 21, 2020 in Application No. 10-2014-0086902.
KIPO; Office Action dated May 21, 2020 in Application No. 10-2014-0091092.
KIPO; Office Action dated Mar. 11, 2020 in Application No. 10-2014-0103853.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Nov. 9, 2016 in Application No. 10-2016-7023913.
KIPO; Notice of Allowance dated May 30, 2017 in Application No. 10-2016-7023913.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.

(56) References Cited

OTHER PUBLICATIONS

KIPO; Notice of Allowance dated Nov. 29, 2019 in Application No. 10-2019-0127773.
KIPO; Offie Action dated Apr. 22, 2020 in Application No. 10-2020-0009462.
KIPO; Office Action dated Feb. 12, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Application No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Notice of Allowance dated Jul. 18, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.

(56) References Cited

OTHER PUBLICATIONS

TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.
TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated May 7, 2019 in Application No. 105104453.
TIPO; Office Action dated Dec. 13, 2019 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.
TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Jan. 17, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Mar. 17, 2020 in Application No. 105130130.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Dec. 26, 2018 in Application No. 106127690.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated Jun. 28, 2019 in Application No. 108102948.
TIPO; Office Action dated Dec. 24, 2019 in Application No. 108105002.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.

(56) References Cited

OTHER PUBLICATIONS

USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.

(56) References Cited

OTHER PUBLICATIONS

USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Final Office Action dated 22019 in U.S. Appl. No. 15/410,503.
USPTO; Non-Final Office Action dated 042019 in U.S. Appl. No. 15/410,503.
USPTO; Notice of Allowance dated 082019 in U.S. Appl. No. 15/410,503.
USPTO; Non-Final Office Action dated 082018 in U.S. Appl. No. 15/428,808.
USPTO; Final Office Action dated 12019 in U.S. Appl. No. 15/428,808.
USPTO; Notice of Allowance dated 42019 in U.S. Appl. No. 15/428,808.
USPTO; Non-Final Office Action dated 042018 in U.S. Appl. No. 15/434,051.
USPTO; Final Office Action dated 082018 in U.S. Appl. No. 15/434,051.
USPTO; Advisory Action dated 122018 in U.S. Appl. No. 15/434,051.
USPTO; Non-Final Office Action dated 012019 in U.S. Appl. No. 15/434,051.
USPTO; Notice of Allowance dated 062019 in U.S. Appl. No. 15/434,051.
USPTO; Notice of Allowance dated 102017 in U.S. Appl. No. 15/450,199.
USPTO; Non-Final Office Action dated 122017 in U.S. Appl. No. 15/466,149.
USPTO; Notice of Allowance dated 042018 in U.S. Appl. No. 15/466,149.
USPTO; Non-Final Office Action dated 042018 in U.S. Appl. No. 15/472,750.
USPTO; Notice of Allowance dated 112018 in U.S. Appl. No. 15/472,750.
USPTO; Non-Final Office Action dated 102017 in U.S. Appl. No. 15/489,453.
USPTO; Final Office Action dated 42018 in U.S. Appl. No. 15/489,453.
USPTO; Non-Final Office Action dated 92018 in U.S. Appl. No. 15/489,453.
USPTO; Final Office Action dated 22019 in U.S. Appl. No. 15/489,453.
USPTO; Non-Final Office Action dated 062019 in U.S. Appl. No. 15/489,453.
USPTO; Notice of Allowance dated 102019 in U.S. Appl. No. 15/489,453.
USPTO; Notice of Allowance dated 122017 in U.S. Appl. No. 15/489,660.
USPTO; Non-Final Office Action dated 122017 in U.S. Appl. No. 15/476,035.
USPTO; Notice of Allowance dated 32018 in U.S. Appl. No. 15/476,035.
USPTO; Notice of Allowance dated 82018 in U.S. Appl. No. 15/476,035.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.

(56) References Cited

OTHER PUBLICATIONS

USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27,2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Action dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.

(56) References Cited

OTHER PUBLICATIONS

USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
USPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.

(56) References Cited

OTHER PUBLICATIONS

USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
UPSTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.

(56) References Cited

OTHER PUBLICATIONS

USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.

(56) References Cited

OTHER PUBLICATIONS

USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 28, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Advisory Action dated Apr. 24, 2020 in U.S. Appl. No. 14/219,879.

(56) References Cited

OTHER PUBLICATIONS

USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action Dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated Apr. 28, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.

(56) References Cited

OTHER PUBLICATIONS

USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14,793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Action dated Sep. 30, 2016 in U.S. Appl. No. 14/808,979.

(56) References Cited

OTHER PUBLICATIONS

USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.

(56) References Cited

OTHER PUBLICATIONS

USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.

(56) References Cited

OTHER PUBLICATIONS

USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.
USPTO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.

(56) References Cited

OTHER PUBLICATIONS

USPTO; Notice of Allowance dated Nov. 30, 2018 in U.S. Appl. No. 15/472,750.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Non-Final Office Action dated Feb. 8, 2019 in U.S. Appl. No. 15/672,119.

(56) References Cited

OTHER PUBLICATIONS

USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
USPTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Apr. 24, 2020 in U.S. Appl. No. 15/815,483.

(56) References Cited

OTHER PUBLICATIONS

USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Non-Final Office Action dated Feb. 20, 2020 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Final Office Action dated Jun. 15, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Non-Final Office Action dated Apr. 2, 2020 in U.S. Appl. No. 15/974,948.
USPTO; Non-Final Office Action dated May 15, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.

(56) References Cited

OTHER PUBLICATIONS

USPTO; Non-Final Office Action dated Apr. 1, 2020 in U.S. Appl. No. 15/997,445.
USPTO; Non-Final Office Action dated Mar. 3, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Non-Final Office Action dated Apr. 22, 2020 in U.S. Appl. No. 16/000,156.
USPTO; Non-Final Office Action dated May 7, 2020 in U.S. Appl. No. 16/004,041.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Non-Final Office Action dated May 27, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.
USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.
USPTO; Non-Final Office Action dated Mar. 16, 2020 in U.S. Appl. No. 16/116,708.
USPTO; Non-Final Office Action dated Feb. 6, 2020 in U.S. Appl. No. 16/117,530.
USPTO; Non-Final Office Action dated Jun. 22, 2020 in U.S. Appl. No. 16/128,282.
USPTO; Non-Final Office Action dated Apr. 21, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Non-Final Office Action dated Feb. 28, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Nov. 5, 2019 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Notice of Allowance dated Jun. 19, 2020 in U.S. Appl. No. 16/161,744.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Oct. 3, 2019 in U.S. Appl. No. 16/200,100.
USPTO; Non-Final Office Action dated May 29, 2020 in U.S. Appl. No. 16/205,899.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Non-Final Office Action dated Feb. 19, 2020 in U.S. Appl. No. 16/242,829.

(56) References Cited

OTHER PUBLICATIONS

USPTO; Final Office Action dated Jun. 15, 2020 in U.S. Appl. No. 16/242,829.
USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Non-Final Office Action dated May 27, 2020 in U.S. Appl. No. 16/252,567.
USPTO; Non-Final Office Action dated Apr. 16, 2020 in U.S. Appl. No. 16/255,639.
USPTO; Non-Final Office Action dated Jun. 30, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Notice of Allowance dated Jun. 13, 2019 in U.S. Appl. No. 16/396,475.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.
USPTO; Non-Final Office Action dated May 12, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Jun. 11, 2020 in U.S. Appl. No. 16/598,768.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Apr. 13, 2020 in U.S. Appl. No. 16/833,279.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Non-Final Office dated Apr. 24, 2020 in U.S. Appl. No. 29/726,623.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO; International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO; International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.

(56) References Cited

OTHER PUBLICATIONS

WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 in Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Alen, "Atomic layer deposition of TaN, NbN and MoN films for Cu Metallizations," University of Helsinki Finland, 72 pages, (2005).
Arita et al. "Electrical and optical properties of germaniuim-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Bark et al. "Large-area niobium disulfide thin films as transparent electrodes for devices based on two-dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Basuvalingam et al. "NS-WeA6—Low Temperature ALD for Phase-controlled Synthesis of 2D Transition Metal (M=Ti, Nb) di-(MX2) and Tri-(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Closser et al., "Molecular Layer Deposition of a Highly Stable Silicon Oxycarbide Thin Film Using an Organic Chlorosilane and Water," ACS Applied Materials & Interfaces 10, pp. 24266-24274.
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
De Silva et al., "Inorganic Hardmask Development for Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3]. pp. 287-300. (1999).
Fallica et al., "Dynamic Absorption Coefficients of Chemically Amplified Resists and Nonchemically Amplified Resists at Extreme Ultraviolet", J. Micro/Nanolith. MEMS MOEMS 15(3), pp. 033506-1-033506-7 (2016).

(56) References Cited

OTHER PUBLICATIONS

"Fiji F200 200mm Thermal/Plasma ALD Systems: Installation and Use Manual." CAW-02635 Rev. 0.6 (Mar. 13, 2012). Cambridge NanoTech Inc. pp. 1-164 (2012).
Fu et al., "Controlled Synthesis of Atomically Thin IT-TaS2 for Tunable Charge Density Wave Phase Transitions" Chem. Mater. 28, pp. 7613-7618 (2016).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Microstructure of Black Molybdenum Photothermal Converter Layers Deposited by the Pyrolytic Hydrogen Reduction of $MoO_2Cl_2$" Thin Solid Films, 79, pp. 39-49 (1981).
Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2]. pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c—Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E=50-30,000 eV, Z=1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hossain et al., "Recent Advances in Two-Dimensional Materials with Charge Density Waves: Synthesis, Characterization and Applications" Crystals 7, 298, 19 pages (2017).
Hubert et al., "A Stacked Sonos Technology, up to 4 Levels and 6nm Crystalline Nanowires, With Gate-All-Around or Independent Gates (-Flash), Suitable for Full 3D Integration," Minatec, IEDM09-637.
Hudis, "Surface Crosslinking of Polyethylene Using a Hydrogen Glow Discharge," J. Appl. Polym. Sci., 16 (1972) 2397.
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MCl12 (M=CO, Ni, Cu, Zn) complexes with diamine ligands," Inorganica Chimica Acta 358, pp. 3293-3302 (2005).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Katamreddy et al., "ALD and Characterization of Aluminum Oxide Deposited on Si(100) using Tris(diethylamino) Aluminum and Water Vapor," Journal of the Electrochemical Society, 153 (10).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kimi et al., "Passivation Effect on Low-k S/OC Dielectrics by H2 Plasma Treatment," Journal of the Korean Physical Society, 40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al., "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
King, Plasma Enhanced Atomic Layer Deposition of SiNx: H and SiO2, J. Vac. Sci. Technol., A29(4) (2011).
Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).

(56) References Cited

OTHER PUBLICATIONS

Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kogelschatz et al. "Ozone Generation from Oxygen and Air: Discharge Physics and Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Microstructure Evolution in Single-Phase TixTa1—N Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kucheyev et al. "Mechanisms of Atomic Layer Deposition on Substrates with Ultrahigh Aspect Ratios." Langmuir. 24 [3]. pp. 943-948 (2008).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kurosawa et al., "Synthesis and Characterization of Plasma-Polymerized Hexamethyldisiloxane Films," Thin Solid Films, 506-507, 176-179 (2006).
Kwon et al., "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al., "Characteristics of Low-K Sioc Films Deposited via Atomic Layer Deposition," Thin Solid Films 645, pp. 334-339 (2018).
Lee et al., Layer Selection by Multi-Level Permutation in 3-D Stacked NAND Flash Memory, IEEE Electron Device Letters, vol. 37, No. 7, 866-869 (2016).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al., "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).
Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
MacKenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2Al)2O]n and (RAlO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnCl4 Precursor," ECS Transactions, 69 (5), 279-285 (2015).
Mukai et al., "A Study of CD Budget in Spacer Patterning Technology," Proc. of SPIE, 6924, 1-8 (2008).
Naito et al. "Electrical Transport Properties in 2H—NbS2, —NbSe2, —TaS2 and —TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).

(56) References Cited

OTHER PUBLICATIONS

Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Okamoto et al., "Luminescent Properties of Pr3+-sensitized LaPO4: Gd3+ Ultraviolet-B Phosphor Under Vacuum-Ultraviolet Light Excitation," J. App. Phys. 106, 013522 (2009).
Park, "Substituted Aluminum Metal Gate on High-K Dielectric for Low Work-Function and Fermi-Level Pinning Free," 4 pages, IEEE 0-7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-.
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plasma Enhanced Atomic Layer Deposited Silicon Nitride," AIP Advances, 6 (2016).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Roddy, "Transport Reactions and Vaporization Studies of Some Vanadium Halides", Iowa State university of Science and Technology dissertation, 207 pages (1962).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).
Sanders et al., "Crystalline and electronic structure of single-layer $TaS_2$" Phys. Rev. B. 94, 081404, 6 pages (2016).
Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Seshadri et al., "Ultrathin Extreme Ultraviolet Patterning Stack Using Polymer Brush as an Adhesion Promotion Layer," Journal of Micro/Nanolithography, MEMS, and MOEMS 16(3) (2017).
Shamma et al., "PDL Oxide Enabled Doubling," Proc. of SPIE, 6924, 69240D, 1-10 (2008).
Simchi et al., "Sulfidation of 2D transition metals (Mo, W, Re, Nb, Ta): thermodynamics, processing, and characterization" J. Materials Science 52: 17, 9 pages (2017).
Spear et al., "Chemical Transport Reactions in the Vanadium-Silicon-Oxygen System and the Ternary Phase Diagram", Journal of the Less-Common Metals, 14, pp. 69-75 (1968).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).
Su et al. "Polymer Precursor Route to Metal Borides", Chem. Mater., 5, pp. 1659-1668 (1993).
Svetin et al., "Three-dimensional resistivity and switching between correlated electronic states in 1T-$TaS_2$" Nature, Scientific Reports Apr. 12, 2017, 7:46048, 10 pages (2017).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt—Ru Binary Alloy Thin Films for Work Function Tuning," IEEE Electron Device Letters, vol. 27, No. 7, pp. 542-545 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tsend et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).

(56) References Cited

OTHER PUBLICATIONS

Wirths, et al, "SiGeSn Growth tudies Using Reduced Pressure Chemical Vapor Deposition Towards Optoeleconic Applications," This Soid Films, 557, 183-187 (2014).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," SMIC et al. (2016).
Xu et al., "Contacts between Two- and Three-Dimensional Materials: Ochmic, Schottky, and p-n Heterojunctions" ACS Nano 10, pp. 4895-4919 (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.

* cited by examiner

SHOWERHEAD ASSEMBLY AND COMPONENTS THEREOF

CROSS-REFERENCE TO RELATED APPLICATIONS

This application is a Continuation of, and claims priority to and the benefit of, U.S. patent application Ser. No. 14/444,744, filed on Jul. 28, 2014 and entitled "SHOWERHEAD ASSEMBLY AND COMPONENTS THEREOF," which is hereby incorporated by reference herein.

FIELD OF DISCLOSURE

The present disclosure generally relates to gas-phase reactors. More particularly, the disclosure relates to gas distribution systems for gas-phase reactors and to components of the gas distribution systems.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes a reactor including a reaction chamber, one or more precursor gas sources fluidly coupled to the reaction chamber, one or more carrier or purge gas sources fluidly coupled to the reaction chamber, a gas distribution system to deliver gasses (e.g., the precursor gas(ses) and/or carrier or purge gas(ses)) to a surface of a substrate, and an exhaust source fluidly coupled to the reaction chamber. The system also typically includes a susceptor to hold a substrate in place during processing. The susceptor can be configured to move up and down to receive a substrate and/or can rotate during substrate processing.

The gas distribution system may include a showerhead assembly for distributing gas(ses) to a surface of the substrate. The showerhead assembly is typically located above the substrate. During substrate processing, gas(ses) flow from the showerhead assembly in a downward direction toward the substrate and then radially outward over the substrate. A typical showerhead assembly includes a gas distribution plate with a chamber adjacent to one surface of the distribution plate and a plurality of apertures spanning between the chamber and a distribution surface (substrate side) of the distribution plate. The apertures are generally cylindrical in shape and are spaced apart from each other, leaving a significant horizontal portion on both the chamber-side surface and the distribution surface of the distribution plate.

As gasses flow from the chamber, through the distribution plate, toward the substrate, gasses can linger on the horizontal surfaces of the distribution plate. This lingering can make it difficult to purge the gasses—i.e., additional time and/or a reduced vacuum pressure may be required to purge the gasses from the horizontal surfaces. The additional time and/or reduced vacuum pressure requirements can add cost and time associated with purging gasses. In addition, the lingering gas can cause stress in films that are formed on the distribution surface during substrate processing. The stressed films may have to be cleaned from the distribution surface more frequently than non-stressed or less stressed films. The stressed films may also generate particles as the stressed films blister and crack. The generated particles can, in turn, land on a surface of a substrate and create defects in devices formed using the substrate. Further, the extended time of the gas over the surface can contribute to excessive decomposition for certain precursors, which may lead to undesirable side effects such as particles or poor film quality. Accordingly, improved showerhead assemblies and distribution plates are desired.

SUMMARY OF THE DISCLOSURE

Various embodiments of the present disclosure relate to gas distribution systems, gas distribution system components, gas-phase reactor systems including gas distribution systems, and to methods of using the gas distribution and reactor systems. While the ways in which various embodiments of the present disclosure address drawbacks of prior gas distribution systems and reactor systems are discussed in more detail below, in general, exemplary gas distribution systems include a plurality of apertures, wherein the apertures are configured to reduce an amount of surface area on a distribution plate that is perpendicular to the gas flow (e.g., a distribution plate of a showerhead gas distribution system), and thereby reduce areas within the gas distribution system that allow gasses to linger. Exemplary gas distribution systems, assemblies, and distribution plates produce less particles for a given number of process runs, require less purge time and/or less vacuum to purge a reactor, and/or allow more runs between cleaning, compared to traditional plates, assemblies, and systems.

In accordance with exemplary embodiments of the disclosure, a showerhead assembly for distributing a gas within a reaction chamber includes a gas distribution plate, a chamber formed within the assembly, the chamber adjacent to a first surface of the gas distribution plate, and a plurality of apertures extending from the chamber to a distribution surface. In accordance with various aspects of these embodiments, one or more of the apertures includes a first section comprising a first-section first end in contact with the first surface, a first-section second end, and a first-section tapering wall there between, wherein a cross-sectional area of the first-section first end is greater than a cross-sectional area of the first-section second end; a conduit comprising a conduit first end fluidly coupled to the first-section second end and a conduit second end; and a second section comprising a second-section first end in contact with the second surface, a second-section second end fluidly coupled to the conduit second end, and a second-section tapering wall there between, wherein a cross-sectional area of the second-section first end is greater than a cross-sectional area of the second-section second end. In accordance with further exemplary embodiments, the first section, the conduit, and the second section share a common axis. In accordance with further aspects, a length and width of the aperture are configured to provide a suitable pressure difference between the chamber and a reaction chamber. By way of examples, a length of the aperture can be greater than about 1 mm, and/or can range from about 1 mm to about 50 mm, or about 10 mm to about 40 mm, or about 20 mm to about 30 mm. Exemplary apertures are configured to facilitate gas flow in a direction of the conduit (e.g., in a direction that the gas enters the chamber and/or exits from the distribution plate) and/or to reduce a surface area that is perpendicular to the gas flow, so as to minimize gas stagnation points. To facilitate directing the gas flow in a desired direction, the first and/or second sections can include continually tapering sidewalls—e.g., the sidewalls can be frusto-conical, frusto-pyramidal, semi-spherical or similar shape.

In accordance with further exemplary embodiments of the disclosure, a distribution plate includes a first surface, a second surface, and a plurality of apertures spanning between the first surface and the second surface. The apertures can have the structure and shapes as noted herein, including those described above.

In accordance with further exemplary embodiments of the disclosure, a gas-phase reactor includes a showerhead assembly, including a gas distribution plate as described herein.

In accordance with yet further exemplary embodiments of the disclosure, a gas-distribution system includes a showerhead assembly and/or a gas distribution plate as described herein.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 3C:
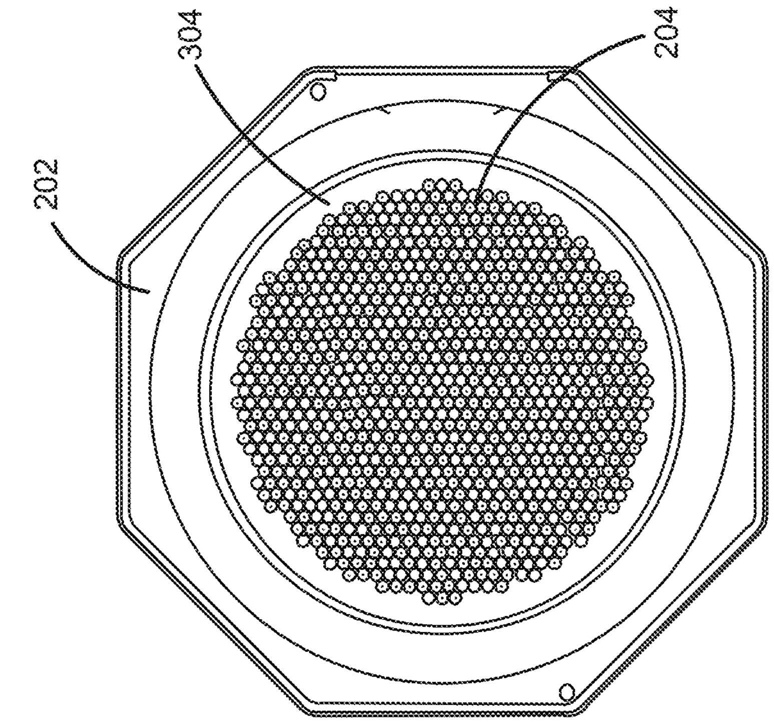
Figure 3B:
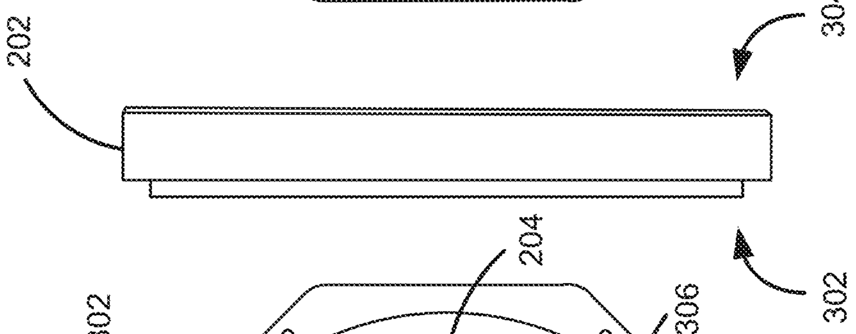
Figure 3A:
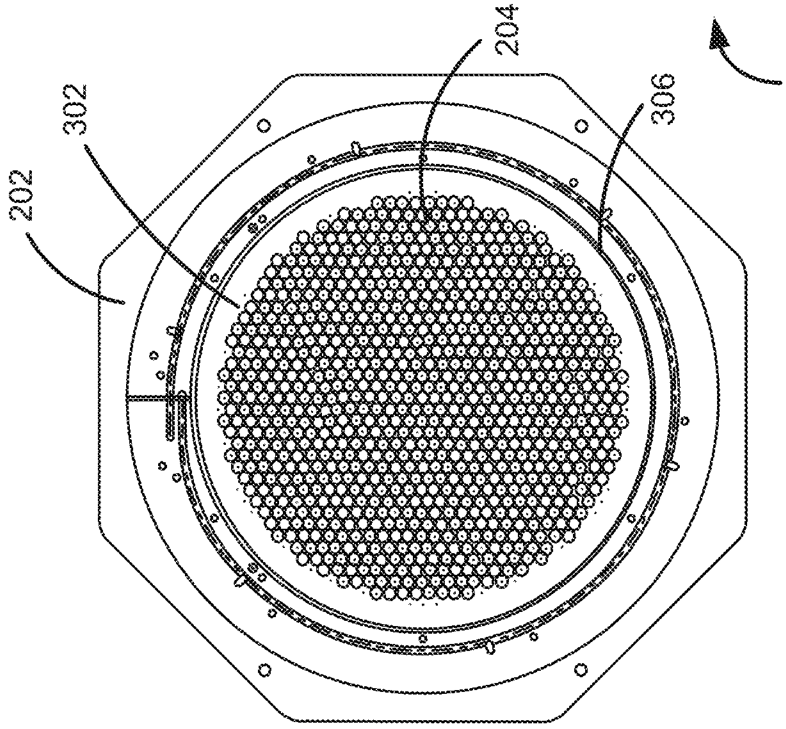

FIGS. 3(*a*)-3(*c*) illustrate a distribution plate in accordance with exemplary embodiments of the disclosure.

Figure 4:
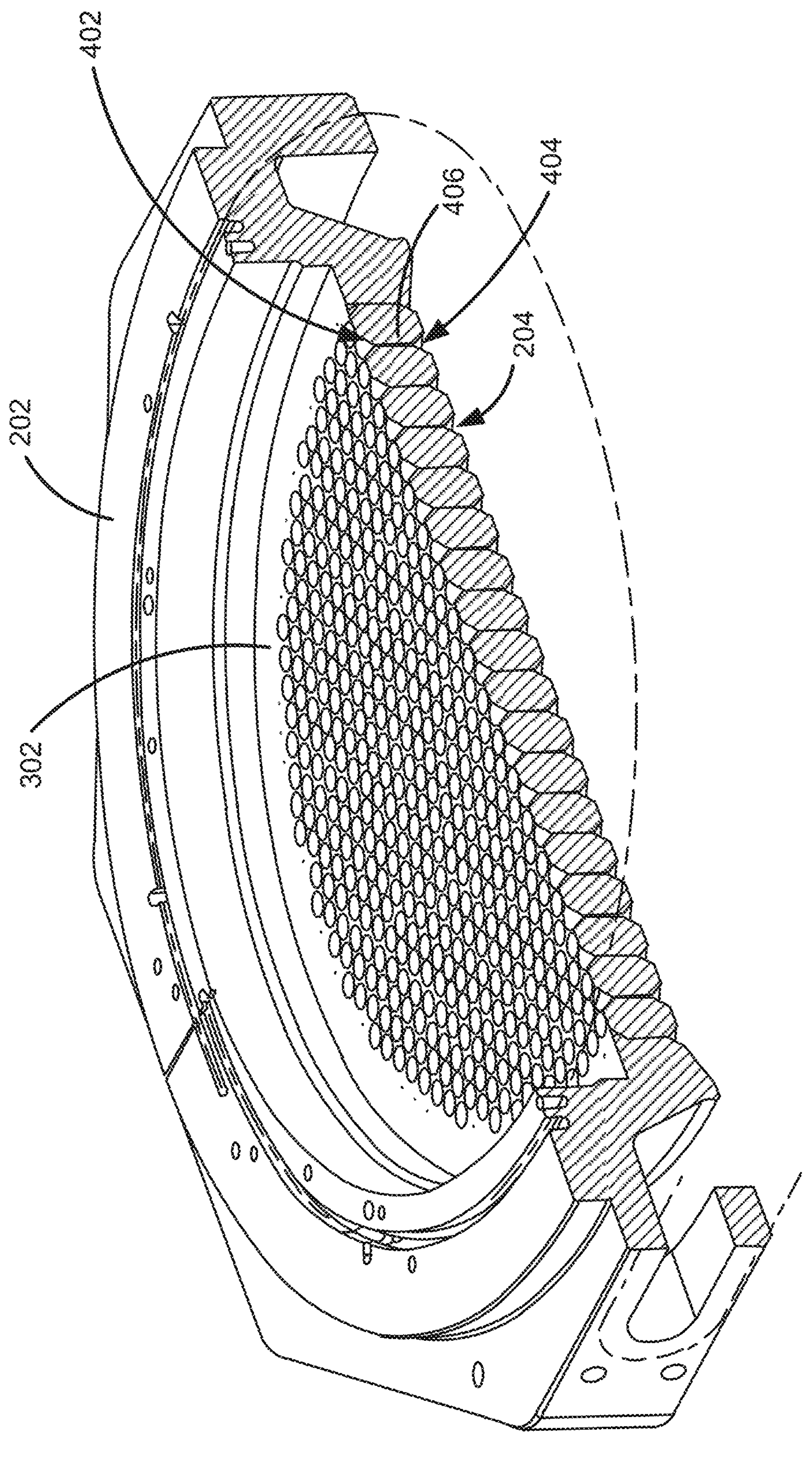

FIG. 4 illustrates a cross-sectional view of a distribution plate in accordance with exemplary embodiments of the disclosure.

Figure 5:
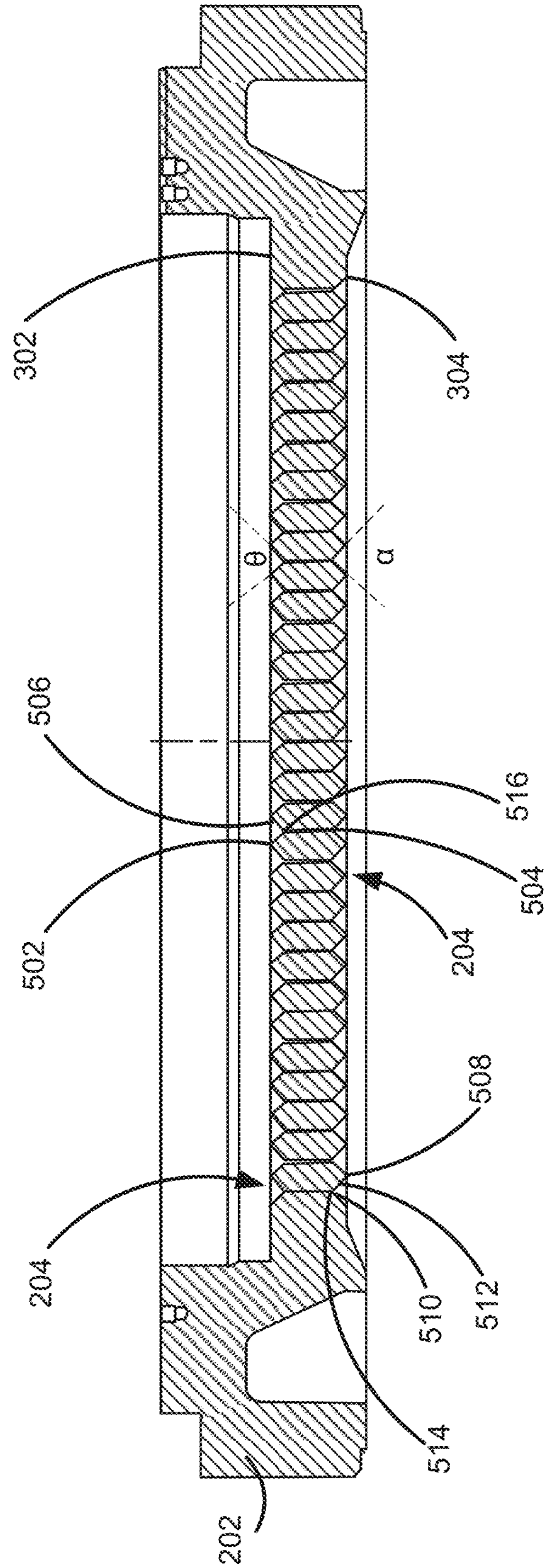

FIG. 5 illustrates another cross-sectional view of a distribution plate in accordance with exemplary embodiments of the disclosure.

Figure 6:
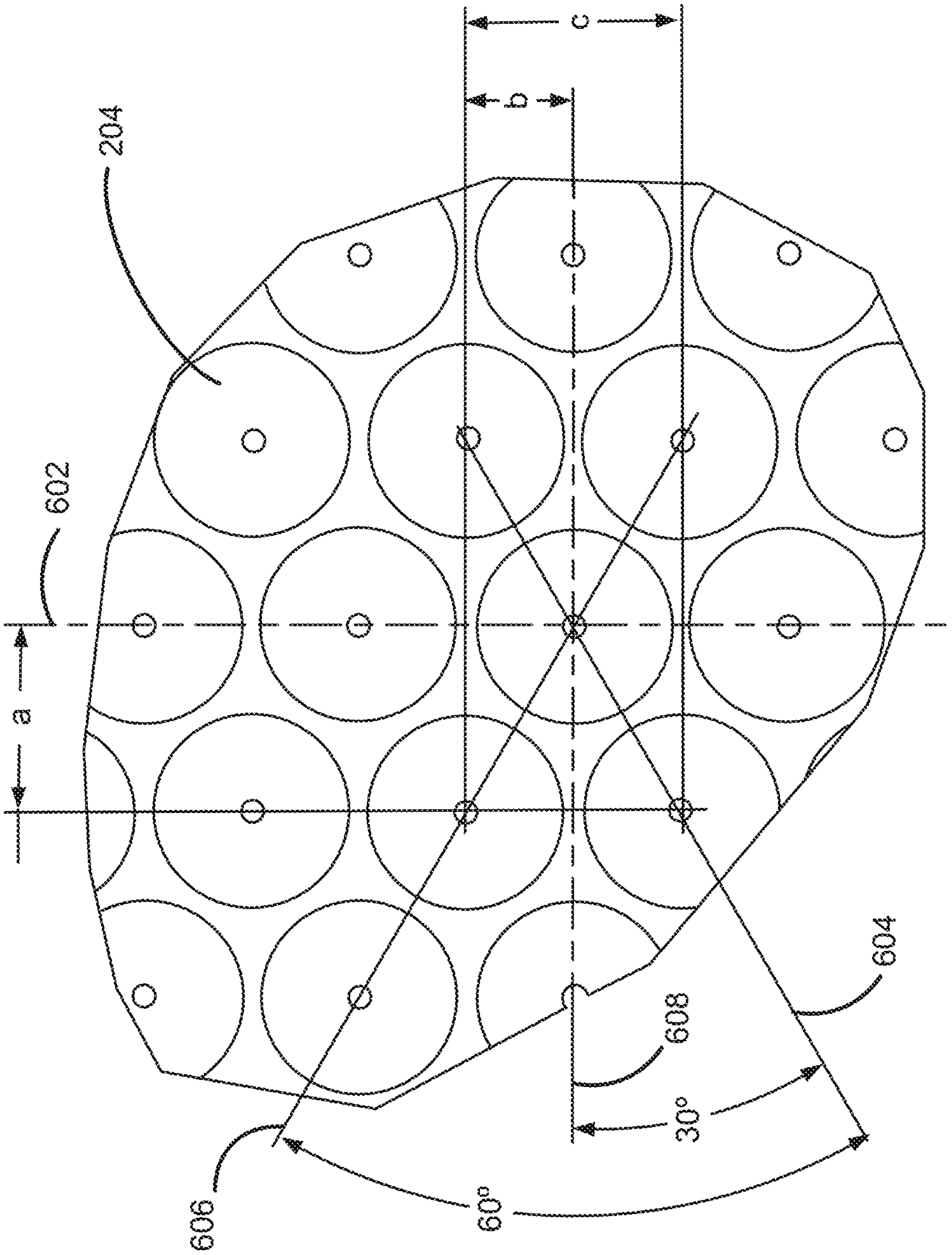

FIG. 6 illustrates a plan view of a portion of a distribution plate, illustrating apertures in accordance with exemplary embodiments of the disclosure.

Figure 7:
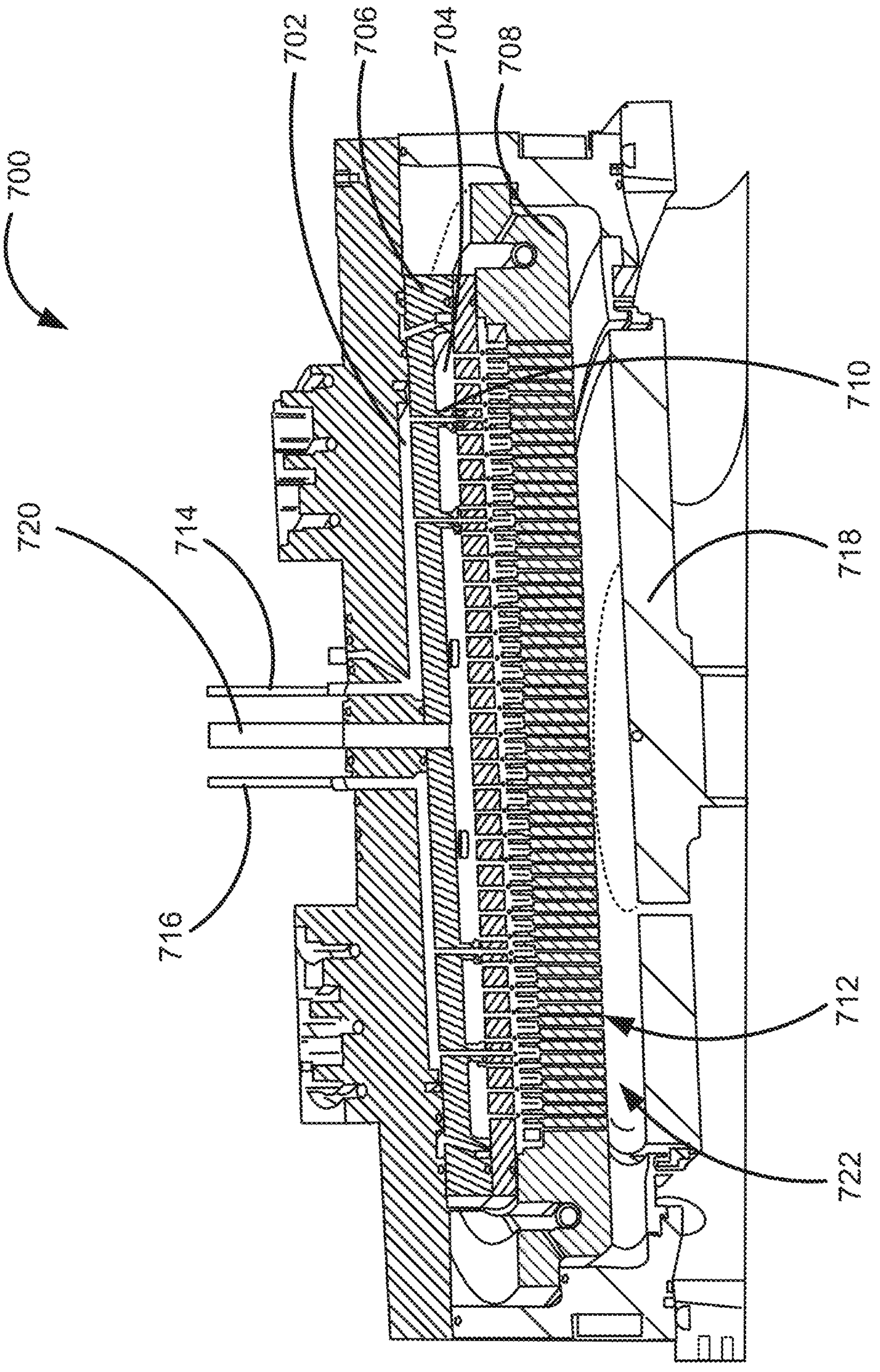

FIG. 7 illustrates another showerhead assembly in accordance with additional exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to gas distribution systems, to showerhead assemblies of gas distribution systems, to distribution plates of gas distribution systems, to reactor systems including the gas distribution systems, and to methods of using the gas distribution systems, showerhead assemblies, distribution plates, and reactor systems. Gas distribution systems, showerhead assemblies, gas distribution plates, and reactor systems as described herein can be used to process substrates, such as semiconductor wafers, in gas-phase reactors, such as chemical vapor deposition (CVD) reactors, including plasma-enhanced CVD (PECVD) reactors, low-pressure CVD (LPCVD) reactors, atomic layer deposition (ALD) reactors, and the like. By way of examples, the assemblies and components described herein can be used in showerhead-type gas-phase reactor systems, in which gasses generally flow in a downward direction from a showerhead and toward a substrate. Such systems are generally cold-wall type reactors, in which a substrate is heated—e.g., via a substrate support or susceptor.

Figure 1:
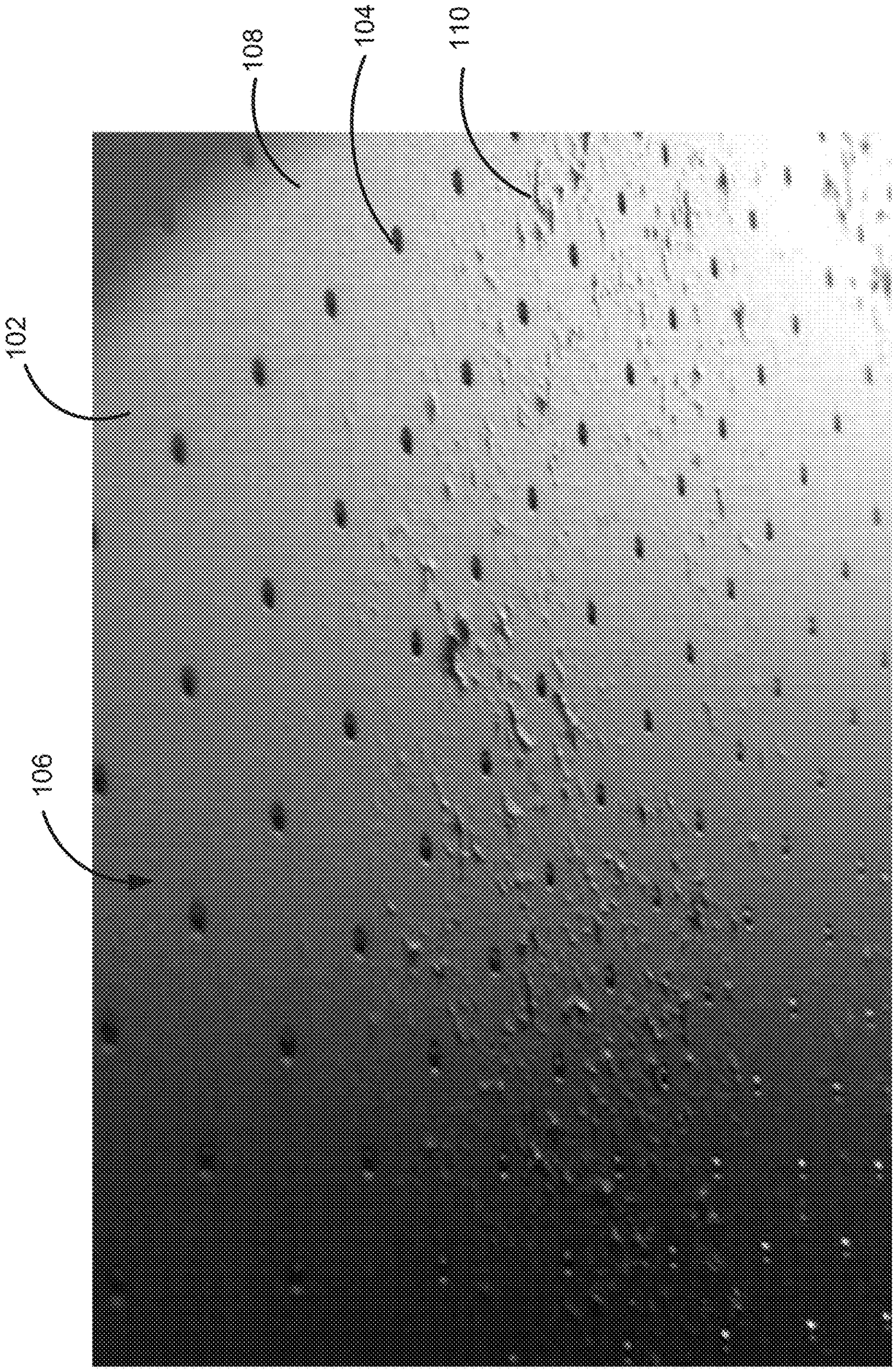
FIG. 1 (PRIOR ART)
FIG. 1 illustrates a surface of a prior-art distribution plate, having a peeling film thereon.

Typical showerhead assemblies include a gas distribution plate 102, including a plurality of cylindrical apertures 104 formed therein, as illustrated in FIG. 1. During operation of a reactor system that includes distribution plate 102, material deposits onto a surface of distribution plate 102. For example, when a showerhead including distribution plate 102 is used to deposit material onto a substrate, the material can also be deposited onto a surface of the distribution plate.

Gas distribution plate 102 includes a substantial area (e.g., area 106) between apertures. Area 106 is generally perpendicular to a direction of gas flow exiting gas distribution plate 102. Gas can accumulate and linger on area 106 of gas distribution plate 102 and/or a corresponding area between apertures on a showerhead chamber side of the gas distribution plate. When gas lingers on the showerhead chamber side of gas distribution plate 102, the lingering gas can be relatively difficult to remove, requiring additional purge time, additional vacuum, or the like. Similarly, when the gas lingers on a deposition side of the gas distribution plate, the gas can be relatively difficult to remove, requiring additional purge time and/or vacuum. The additional purge time and/or vacuum requirements increase a cost associated with processing substrates. In addition, in the case of deposition processes, when gas is allowed to reside over area 106 (on the deposition side of distribution plate 102) for an extended period of time, a film 108 that forms on the deposition side of gas distribution plate 102 can become stressed, resulting in blisters 110, that can form particulates that cause defects in a film deposited on a substrate. Furthermore, gas lingering over the surface for an extended period of time can contribute to excessive decomposition for certain precursors, which may lead to undesirable side effects such as particles or poor film quality.

Figure 2:
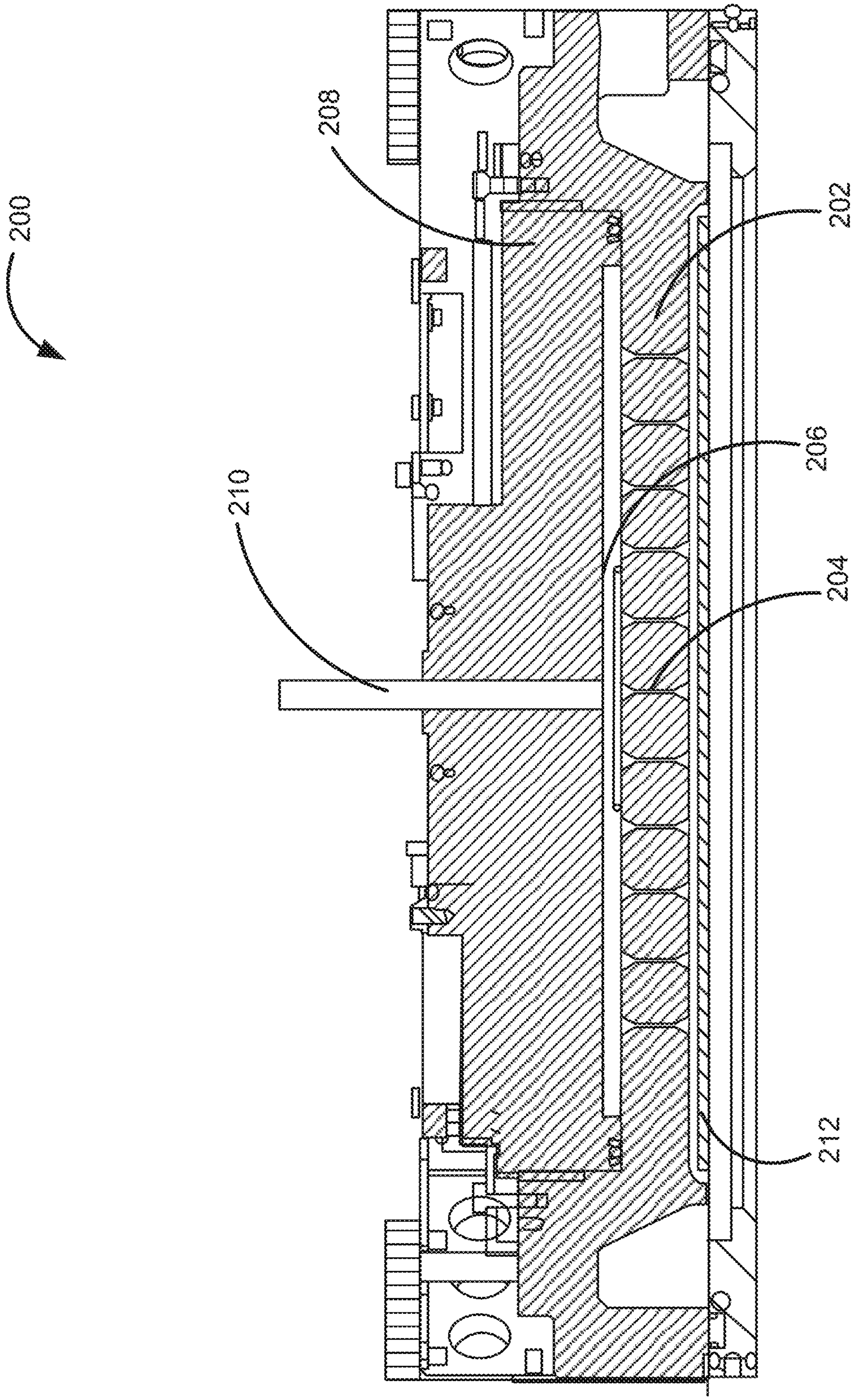
FIG. 2 illustrates a showerhead assembly in accordance with exemplary embodiments of the disclosure.

FIG. 2 illustrates an exemplary showerhead assembly 200 in accordance with exemplary embodiments of the disclosure. Showerhead assembly 200 includes a gas distribution plate 202, including a plurality of apertures 204, and a chamber or region 206. Showerhead assembly 200 can also include a top plate 208 and a gas inlet 210.

During operation, one or more purge gasses and/or one or more precursors and/or reactants flow through gas inlet 210, to chamber 206, and through apertures 204 toward a substrate 212. In the illustrated example, the direction of the flow of the gas in gas inlet 210 and apertures 204 is substantially vertical—i.e., substantially (e.g., within five degrees of being) perpendicular to a surface of substrate 212. This allows relatively uniform distribution of the gasses across a surface of the substrate.

Turning now to FIG. 3(*a*)-FIG. 6, exemplary gas distribution plate 202 is illustrated in greater detail. FIG. 3(*a*) illustrates a top view or chamber-side view of gas distribution plate 202, FIG. 3(*b*) illustrates a side view of gas distribution plate 202, FIG. 3(*c*) illustrates a bottom or deposition-side surface view of gas distribution plate 202, FIG. 4 illustrates a perspective cross-sectional view of gas distribution plate 202, FIG. 5 illustrates a side cross-sectional view of gas distribution plate 202, and FIG. 6 illustrates a partial top view of gas distribution plate 202.

Gas distribution plate 202 includes a first (chamber-side) surface 302, a second (deposition-side) surface 304, and a plurality of apertures 204, spanning between first surface 302 and second surface 304. Exemplary gas distribution plate also includes a recess 306 to receive a sealing member, such as a gasket (e.g., elastomeric O-ring) to facilitate forming a seal between gas distribution plate 202 and second plate 208, to thereby form chamber 206 adjacent to first surface 302. A thickness of gas distribution plate can be between about 1 mm to 50 mm, about 10 mm to about 40 mm, or about 20 mm to about 30 mm.

FIGS. 4 and 5 illustrate exemplary apertures 204 in greater detail. Apertures 204 include three sections: a first section 402, a second section 404, and a conduit 406 spanning between first section 402 and second section 404. First section 402 and second section 404 are designed to reduce an amount of surface area on first surface 302 and second surface 304, respectively that is perpendicular to a direction of gas flow toward a substrate (e.g., substrate 212), compared to a typical gas distribution plate. This reduces areas where gas can stagnate. In addition, first section 402 and second section 404 are designed to facilitate gas flow in a direction that is substantially perpendicular to a surface of a substrate. Conduit 406 is configured to provide desired gas flow between chamber 206 and a substrate, while also providing a sufficient pressure differential between first surface 302 and second surface 304 to prevent or mitigate gasses flowing from a reaction chamber to chamber 206. A number of apertures through gas distribution plate can depend on, for example, a size of the distribution plate. Exemplary numbers of apertures on a gas distribution plate range from about 100 to about 1500, about 200 to about 1000, or about 500 to about 900.

First section 402 includes a first-section first end 502 in contact with first surface 302, a first-section second end 504 in contact with a conduit first end 516, and a first-section tapering wall 506 there between, wherein a cross-sectional area of first-section first end 502 is greater than a cross-sectional area of the first-section second end 504. Tapering wall 506 can be continuously tapering, such as linearly tapering—e.g., frusto-pyramidal or frusto-conical shape, or include a curvature, such as partial spherical or partial ellipsoid. Conduit 406 can include a contract cross-sectional area along an axis. By way of example, conduit 406 can be cylindrical in shape.

A cross-sectional dimension of first-section first end 502 (e.g., a largest dimension of first end 502 in a direction perpendicular to an axis running through first end 502) can range from about 3 mm to about 30 mm, or about 5 mm to about 20 mm, to about 8 mm to about 10 mm. The cross-sectional dimension of the first-section second end 504 corresponds to a cross-sectional area of conduit 406, which is discussed in more detail below.

An angle θ between opposing sides of tapering wall 506 can range from about 30° to less than 90°, about 45° to about 88°, about 60° to about 85°, or be about 82°. A length of the first section (and/or second section) along an axis can range from about 0.25 mm to about 20 mm, about 1 mm to about 10 mm, or about 3 mm to about 7 mm.

Similarly, second section 404 includes a second-section first end 508 in contact with second surface 304, a second-section second end 510 fluidly coupled to a conduit (e.g., conduit 406) second end 514, and a second-section tapering wall 512 there between, wherein a cross-sectional area of the second-section first end is greater than a cross-sectional area of the second-section second end. The dimensions and shapes of a second-section first end 508, second-section second end 510, and second-section tapering wall 512 can be the same or similar to the corresponding sections of first section 402. For example, a cross-sectional width of second-section first end 508 can range from about 3 mm to about 30 mm, or about 5 mm to about 20 mm, to about 8 mm to about 10 mm, and the cross-sectional area of the second-section second end 510 corresponds to a cross-sectional area/width of conduit 406. And, an angle α of opposing sides of tapering wall 512 can range from about 30° to less than 90°, about 45° to about 88°, about 60° to about 85°, or be about 82°.

A ratio of a length of conduit 406 to first and/or second sections can be important to provide desired gas flow patterns and pressure differential between chamber 206 and a reaction chamber. In accordance with exemplary embodiments of the disclosure, a ratio of a length of conduit 406 to first section 402 and/or second section 404 (e.g., along a common axis thereof) is between about 1:1 and about 8:1, about 2:1 to about 7:1, or about 3:1 to about 5:1.

A length of conduit 406 can range from about 0.5 mm to about 50 mm, about 5 mm to about 40 mm, or about 10 mm to about 30 mm. A dimension (e.g., a diameter) of a conduit can be about 0.1 mm to about 10 mm, 0.25 mm to about 5 mm, or about 0.5 mm to about 1.5 mm. A cross-section of conduit 406 can be circular, square, rectangular, or any suitable shape.

With reference to FIG. 6, a configuration of apertures 204 can be hexagonal. In this case, adjacent apertures 204 are along a vertical axis 602, and along axes 604, 606, which are 30° from a horizontal axis 608 (or 60° from axis 602). In the illustrated example, a spacing c of adjacent apertures 204 centers along a vertical can be between 2 mm and 20 mm, about 5 mm to about 15 mm, or about 9 mm to about 11 mm. A spacing b of aperture 204 centers can be about 1 mm to about 10 mm, about 2 mm to about 8 mm, or be about 4 mm to about 6 mm. And, a spacing a can be the same or similar to spacing c. A distance between perimeters of adjacent apertures can range from 0 mm to about 10 mm, about 0 mm to about 5 mm, or greater than 0 mm to about 10 mm, or 0.25 mm to about 5 mm.

FIG. 7 illustrates another showerhead 700 in accordance with further exemplary embodiments of the disclosure. Showerhead 700 is similar to showerhead 200, except showerhead 700 includes a first chamber 702 and a second chamber 704, a first gas distribution plate 706 and a second gas distribution plate 708, and first apertures 710 formed through first gas distribution plate and second apertures 712 formed through second gas distribution plate 708. First apertures 710 and/or second apertures 712 can be the same or similar to apertures 204, described above.

During use of showerhead 700, a first gas can flow through one or more first inlets 714, 716 to first chamber 702, through apertures 710 and toward a substrate residing on a susceptor 718, and a second gas can flow from a second inlet 720 to second chamber 704, and through apertures 712, such that the first gas and the second gas do not mix until reaching a reaction chamber 722.

Although exemplary embodiments of the present disclosure are set forth herein, it should be appreciated that the disclosure is not so limited. For example, although the gas distribution assemblies and plates and the reactor systems are described in connection with various specific configurations, the disclosure is not necessarily limited to these examples. Various modifications, variations, and enhancements of the exemplary assemblies, systems, plates, and methods set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

We claim:

1. A gas distribution plate comprising:

a first surface and a second surface; and a plurality of apertures extending from the first surface to the second surface, wherein each of the plurality of apertures consist of:

a first section comprising a first-section first end in contact with the first surface, a first-section second end, and a first-section tapering wall there between, wherein a cross-sectional area of the first-section first end is greater than a cross-sectional area of the first-section second end;

a conduit comprising a conduit first end in contact with the first-section second end and a conduit second end; and a second section comprising a second-section first end in contact with the second surface, a second-section second end in contact with the conduit second end, and a second-section tapering wall there between, wherein a cross-sectional area of the second-section first end is greater than a cross-sectional area of the second-section second end;

wherein:

the conduit comprises a uniform cross-sectional width along its length;

the first section, the second section, and the conduit share a common axis;

an angle of opposing sides of the first-section tapering wall is between about 60 degrees and about 85 degrees; and a cross-sectional width of the first-section first end is the same as a cross-sectional width of the second-section first end, wherein the plurality of apertures of the gas distribution plate are configured as recited above so as to:

reduce areas where gas can stagnate in a chamber adjacent to the first surface and within the plurality of apertures;

reduce material deposition on the gas distribution plate;

reduce liberated blister particles from causing substrate defects; and provide a sufficient pressure differential between the first surface and the second surface to prevent gas flowing from a reaction chamber to the chamber.

2. The gas distribution plate of claim 1, wherein a distance between centers of adjacent apertures along a first axis is between about 2 mm and about 20 mm.

3. The gas distribution plate of claim 1, wherein a distance on the second surface between perimeters of adjacent apertures is between 0 mm and about 5 mm.

4. The gas distribution plate of claim 1, wherein a length of the aperture is greater than 1 mm.

5. The gas distribution plate of claim 1, wherein an angle between opposing sides of the second-section tapering wall is between about 30 degrees to about 90 degrees.

6. The gas distribution plate of claim 1, wherein a ratio of the length of the conduit to a length of the second section ranges between about 1:1 and 8:1.

7. The gas distribution plate of claim 6, wherein the ratio of the length of the conduit to the length of the second section ranges between about 2:1 and 7:1.

8. The gas distribution plate of claim 1, wherein a ratio of the length of the conduit to a length of the first section ranges between about 1:1 and 8:1.

9. The gas distribution plate of claim 8, wherein the ratio of the length of the conduit to the length of the first section ranges between about 2:1 and 7:1.

10. The gas distribution plate of claim 1, wherein a length of the first section ranges from about 0.25 mm to about 20 mm.

11. The gas distribution plate of claim 1, wherein a length of the second section ranges from about 0.25 mm to about 20 mm.

12. The gas distribution plate of claim 1, wherein a cross-sectional width of the conduit is about 0.5 mm to about 1.5 mm.

13. The gas distribution plate of claim 1, comprising between about 100 and 1500 apertures.

* * * * *